United States Patent [19]
Wycoff et al.

[11] 4,419,765
[45] Dec. 6, 1983

[54] SIGNAL ABSENCE DETECTOR

[75] Inventors: Keith H. Wycoff, 1205 N. Tyler St., Lexington, Nebr. 68850; William H. Dittmer, Mesa, Ariz.

[73] Assignee: Keith H. Wycoff, Lexington, Nebr.

[21] Appl. No.: 165,212

[22] Filed: Jul. 1, 1980

Related U.S. Application Data

[63] Continuation-in-part of Ser. No. 84,460, Oct. 12, 1979, abandoned.

[51] Int. Cl.³ .............................................. H04B 1/16
[52] U.S. Cl. ...................................... 455/36; 307/356; 307/522; 328/138; 328/149; 340/825.48; 455/161; 455/227; 455/343
[58] Field of Search .................. 455/32, 35, 36, 38, 455/161, 164, 165, 227, 228, 343, 266, 229; 328/138, 146, 149; 307/355, 356, 522, 524; 340/171 R, 171 A, 311.1, 825.44, 825.48, 825.71, 825.73, 825.74

[56] References Cited

U.S. PATENT DOCUMENTS

| | | | |
|---|---|---|---|
| 2,796,314 | 6/1957 | Bishop et al. | 328/146 |
| 3,256,517 | 6/1966 | Saltzberg et al. | |
| 3,482,166 | 12/1969 | Gleason | |
| 3,497,813 | 2/1970 | Gallagher | |
| 3,517,312 | 6/1970 | Yamato et al. | |
| 3,582,787 | 6/1971 | Muller | |
| 3,611,156 | 10/1971 | Ward | 455/343 |
| 3,617,900 | 11/1971 | Fink et al. | 324/82 |
| 3,623,106 | 11/1971 | Zerega, Jr. | |
| 3,716,790 | 2/1973 | Romoser | |
| 3,748,584 | 7/1973 | Ribour et al. | |
| 3,750,032 | 7/1973 | Andrews | |
| 3,769,593 | 10/1973 | Williams | |
| 3,774,114 | 11/1973 | Dahlgren | |
| 3,803,429 | 4/1974 | Wieczorek et al. | 307/304 |
| 3,840,811 | 10/1974 | Blouch | 455/32 |
| 3,852,671 | 12/1974 | Risley | 455/229 |
| 3,919,646 | 11/1975 | Morgan | |
| 3,946,313 | 3/1976 | Krolik | |
| 3,949,177 | 4/1976 | Ball et al. | 179/84 VF |
| 3,974,452 | 8/1976 | Cunningham | |
| 4,009,442 | 2/1977 | von Brömssen | 455/164 |
| 4,068,177 | 1/1978 | Gillis | |
| 4,130,731 | 12/1978 | Bolgiano et al. | 179/2 EB |
| 4,140,880 | 2/1979 | Deutsch et al. | 179/18 FG |
| 4,185,246 | 1/1980 | Schroeder | 328/165 |

FOREIGN PATENT DOCUMENTS

| | | | |
|---|---|---|---|
| 10923 | 5/1980 | European Pat. Off. | |
| 2405109 | 10/1974 | Fed. Rep. of Germany | 455/343 |

*Primary Examiner*—Marc E. Bookbinder
*Attorney, Agent, or Firm*—Dithmar, Stotland, Stratman & Levy

[57] ABSTRACT

The signal absence detector controls an operator circuit which periodically provides an operator signal to render the processor circuit in a communication receiver operative. The absence detector responds to a processed signal which is not of a predetermined character to terminate the operator signal. In one form of the invention, the operator circuit is a battery saver which intermittently provides a supply voltage. When the incoming signal is of the predetermined character, the supply voltage continues. The absence detector terminates the supply voltage when it is determined that the incoming signal does not have that character. In another form of the invention, the absence detector is employed in a scanning receiver, in which case the operator circuit steps the receiver between the various channels. The receiver will remain tuned to a channel as long as the incoming signal may be of the predetermined character. As soon as determination is made that the incoming signal does not have such character, the receiver is stepped to the next channel.

59 Claims, 16 Drawing Figures

FIG. I

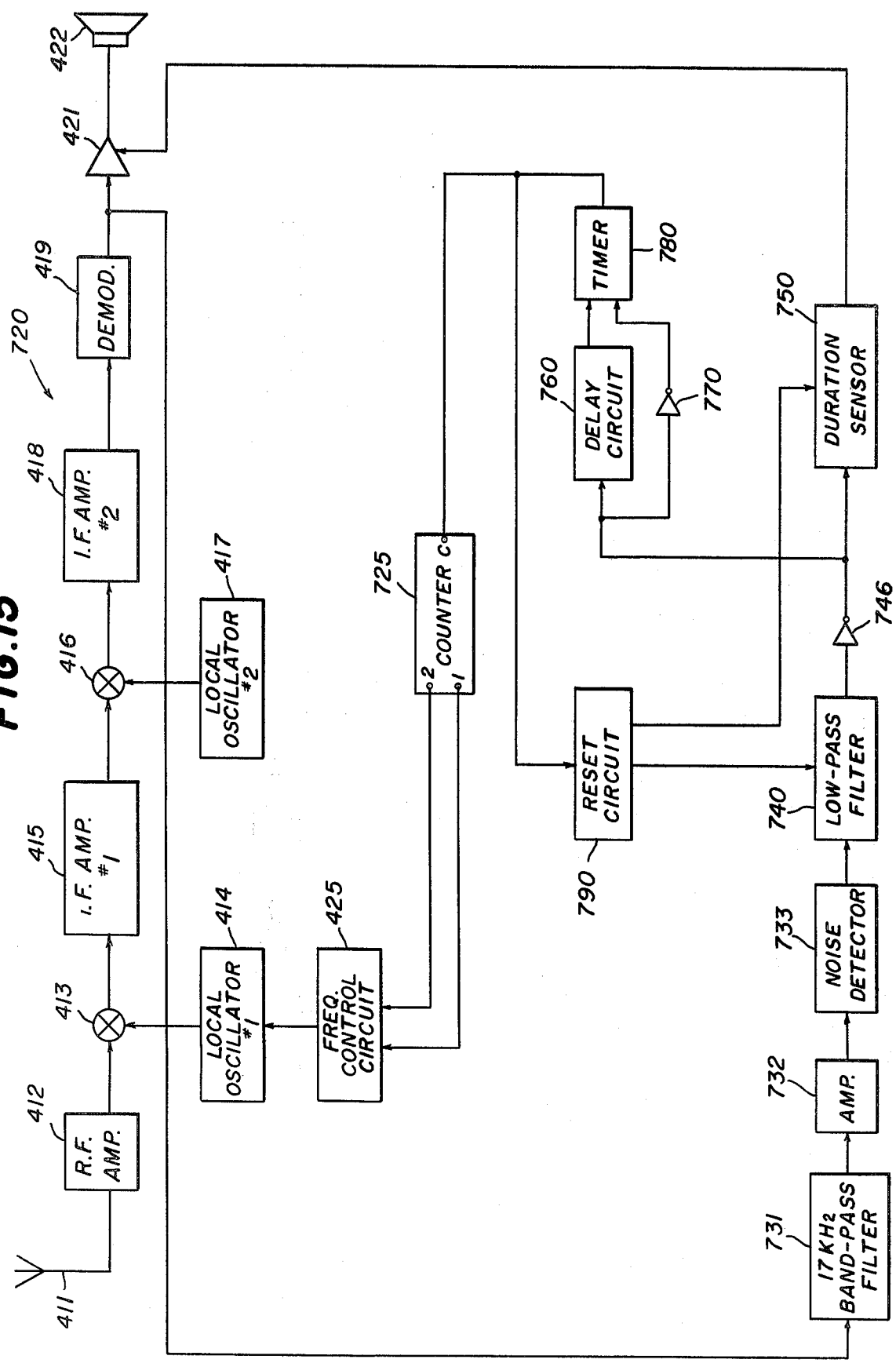

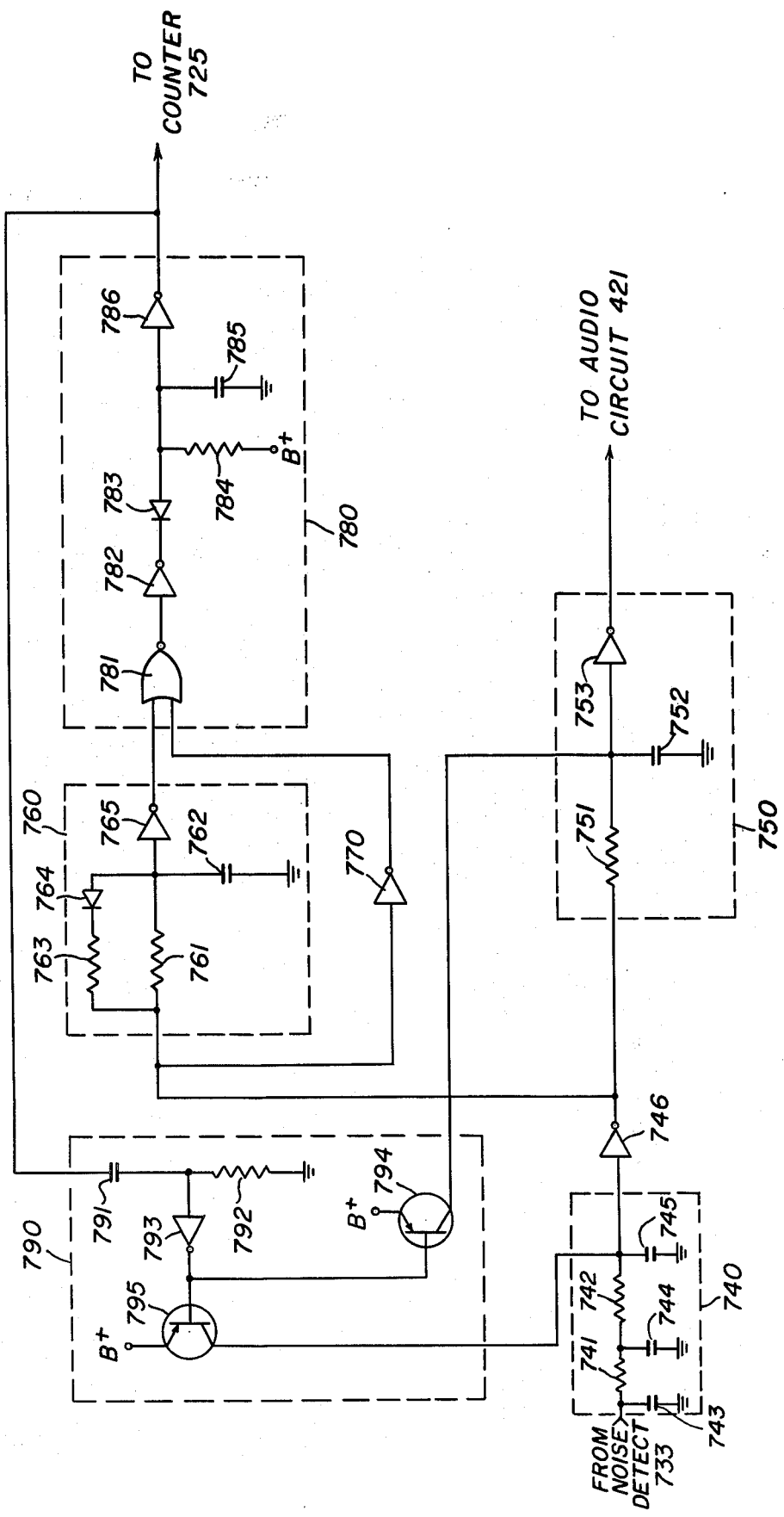

SIGNAL ABSENCE DETECTOR

CROSS-REFERENCE TO RELATED APPLICATION

This application is a continuation-in-part of co-pending application Ser. No. 84,460, filed Oct. 12, 1979, for SIGNAL DETECTOR, now abandoned.

BACKGROUND OF THE INVENTION

A receiver intercepts signals and converts them into information for the listener. The information is transmitted in the form of modulation on an RF carrier wave. The receiver has a demodulator which removes the modulation components from the incoming signal. Circuitry then processes these modulation components to provide useful information to the listener. There are situations where it is important to analyze the received signal as quickly as possible in order to evaluate whether the receiver is to process it further. In the past, the receiver included circuitry to look for the presence of the desired signal and when it was determined that it was indeed present, the receiver would be placed in condition for further processing of the signal. On the other hand, if the desired signal was not detected, it would not be further processed. This procedure of searching for the presence of the desired signal consumed too much time.

Two examples of receivers in which the search for the presence of a specific signal consumed too much time are those with battery saving and those that scan several channels.

The first type of receiver is portable and, therefore, incorporates batteries as the source of power. Throw-away batteries are less expensive and more convenient than rechargeable batteries which must be constantly recharged. However, throw-away batteries need to be replaced more often than rechargeable batteries. It has been proposed to increase the useful life and thereby improve the convenience of throw-away batteries by reducing the power consumed by the receiver. Battery-saver circuits deliver pulsed power to the various circuits in the receiver until a message for that receiver is received, at which time the power becomes continuous. Since it is during the pulses that the receiver is consuming power, it is desirable to minimize the pulse duration. However, each pulse must be long enough to insure that the signal will be detected and cause the battery saver circuit to provide continuous power.

Prior art detectors have not operated fast enough, particularly when the signal-to-noise ratio is poor. Also, the relatively slow speed of operation of prior art detectors which searched for signal presence necessitated excessively long battery-saver pulses. The basic problem with these prior art receivers is that they were pulsed on for a predetermined (fixed) time period.

Such battery-saver circuits may be employed in either a carrier-squelch receiver or in a selective call receiver. A carrier-squelch receiver is normally disabled so as not to reproduce noise or communications on the channel. Presence of a carrier wave, as indicated by the absence of noise from the demodulator, unsquelches the receiver. Such a receiver may have a battery saver circuit which produces pulsed power. In the presence of the carrier wave, the supply voltage becomes continuous. In order not to lose communications on the channel, it is desirable that the receiver rapidly respond when the carrier wave signal is present so that the battery saver pulses can be as narrow as possible. Because these prior art carrier-squelch receivers searched for the presence of the carrier wave (usually by detecting loss of noise from the demodulator), the battery-saver pulses were unnecessarily long thereby increasing power consumption by the receiver.

Such battery-saver circuits may also be employed in a selective-call receiver. A selective call communication system comprises a transmitter and a number of such receivers. Each receiver is designed to intercept the same carrier wave, but its alerting circuitry is rendered operative only when the carrier wave is modulated by a predetermined code. Upon reception of such code, the the receiver produces an audible or visible alerting signal. In certain kinds of systems, the signal is followed immediately by a voice message. In others, no voice message is transmitted. The possessor the latter type, upon being alerted, will perform some previously agreed upon action such as calling his office. A selective-call receiver incorporates a code detector. Prior art detector circuits looked for the presence of a particular code. The code used to signal the receiver could be binary in nature or a tone signal. A tone signal code consists of a single tone, two or more simultaneous tones, or a tone sequence. In the case of a tone sequence, the detector maintains the supply voltage to the processor circuit continuous upon valid detection of the presence of the first tone. When the frequency of the tone perfectly matches the center frequency of the filter in the detector and the incoming signal is strong, detection takes place rapidly. The detector can produce an output very quickly to cause the battery-saver circuit to provide a continuous supply voltage, thereby keeping the processor circuit operative.

In prior art receivers the fact that detection of the signal is fast under such circumstances serves no useful benefit. This is because the processor circuit is operative for the duration of each battery saver pulse anyway, so that weak signals can be detected. When the receiver is far from the transmitter and is receiving a noisy carrier modulated with tone, the signal-to-noise (S/N) ratio is poorer, causing tone detection time to increase greatly. Thus, whether the detector detects the tone rapidly or not, the on period of the processor circuit must be long enough to detect the tone under all usable conditions.

Current is, of course, consumed for the duration of each pulse. The prior art receiver remains on and draws current for the entirety of each battery saver pulse, because it has been designed to hold the receiver on for detection of signal presence.

As mentioned above, the time for detection is also important in scanning receivers. In a scanning receiver, a local oscillator produces a locally generated signal which is applied at one input to a mixer, the other input of which is the incoming or RF signal. The mixer output, called a "high IF signal", has components at a frequency equal to the difference in the frequencies of the locally generated signal and the carrier wave. A low IF signal is generated by mixing the high IF signal with a second locally generated signal.

Channel selection is usually made by adjusting the frequency of the first locally generated signal. In a scanning receiver, variation of the frequency of the first locally generated signal is effected automatically. Detection of the presence of a carrier wave in the corresponding channel will lock the local oscillator onto the frequency at which it is then set, so that the carrier wave can be demodulated. This usually is accomplished by analyzing the output of the demodulator. If the noise content of such output exceeds a certain level, then the carrier wave on that particular channel is not present. If the noise is less than such level, a communication is taking place on the channel. In the past, scanning receivers had detectors that searched for the presence of the carrier wave. The longer it takes the detector to make its analysis, the longer the receiver must be tuned to each channel in order that it can be certain whether a communication is taking place on each channel.

When the incoming signal is strong, detection takes place rapidly. The detector can produce an output very quickly to cause the processor circuit to remain tuned to the channel then being scanned. However, the receiver may be a long distance from the transmitter so that the signal applied to the detector is mixed with noise; i.e. the signal is weak and the S/N ratio is poor. A poor S/N ratio causes the detection time to increase greatly. Thus, the detector responds rapidly in ideal situations but slowly when the S/N ratio is poor. Prior art scanning receivers had to be tuned to each channel for a predetermined (fixed) period of time long enough to enable the processor circuit to detect the presence of carrier under the worst S/N conditions.

As a result, fewer channels could be scanned in a given period of time.

Scanning receivers have been employed in selective-call communication systems. Each receiver in such a system is designed to intercept an RF signal with a carrier-wave frequency in one of a plurality of channels, but its alerting circuitry is rendered operative only when the carrier wave is modulated by a predetermined code. Upon reception of such code, the receiver produces an audible or visible alerting signal, as above described. Here, too, some past scanning receivers employed signal detectors which looked for the presence of the code. As a result, the receiver was required to scan each channel for a longer time in order that it could be certain whether a carrier wave on that channel was modulated by the code. The time on each channel could be no less than that required to detect the code's presence under the worst S/N ratio conditions.

Another reason that selective call scanning receivers in the past have not responded rapidly enough is because the filter(s) in the decoder retained some energy after analysis of the processed signal had been made. If that energy is not dissipated, the amplitude of the filter output will effectively be reduced by the energy left in the filter if the processor signal is not precisely in phase with the oscillations occurring in the filter by reason of such energy. Energy left in the filter, therefore, will lengthen the time the receiver must be set to a given channel, to insure detection.

A selective-call scanning receiver can incorporate battery saving. It is only during each pulse of power that the receiver is operative to scan all of the channels. The shorter the pulse duration, the less time the receiver will be set at a given channel. In a scanning receiver, therefore, it is doubly important that the detection time be as short as possible.

Filters used in selective-call receivers often include capacitors and inductors connected in series-resonant or parallel resonant circuits. However, inductors are expensive and generally not compatible with integrated circuits. Active filters have been used in the past to simulate inductors, but a filter of this type is a substantial drain on the battery.

SUMMARY OF THE INVENTION

It is an important object of the present invention to provide a detector which substantially immediately responds to the inception of modulation components to provide an output which terminates when the detector determines that the components do not have a predetermined character.

Another object is to provide a detector controlled by a determination of signal absence, as opposed to signal presence.

Another object is to minimize the length of time the receiver is periodically turned on.

Another object is to turn on the receiver processor circuit only until it is determined that the signal is absent.

Another object is to allow the "on" time of the processor circuit to vary according to the conditions of reception.

Another object is to minimize the chances of false operation of a detector designed for very high speed of detection.

Another object of the present invention is to provide a signal detector which detects the presence or absence of a signal faster than in the past.

Another object is to provide a signal detector which operates in low signal-to-noise conditions.

Another object is to provide a signal detector which initially has a relatively wide bandwidth so as to respond rapidly to AC signal applied thereto, but which bandwidth is decreased so that an AC signal to which the receiver is not designed to respond will not cause an alerting tone to be generated and/or to unsquelch the receiver.

Another object is to provide a battery-saver circuit that periodically turns on a processor circuit and maintains it on until determination that the processed signal does not contain predetermined modulation components.

Another object is to provide a scanning receiver which is maintained on each channel for a short duration.

Another object is to minimize the length of time the processor circuit of a scanning receiver is tuned to each channel.

Another object is to tune the processor circuit to each channel only until its determined that there is no signal on that channel.

Another object is to allow the time on the processor circuit to be tuned to each channel to vary according to the conditions of reception.

Another object of the present invention is to provide an improved selective call scanning receiver.

Another object is to provide a selective call scanning receiver in which tone detection time is reduced.

Another object is to provide a scanning receiver which is selectively called by a code consisting of a sequence of tones.

Another object of the present invention is to provide a filter which does not use inductors and yet draws minimum current during standby.

Another object is to provide an active filter for a selective-call receiver in which the active circuit elements are pulsed in such a way that the filter does not ring, by insuring that the DC voltage drop across the resonant circuit is maintained constant.

In summary, there is provided a receiver of a modulated incoming signal having a normally inoperative processor circuit that may be rendered operative to process an incoming signal and produce a processed signal including the modulation portion of the incoming signal, the combination comprising an operator circuit for periodically providing an operator signal to render the processor circuit operative to process the incoming signal, and an absence detector having an input coupled to the processor circuit and having an output coupled to the operator circuit, the absence detector being responsive to any processed signal which is not of a predetermined character substantially immediately to terminate the operating signal.

In one embodiment, there is provided a receiver of a modulated incoming signal having a normally inoperative processor circuit that may be rendered operative to process an incoming signal and produce a processed signal including the modulation portion of the incoming signal, the combination comprising a battery-saver circuit for periodically providing a supply voltage to render the processor circuit operative to process the incoming signal, and an absence detector having an input coupled to the processor circuit and having an output coupled to the battery-saver circuit, the absence detector being responsive to any processed signal which is not of a predetermined character to substantially immediately terminate the supply voltage.

In a further embodiment, there is provided a scanning receiver for receiving a modulated incoming signal in one of a plurality of channels and having a processor circuit which includes signal generating means operative to produce a local signal having one of a corresponding plurality of frequencies, mixer means for mixing the modulated incoming signal with the local signal, and demodulator means coupled to the mixer means for supplying a processed signal including the modulation portion of the incoming signal, the combination comprising an absence detector responsive to any processed signal which is not of a predetermined character substantially immediately to produce a start signal, and stepping means for sequentially changing the frequency of the local signal and being coupled to the absence detector, the stepping means being responsive to each start signal to change the frequency of the local signal.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the invention.

BRIEF DESCRIPTION OF THE DRAWINGS

For the purpose of facilitating an understanding of the invention, there is illustrated in the accompanying drawings, preferred embodiments, thereof, from an inspection of which, when considered in connection with the following description, the invention, its construction, and operation, and many of its advantages should be readily understood and appreciated.

FIG. 15 is a block diagram of a carrier-squelch scanning receiver having a signal absence detector incorporating the features of the present invention; and FIG. 16 is a diagram partially in block and partially in schematic depicting parts of the receiver of FIG 15.

DESCRIPTION OF THE PREFERRED EMBODIMENTS

Figure 1:
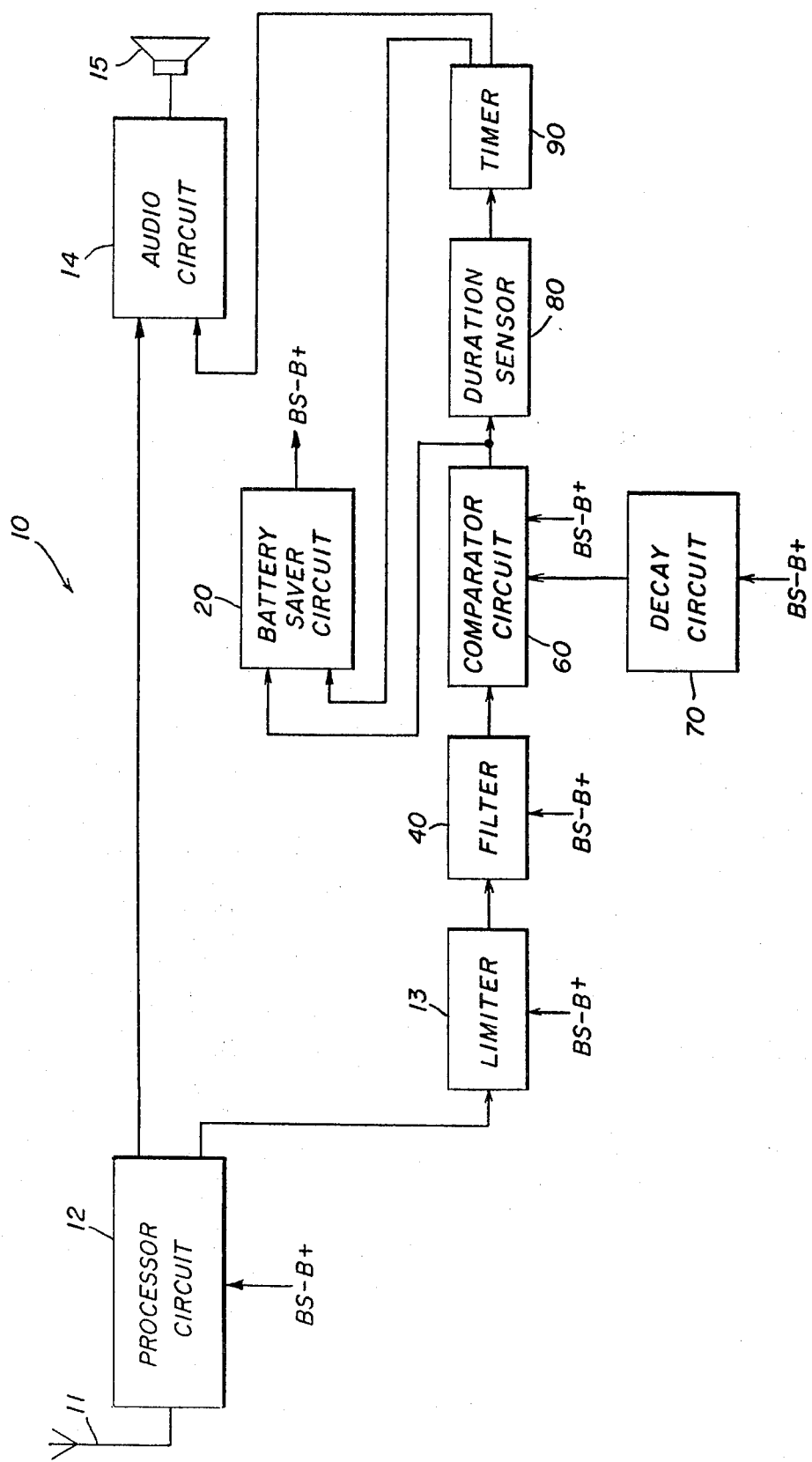
FIG. 1 is a block diagram of a single-tone, selective-call receiver having a signal absence detector incorporating the features of the present invention.

Referring now to FIG. 1, there is shown a communication receiver 10 made in accordance with and embodying the principles of the present invention. The receiver 10 is basically selective call in nature, meaning that it is generally squelched or inoperative, and becomes unsquelched to enable communication if it receives a predetermined code consisting of a single tone. This particular receiver is of the tone-and-voice type. The code to which the receiver is designed to respond will unsquelch it and cause it to produce an alerting tone. In addition, the tone will cause the receiver to be enabled for some additional period of time in order to reproduce an audio message sent by the transmitter.

The receiver 10 is adapted to receive an incoming signal consisting of an RF carrier wave modulated by the code, followed by an audio message. The transmissions are intercepted by an antenna 11 and are conveyed to a processor circuit 12 which includes the usual local oscillator(s), mixer(s) and demodulator. The demodulator furnishes the code followed by an audio message. The code portion is applied to a limiter 13 which increases the amplitude of the code to a fixed value. An audio circuit 14 amplifies the rest of the code tone and the ensuing audio signals from the processor circuit 12. A loudspeaker 15 converts the alerting tone and the audio signal into sound waves. Normally, the receiver is squelched; in other words, the audio circuit 14 is disabled so that audio signals, noise and all other communications on the channel cannot be heard. In the presence of a proper code, the audio circuit 14 becomes enabled so that it can amplify the alerting tone and the audio signal and apply same to the loudspeaker 15.

An important aspect of the present invention is the reduction in drain on the batteries which the receiver 10 uses. There is provided a battery-saver circuit 20 which provides a pulsed supply voltage shown as "BS-B+". Periodically, say every 1.75 seconds, the supply voltage is present for an extremely short period of time, say 1 or 2 milliseconds (ms.). During these 2 ms. intervals, the receiver 10 is consuming power, and during the time between pulses, virtually no power is being drained from the battery. Hereafter, wherever 2 ms. intervals are referred to, it should be understood that shorter periods will be useful as well. The processor circuit 12, the limiter 13, and other circuits are supplied with the BS-B+ supply voltage. During the proper code, the battery-saver circuit 20 is caused to produce a continuous supply voltage.

As explained, the code from the limiter 13 will be a single tone which is converted to a sequence of square waves at the frequency of the tone, which is applied to an active filter 40. The filter 40 is responsive to a train of tone pulses at a predetermined frequency to provide a sinusoidal output wave. The filter 40 is supplied by the BS-B+ supply voltage, so that it uses negligible power during standby. The receiver 10 further includes a comparator circuit 60 having its signal input coupled to the output of the filter 40 and a reference input coupled to a decay circuit 70. When the voltage on the signal input equals or exceeds the voltage on the reference input, the comparator circuit 60 produces a comparator signal.

The pulsating supply voltage BS-B+ is applied to the decay circuit 70. As explained previously, the BS-B+ supply voltage consists of a series of pulses. The decay circuit 70 is responsive to each such pulse to produce a threshold voltage which decays from a first value to a second value. The reference input of the comparator circuit 60 is coupled to the decay circuit 70. When the amplitude of the signal from the filter 40 is at least equal to the threshold voltage, the comparator circuit 60 produces a comparator signal. As soon as the amplitude of the signal from the filter 40 decreases so that it no longer crosses the threshold, the comparator signal ends. Thus, the comparator signal has a duration corresponding to the time that the signal from the filter 40 is equal to or greater than the threshold voltage.

The bias voltages in the filter 40 are established such that a signal which passes therethrough will have an amplitude substantially equal to the initial value of the threshold voltage from the decay circuit 70. However, the threshold immediately begins to decay so that signals from the filter 40 may or may not have an amplitude exceeding the threshold at a later time during each pulse. Accordingly, any signals having frequency components within the bandwidth of the filter 40 and passing therethrough will necessarily have an initial amplitude sufficient to be equal to the threshold and cause the inception of a comparator signal from the comparator circuit 60. In the case of noise developed in the processor circuit 12 and having frequency components within the bandwidth of the filter 40, a signal will be applied to the signal input of the comparator circuit 60, having an initial amplitude at least equal to the threshold voltage. However, the noise components cause the filter output to have a relatively low amplitude so that the decaying threshold voltage will cause the comparator signal to terminate rather quickly, within a few milliseconds or so. Thus, in the case of noise, a comparator signal will be produced by the comparator circuit 60 but of relatively short duration.

A tone having a freuency in a channel adjacent to the channel established by the center frequency of the filter 40 may initially be within the bandwidth of such filter. Thus, at the outset, the filter output signal will cross the threshold the same as the correct tone, thereby producing a comparator signal. However, the peaks of such filter input signal soon discontinues crossing the threshold, thereby causing the comparator signal to cease, indicating absence detection.

If the signal received by the processor circuit 12 includes the tone to which the filter 40 is designed to respond, a relatively high amplitude signal will be applied to the signal input of the comparator circuit 60, which has an amplitude equal to the threshold voltage from the decay circuit 70, thereby commencing a comparator signal. The peaks of the signal from the filter 40, being of relatively high amplitude, continue to exceed the threshold voltage even though the threshold voltage is decaying. The comparator signal continues for a period of time substantially equal to the duration of that part of the tone that is actually detected.

The maximum and minimum values of the threshold voltage and the rate of decay thereof must be carefully selected. The shallower the threshold voltage curve, the more susceptible the receiver 10 would be to falsing in the presence of adjacent-channel tones and noise. Also, the slower the rate of decay of the threshold voltage curve, the greater the current the receiver will draw in response to extraneous signals. Thus, it is desirable to maximize the slope to minimize the time during which current is drawn from the battery. One limiting factor in this regard is the desired signal-to-noise response. If the slope is too great, then low level signals which are likely to be mixed with substantial noise, will not be detected because their negative peaks will not continuously exceed the decaying threshold.

If the time between battery saver pulses is 1.75 seconds, the duration of the comparator signal from the comparator circuit 60 would have a duration up to 1.75 seconds shorter than the tone, depending upon the extent of coincidence between the start of the tone and the occurrence of a battery saver pulse. If they happened to be in coincidence, then the comparator signal would have a duration substantially the same as the duration of the tone. Much more likely, however, is that the tone will start at some time between battery saver pulses, in which case, the comparator signal will have a duration less than the code tone. For example, if the code tone has a duration of 2.5 seconds, the comparator signal could be as long as 2.5 seconds if the inception of the code tone took place simultaneously with the battery saver pulse. The comparator signal could be as short as about 750 ms. if the code tone immediately followed a battery saver pulse, assuming 1.75 seconds between battery saver pulses.

The comparator signal will have a long duration of between 750 ms. and 2.5 seconds in the presence of a code tone to which the filter 40 is designed to respond and a duration of just a few milliseconds if the receiver 10 is receiving an adjacent-channel code tone or if the receiver output is noise.

The comparator signal is applied to a duration sensor 80. If the comparator signal has a duration greater than a predetermined value, such as 600 ms., an output signal will be produced and applied to a timer 90. The timer 90 produces timer signals commencing with the output signal from the duration sensor 80 and terminating a predetermined time later, such as 10 seconds. The timer 90 is coupled to the audio circuit 14. One timer signal enables the audio circuit 14 so that it can transmit the balance of the code tone which would be between 150 ms. and 1.9 seconds in duration (assuming a code tone 2.5 seconds in duration, a space between pulses of 1.75 seconds, and a duration sensor 80 requiring 600 ms. to produce an output signal). The tone applied to the audio circuit 14 is reproduced by the loudspeaker 15 to create an alerting tone informing the bearer of the receiver 10 of an audio message to follow. The audio circuit 14 is in fact enabled for an additional 10-second period of time so that the audio message which follows the code tone will be processed, amplified and reproduced by the loudspeaker 15. Alternatively, the alerting tone can be internally generated.

The battery saver circuit 20 normally produces a pulsating signal as previously explained. The output of the comparator circuit 60 is coupled not only to the duration sensor 80 but also to the battery saver circuit 20. Thus, in the presence of the comparator signal, the BS-B+ supply voltage becomes continuous. As explained previously, the comparator signal commences almost instantaneously with the inception of a limited processed signal from the limiter 13. This signal may not be the proper code tone but instead may be certain noise components or adjacent-channel code tones. As soon as such extraneous components passing through the filter 40 drop below the threshold, the battery saver circuit 20 reverts to producing a pulsating supply voltage. In other words, the comparator circuit 60 commences producing a comparator signal substantially instantaneously, which causes the supply voltage to become continuous. The supply voltage remains continuous until the output of the filter 40 drops below the threshold level, signifying determination that the tone is in fact absent. In the presence of the proper code tone, however, the comparator signal will last for a time between 750 ms. and 2.5 seconds and the supply voltage will be continuous for that period of time enabling the processor circuit 12 to continue to process the code tone.

The second timer signal from the timer 90, which commences in response to the proper code tone, is coupled to the battery saver circuit 20, to cause the supply voltage to be continuous for the duration of such timer signal, whereby the processor circuit 12 is continuously operative to process the intelligence message.

An important aspect of the present invention is that the battery saver circuit 20 produces pulses as narrow as possible in order to minimize power consumption. Because the receiver 10 once turned on will stay on until it is determined that the proper code tone is absent, those pulses can be extremely narrow, just a few milliseconds. However, with noise and adjacent-channel code tones, it is desirable that the battery saver circuit 20 be caused to revert to producing a pulsating supply voltage fairly quickly in order to minimize battery drain.

It is advantageous that the pulse from the battery-saver circuit 20 be as short as possible to improve battery life. The limiting factor in this embodiment is the time needed for the processor circuit 12 to respond to an incoming signal and provide a processed signal consisting of the modulation components. That time should be between a few microseconds and several hundred microseconds.

Basically, the filter 40, the comparator circuit 60 and the decay circuit 70 may be viewed as a signal absence detector which responds to any processed signal that has been driven to limiting by the limiter 13 to commence production of a comparator signal that extends the duration of the supply voltage from the battery-saver circuit 20. The processed signal may include noise and/or adjacent channel tones. Nevertheless, since, as far as the signal absence detector is concerned, the processed signal may include the desired tone, the supply voltage is caused to be continuous to maintain the processor circuit 12 operative in order to continue to process the incoming signal. If the proper tone is indeed present, the amplitude of the signal from the filter 40 will continue to exceed the threshold from the decay circuit 70 and the supply voltage will remain continuous. On the other hand, if the tone is not present, the fact that it is absent will be determined when the level of the processed signal drops below the threshold, at which time the comparator signal terminates and the supply voltage is interrupted. Because the absence detector causes the battery-saver circuit 20 initially to produce a continuous supply voltage in the presence of any signal, and that signal will cause the supply voltage to remain continuous for some time, the pulse duration of the battery-saver pulses can be extremely narrow. Battery-saver circuits in receivers on the market today have been able to produce pulses a minimum of 30 ms. in duration and normally much longer. However, pulses produced by the battery-saver circuit 20 may be on the order of 0.5 ms. or less depending upon other factors to be discussed. Often detection of the absence of a tone could take place in 2 ms. or less, giving rise to a battery drain one tenth that which has been available. It can be appreciated that very substantial improvement in battery life may be achieved with so short a pulse duration.

Such reduction in the pulse width has been achieved without adverse effect on the sensitivity of the receiver 10. If the tone frequency received is far from the center frequency of the filter 40 and/or there is no incoming signal of the proper carrier-wave frequency at the antenna 11 absence detection takes place rapidly. The comparator circuit 60 output discontinues very quickly to cause the battery-saver circuit 20 to revert to producing a pulsating supply voltage. However, if the frequency of the tone is on the center frequency of the filter 40, even if the receiver is a long distance from the transmitter so that the processed signal applied to the detector is mixed with noise; i.e. the signal-to-noise (S/N) ratio is poor, the battery-saver circuit 20 will provide a continuous supply voltage. As long as the signal received exceeds the design S/N ratio, on average, the signal is or may be present. Below that level, absence detection will take place.

The filter 40, the comparator circuit 60, the decay circuit 70 and the duration sensor 80 may be considered to be a frequency sensor having a given bandwidth, which is an example of one type of signal absence detector that may be employed. All AC signals within that bandwidth will cause the frequency sensor to produce an output. At the start of each pulse, the bandwidth is relatively wide, so that not only will the correct code tone cause an output, but also noise and adjacent channels will cause the supply voltage to become continuous. However, the bandwidth of the frequency sensor narrows during the course of each such pulse so that only the proper code tone causes the audio circuit 14 to remain operative. Such variable bandwidth is achieved in one embodiment by utilizing a filter 40 with a fixed Q and changing the threshold applied to the comparator circuit 60 and filter 40. Another way of achieving such a variable bandwidth is to vary the Q of the filter 40.

Initially the Q would be low so that the bandwidth would be wide. With time during each pulse, the Q of the filter would increase causing the bandwidth to be narrow. Alternately, a digital circuit which statistically detects the presence of a desired frequency may be used. This statistical detection circuit may be designed so that its detection bandwidth varies with time.

Although FIG. 1 depicts a selective-call receiver, similar principles can be used in circuitry of a carrier-squelch receiver. In such receivers, the power is pulsed to the various circuits to minimize power consumption. In the presence of the carrier wave, that is, in the absence of noise, the battery saver circuit is caused to provide a continuous supply voltage. The battery saver pulses must be wide enough to render the processor circuit operative for a sufficiently long time to make the receiver function. In order to reduce the width of these pulses, the principles of the present invention can be employed in the carrier-detection circuit. Specifically, a squelch detector is coupled to the processor circuit 12, which responds to the presence of carrier (usually determined by loss of noise), to provide an unsquelch signal. The absence detector is responsive to absence of carrier or commencement of the squelch signal to provide a control signal. As long as it is determined that the carrier may be present, the unsquelch signal will continue to exist and the processor circuit will remain operative. As soon as it is determined that the incoming signal does not include the carrier wave to which the receiver is designed to respond, absence of such signal will have been detected and the unsquelch signal will terminate as will the supply voltage. The absence detector in such instance if directly detecting carrier may have a wide bandwidth response characteristic so that is responds rapidly to noise or even adjacent RF signals. However, the bandwidth immediately begins to narrow so that operation will continue only upon reception of the RF signal to which the receiver is designed to respond (or vice versa if measuring noise to determine carrier absence.)

To understand fully this invention, the meaning of the terms "presence detection" and "absence detection" must be understood. The signal is present when its signal-to-noise ratio exceeds a preset standard at a specific time. The signal is absent when its signal-to-noise ratio is less than that standard. Failing to detect the presence of signal is not the same as detecting its absence. Neither is failing to detect the absence of a signal the same as detecting its presence. There is a range between these two where noise prevents a positive detection. When the signal falls in such in between range, it is said that the signal "may be" present or "may be" absent.

Figure 2:
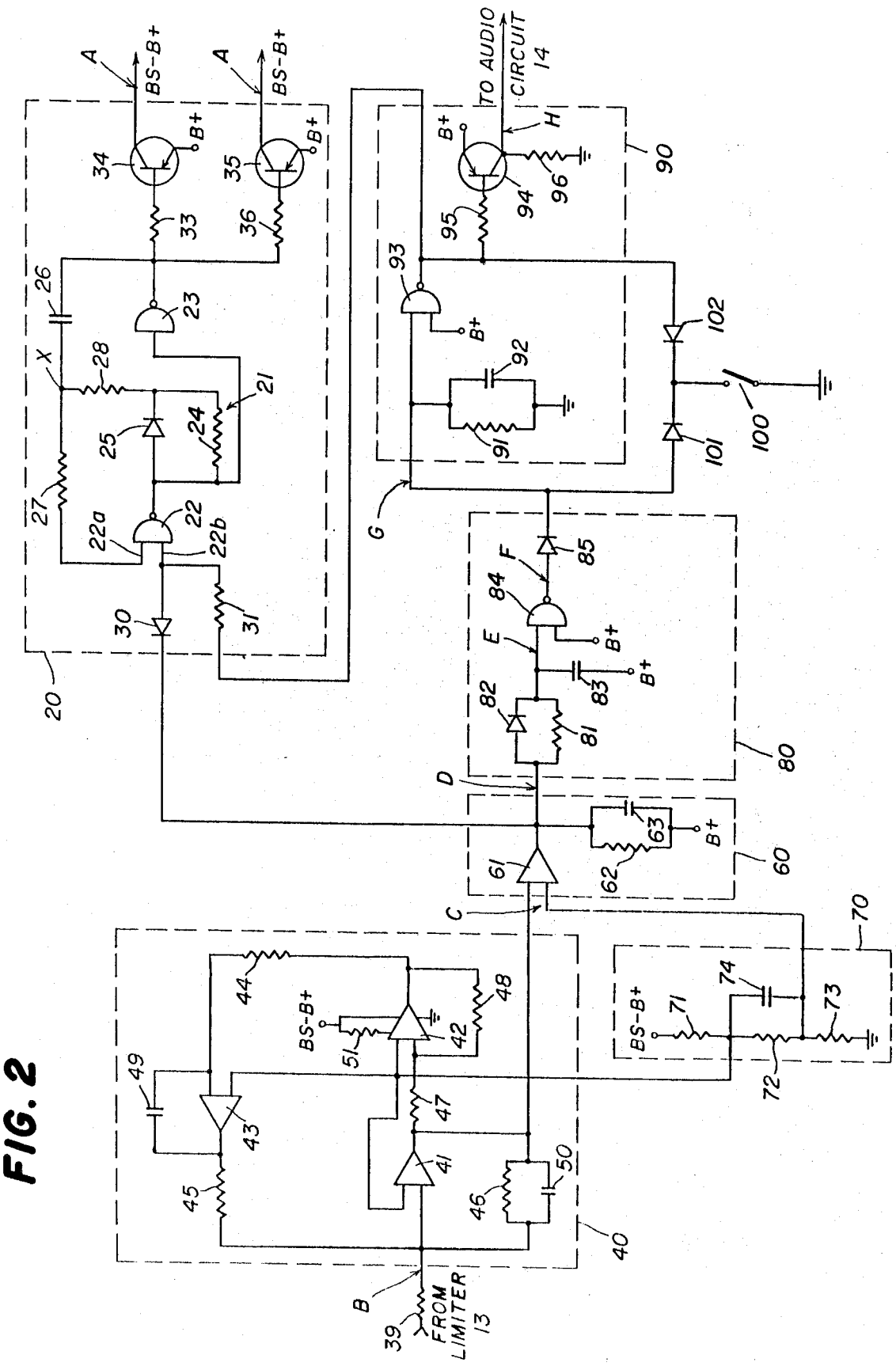
FIG. 2 is a schematic diagram of parts of the receiver of FIG. 1.

Turning now to FIG. 2, further details of the receiver 10 will be described. The battery saver circuit 20 includes an astable multivibrator 21 having a NAND gate 22 and an inverter 23. The output of the NAND gate 22 is directly coupled to the input of the inverter 23. The output of the NAND gate 22 is also fed back to one input 22a by means of a resistor 24 and a diode 25 coupled in parallel, and resistors 27 and 28 coupled in series. The output of the inverter 23 is also connected to the input 22a by means of a capacitor 26 coupled in series with the resistor 27. The other input 22b of the NAND gate 22 is coupled by means of a diode 30 to the output of the comparator circuit 60 and by a resistor 31 to the timer 90. The multivibrator 21 is coupled by resistors 33 and 36, respectively to a pair of PNP transistors 34 and 35, the emitters of which are connected to the B+ supply voltage and the collectors of which provide the BS-B+ supply voltages.

In operation of the multivibrator 21, when the output of the NAND gate 22 becomes low, the output of the inverter 23 becomes high. The point X and the input 22a are already high at this time. The capacitor 26 discharges through the resistors 24 and 28, thereby lowering the voltage at point X and applied to input 22a. When the switching threshold of gate 22 is reached again the output of the NAND gate 22 becomes high, the output of the inverter 23 becomes low, the point X pulses below ground, and the input 22a drops further. Immediately, the capacitor 26 begins to charge through the diode 25 and the resistor 28. The voltage at the point X and at the input 22a rise until the gate switching threshold is reached, whereupon the output of the NAND gate 22 becomes low and the output of the inverter 23 becomes high. The voltage at input 22a which is already high, begins to drop as the capacitor 26 discharges through the resistors 28 and 24, to restart the cycle. The pulsating voltage thereby produced is coupled through the resistors 33 and 36 and the transistors 34 and 35 to provide a pulsating voltage for the receiver 10. The pulsing continues as long as the input 22b remains high. When the input 22b becomes low because of the presence of the comparator signal from the comparator circuit 60 through the diode 30 or because of a timer signal from the timer 90 through the resistor 31, the output of the NAND gate 22 becomes high, as will point X and the input 22a, causing the output of the inverter 23 to become low. As a result, the supply voltages furnished by the transistors 34 and 35 will become continuous until the input 22b again becomes high. The values of the resistors 24 and 28 and the capacitor 26 determine the time between pulses, and the values of the capacitor 26 and the resistor 28 determine the duration of each pulse.

As previously explained in FIG. 1, the processor circuit 12 develops a sinusoidal wave corresponding to the code tone which was modulated on the carrier wave. The processor circuit 12 separates the code tone from the rest of the signal. The sinusoidal wave is applied to the limiter 13 which provides a square wave or train of tone pulses at a frequency of the code tone. Referring back to FIG. 2, the filter 40 responds to a train of tone pulses at a predetermined frequency. The filter 40 is of the active, band-pass type and includes an input resistor 39 of high value, three operational amplifiers ("op amps") 41, 42 and 43, resistors 44-48, and capacitors 49 and 50. By controlling the values of the resistors 44-48 and the capacitors 49 and 50, the center frequency and the Q of the active, band-pass filter 40 can be controlled. The filter 40 has a high Q and will permit passage of the limited signal from the limiter 13 when the signal contains frequency components within the filter bandwidth. The filters in the various receivers in the system will be tuned to different frequencies. In an actual embodiment of this invention the resistor 45 and the capacitors 49 and 50 are used as the elements to establish the center frequency of the filter 40, although other components could be used for that purpose.

The op amps 41, 42 and 43 are preferably on a single IC chip and each has a ground terminal for connection to ground, a supply terminal for connection to the supply voltage and a programming terminal for connection through a resistor 51 to the supply voltage. For simplicity, only the op amp 42 is shown with three terminals, but it is understood that all three have a set of three terminals which are respectively interconnected. The pulsating supply voltage BS-B+ causes the filter 40 to be operative only during the supply voltage pulses, to evaluate the frequency of the code tone from the limiter 13. Accordingly, the filter 40 is only drawing current from the receiver battery during a very small part of the time during which the receiver 10 is on.

Bias for the op amps 41, 42 and 43 is also in the form of a pulsating supply voltage. For this purpose, the decay circuit 70 includes a set of three resistors 71, 72 and 73 connected in series between the pulsating supply voltage and ground. A capacitor 74 is connected across the resistor 72. The junction of the resistors 71 and 72 is connected to the bias inputs of the op amps 41, 42 and 43. The values of the resistors 71, 72 and 73 are preferably such that the bias on these bias inputs is about one-half the B+ supply voltage, so that the sinusoidal wave produced by the filter 40 in response to the train of tone pulses from the limiter 13, will swing essentially between the B+ supply voltage and ground. Actually, the voltage at the junction of the resistors 71 and 72 varies somewhat, as will be explained.

An important aspect of the filter 40 is its ability to be powdered by the battery saver pulses so as to draw no current during standby. In the filter 40, the capacitor 50 defines the capacitance part of a resonant circuit. The inductance part is simulated by the op amps 42 and 43, the resistors 44, 45, 47 and 48, and the capacitor 49. Such inductance is effectively in parallel with the capacitor 50 and the op amp 41. When the active filter 40 is driven by continuous supply voltages no ringing problems occur because a constant DC voltage would appear across the resonant circuit. However, providing continuous power to the filter is undesirable in that it produces a continuous drain on the battery.

On the other hand, where DC voltages are cyclically applied to and removed from a resonant circuit, the resonant circuit becomes susceptible to ringing, that is, produces oscillations at its resonant frequency. Such ringing may occur whenever there is a change in the potential difference across a resonant circuit. For example, if the capacitor in a parallel resonant circuit is charged by a potential placed thereacross, the capacitor discharges into the inductor when the potential is removed, which energy in turn is discharged into the capacitor, thereby creating undesired oscillations. Also, application of a voltage across a series resonant circuit will cause it to ring. Similarly, if a charged capacitor has an inductor connected across its terminals, the circuit will ring.

In the active filter 40, if the capacitor 50 were so charged then connecting the effective inductance thereacross would cause the filter 40 to ring. Such ringing does not occur because voltages are applied to the circuit such that the potential difference across the resonant circuit is always unchanged. In the absence of a tone, the output of the limiter 13 is low, which is translated as a low on the signal input of the op amp 41 and on the corresponding terminal of the capacitor 50. The bias input of the op amp 41 receives the pulsating B+/2 voltage. Between pulses, the op amp 41 is inoperative and the output is therefore zero volts DC, the output being connected to the other terminal of the capacitor 50. Accordingly, between pulses, there is no potential difference across the capacitor 50. Upon the occurrence of a battery saver pulse, an effective inductance is created across the capacitor 50, but the capacitor 50 has no charge thereacross to discharge into such inductance.

Also, the battery saver pulse causes the DC output of all the op amps 41, 42 and 43 to become B+/2 in accordance with the bias setting. Accordingly, the B+/2 voltage appearing at the output of the op amp 43 is applied to one terminal of the capacitor 50. The voltage on the other terminal is also B+/2 because that is the voltage on the output of the op amp 41. Accordingly, during the pulses, there is no potential difference across the capacitor 50 which can be discharged into the effective inductance thereacross.

Thus, application of the pulsed BS-B+ does not create a potential difference across the resonant circuit. With no DC potential difference across the resonant circuit either between pulses or during pulses, ringing does not occur.

The criteria of maintaining a constant potential difference across the resonant circuit can be accomplished with several other supply voltages and bias voltage conditions, as follows:

| Example | DC Output of Limiter 13 | Bias Voltage from Decay Circuit 70 | Supply Voltage to Filter Circuit 40 | Supply Ground to Filter Circuit 40 |
|---|---|---|---|---|
| 1 | H | XM | H | XL |
| 2 | L | M | XH | L |
| 3 | F | XM | XH | L |
| 4 | F | XM | H | XL |
| 5 | F | M | XH | L |
| 6 | XH | XM | XH | L |

In the above chart, H signifies a voltage equal to B+, M signifies a voltage equal to B+/2, L signifies a voltage of ground or zero, F signifies that the voltage is floating, XH signifies that the voltage is normally zero and is periodically pulsed to B+, XM signifies that the voltage is normally the same as the supply voltage to the filter circuit 40 (B+ in examples 1 and 4, and zero in examples 2, 3, 5 and 6) and is periodically pulsed to B+/2, and XL signifies that the voltage is normally B+ and is periodically pulsed to zero.

The op amp 41 is so constructed that with no bias and the supply terminal connected to B+, the voltage on the output of the op amp will also be B+. Thus, in example 1, the voltage on the right-hand side of the capacitor 50 is substantially B+ between pulses when the bias is zero. The output of the limiter 13 is also at B+, so that there is no potential difference across the capacitor 50. During battery saver pulses, the bias voltage causes the outputs of the op amps 41 and 43 to drop to B+/2, thereby maintaining the zero potential difference across the capacitor 50. In example 2, the supply voltage is zero between pulses, so that the DC output of the op amp 41 is also zero which is the same as the DC voltage from the limiter 13. Accordingly, the potential difference across the capacitor 50 is zero. During pulses, the DC voltage from the op amps 41 and 43 increases to B+/2, thereby maintaining the zero potential difference. In examples 3, 4 and 5, there is no DC voltage from the limiter 13 since the input to the resistor 39 is floating. Accordingly, there will be no potential difference, at any time, across the capacitor 50. In example 6, the DC voltage on the output of the op amp 41 is zero between pulses as is the voltage from the limiter 13. Accordingly, no potential difference exists across the capacitor 50 between pulses. During the pulses the voltage on the output increases to B+/2 as does the voltage on the other side of the capacitor 50.

In each of the foregoing examples, a zero potential difference is maintained across the capacitor 50, whatever the polarity of the pulse supplied to the filter 40. More important is the fact that the potential difference across the capacitor does not change with pulsing. Because of the very high impedance presented by the resistor 39 and the very high gain of the amplifier 41, the conditions during the pulses are not as critical in maintaining a constant potential difference as when the op amps 41 and 43 are energized.

In a particular example, the resistor 39 had a value of between 3 and 4.5 meg ohms, the resistor 45 has a value of 18K ohms and the resistor 46 had a value of 1.2 meg ohms and the capacitor 50 had a value between 0.0033 microfarads and 0.01 microfarads depending upon the center frequency of the filter 40.

In the following situations, the filter 40 did ring:

| Example | DC Output of Limiter 13 | Bias Voltage from Decay Circuit 70 | Supply Voltage to Filter Circuit 40 | Supply Ground to Filter Circuit 40 |
|---|---|---|---|---|
| 7 | H | XM | XH | L |
| 8 | L | XM | H | XL |
| 9 | H | M | XH | L |
| 10 | L | M | H | XL |

In example 7, the output voltage of the op amp 41 between pulses is zero, that is, the bias voltage is zero, whereas the voltage from the limiter 13 is B+ supply voltage. Thus, there is a potential difference across the capacitor 50. In such instance, upon the occurrence of a pulse, the capacitor will discharge into the simulated inductance causing ringing because the potential applied to the capacitor 50 between pulses has been removed. In example 8, the DC output of the limiter 13 between pulses is low, whereas the supply voltage to the op amp 41 is high, creating a potential difference across the capacitor 50. In example 9, the output of the op amp 41 is zero between pulses, because that is the value of the supply voltage, whereas the DC output of the limiter 13 is the B+ supply voltage, creating the potential difference across the capacitor 50. Finally, in example 10, the supply voltage is continuously applied so that the output of the op amp 41 is also the supply voltage, whereas the output of the limiter 13 is ground, changing the potential across the capacitor 50.

The comparator circuit 60 includes a voltage comparator 61 having a signal input coupled to the input of the filter 40 and a reference input coupled to the junction of the resistors 72 and 73. Although not shown in FIG. 2, the comparator 61 is supplied by the pulsating supply voltage. The comparator circuit 60 also includes a circuit defined by a resistor 62 and a capacitor 63 connected in parallel between the output of the comparator 61 and the B+ supply voltage, which circuit serves to smooth the comparator signal produced by the comparator 61. When the amplitude of the sinusoidal wave from the filter 40 equals or exceeds the threshold voltage applied to the reference input of the comparator 61, its output essentially becomes low and the capacitor 63 charges immediately. The signal on the signal input is an AC signal, so that the comparator 61 will alternatively be turned on and off. the capacitor 63 will alternately charge rapidly and discharge slowly through the resistor 62. Thus, the comparator signal on the output of the comparator 61 is generally low but fluctuates.

The threshold voltage varies. At the inception of a pulse, there is no voltage drop across the resistor 72 by virtue of the capacitor 74. Accordingly, the voltage at the junction of the resistors 72 and 73 is the B+ supply voltage multiplied by the fraction represented by the value of the resistor 73 divided by the sum of the resistors 71 and 73. The capacitor 74 charges during the pulse so that the voltage at the junction of the resistors 72 and 73 decays at a rate determined by the components in the decay circuit 70, ultimately reaching a value equal to the B+ supply voltage multiplied by the fraction represented by the value of the resistor 73 divided by the sum of the values of the resistors 71, 72 and 73. In an operative form of this invention, the resistor 71 had a value of 100K, the resistor 72 had a value of 18K and the resistor 73 had a value of 82K; whereby at the start of each battery saver pulse, the voltage at the junction of the resistors 72 and 73 was 0.45B+ (82/100+82). When the capacitor 74 is completely charged, the voltage at that point would be 0.41B+ (82/100+18+82). Because the voltages at the junction of the resistors 72 and 73 and at the junction of the resistors 71 and 72 are initially the same, the signal from the filter 40 would have the same amplitude as the threshold supplied to the reference input of the comparator 61, thereby causing a comparator signal to start. In the presence of the code tone having a frequency to which the filter 40 is designed to respond, the amplitude of the signal out of the filter 40 will continue to exceed this threshold voltage even though it is falling. Actually, during each pulse, the signal at the signal input of the comparator 61 is fluctuating about a level that increases exponentially, because the op amp bias voltage at the junction of the resistors 71 and 72 is increasing, to say B+/2 (the values of the resistors 72 and 73 times B+, divided by the sum of the values of the resistors 71, 72 and 73).

However, if the signal from the limiter 13 is noise having components at the frequency of the filter 40, some sinusoidal wave components may be applied to the signal input of the comparator 61 which initially will be equal to the threshold thereat so that a comparator signal continues. However, the level of those components will be less than the threshold voltage which is decaying. When the amplitude of the signals from the filter 40 decreases so that its peaks no longer cross the threshold voltage, the comparator signal terminates. Similarly, an adjacent-channel code tone may cause an output from the filter 40, but the comparator signal will be short-lived since the amplitude of signals from the filter 40 would very quickly fall below the threshold voltage (i.e., peaks would no longer cross the threshold).

The comparator signal is applied to the diode 30 to cause the battery saver circuit 20 to discontinue producing a pulsed supply voltage and instead to produce a continuous voltage as previously explained.

As described above, the bias voltages for the op amps in the filter 40 are supplied by the decay circuit 70 so they increase during each battery saver pulse. This rise in voltage simply increases the effective variation of the threshold voltage with time since it is opposite in direction to the decaying threshold. A fixed voltage of B+/2 would be satisfactory, in which case it would be necessary to readjust the decaying threshold curve. To save parts, however, the varying B+/2 voltage from the decay circuit 70 is used. Since the decaying characteristic of the bias voltages is not a requirement, the connection between the circuit 70 and the filter 40 is not shown in FIG. 1.

The comparator signal is also applied to the duration sensor 80 which includes a timing circuit defined by a resistor 81 connected in parallel with a diode 82, and a capacitor 83 connected to the B+ supply voltage. The duration sensor 80 further includes an electronic switch 84 in the form of a NAND gate. A diode 85 connects the output of the electronic switch to the timer 90.

The output of the electronic switch 84 is normally low. When the input thereto drops below a predetermined switching value, say B+/2, the output becomes high. Upon the commencement of a comparator signal, that is, when the output of the comparator 61 becomes low, the capacitor 83 charges slowly through the resistor 81. The time constant represented by the values of the resistor 81 and capacitor 83 is such that the input to the electronic switch 84 will reach the switching value about 600 ms. after the commencement of the comparator signal. The figure 600 ms. is exemplary and the time constant can be established for any duration desired. Thus, an output signal would be created if the comparator signal has a duration of 600 ms. or longer. If the comparator signal terminates before that time, that is, the output of the comparator 61 becomes high, the input to the electronic switch 84 becomes high very quickly because the capacitor 83 discharges through the diode 82.

The timer 90 includes a timing network having a resistor 91 and a capacitor 92 connected in parallel between ground and the input and an electronic switch 93 in the form of a NAND gate. The electronic switch 93 is designed to switch and its output to become low when the signal on the signal input reaches a switching level of say, B+/2. Upon commencement of the output signal from the duration sensor 80, the capacitor 92 is substantially instantaneously charged to B+, thereby exceeding B+/2 and switching the electronic switch 93. When the output signal terminates, the capacitor 92 discharges through the resistor 91 at a very slow rate. Ultimately, the value on the signal input of the electronic switch 93 will fall below the switching voltage and the signal on the output thereof again becomes low. The values of the resistor 91 and the capacitor 92 are selected such that the output of the electronic switch 93 remains high for an extended period of time, say 10 seconds. The output of the electronic switch 93 is coupled to a PNP transistor 94 by way of resistor 95, the collector of which is connected to the audio circuit 14 and through a resistor 96 to ground. Thus, in the presence of the proper code tone, there will appear on the output of the timer 90, a timer signal which persists for an extended period of time, 10 seconds, for example, which maintains the audio circuit 14 operative for that period of time to translate the ensuing voice message.

A second timer signal also appears on the output of the electronic switch 93, which timer signal is of opposite polarity and is coupled to the battery saver circuit 20 via the resistor 31 therein. The low voltage on the output of the electronic switch 93 causes the battery saver circuit 20 to stop pulsing and instead provide a continuous supply voltage to the processor circuit 12, etc.

There is also provided a manually operated switch 100 coupled to the junction of diodes 101 and 102. The diode 101 is connected to the input to the timer 90 while the diode 102 is connected to the resistor 95 and also to the resistor 31 in the battery saver circuit 20. If the switch 100 is actuated, the capacitor 92 is rapidly discharged and the timer signal is terminated. At the same time, an enabling voltage is coupled through the diode 102 to the battery saver circuit 20 to maintain the supply voltage continuous as long as the switch 100 is actuated. Also, the enabling voltage is coupled through the resistor 95 to the transistor 94 so that the audio circuit 14 is maintained enabled as long as the switch 100 is actuated. Thus, operation of the switch 100 accomplishes two purposes: first, if the audio message was shorter than the duration of the timing signal, say 10 seconds, the switch 100 can be operated and released to resquelch the receiver before the end of the 10-second period. It also enables one to monitor the channel even though the proper code has not been received. The switch 100 also enables one to maintain the receiver 10 operative to process audio information even after the 10-second period has ended.

Figure 3:
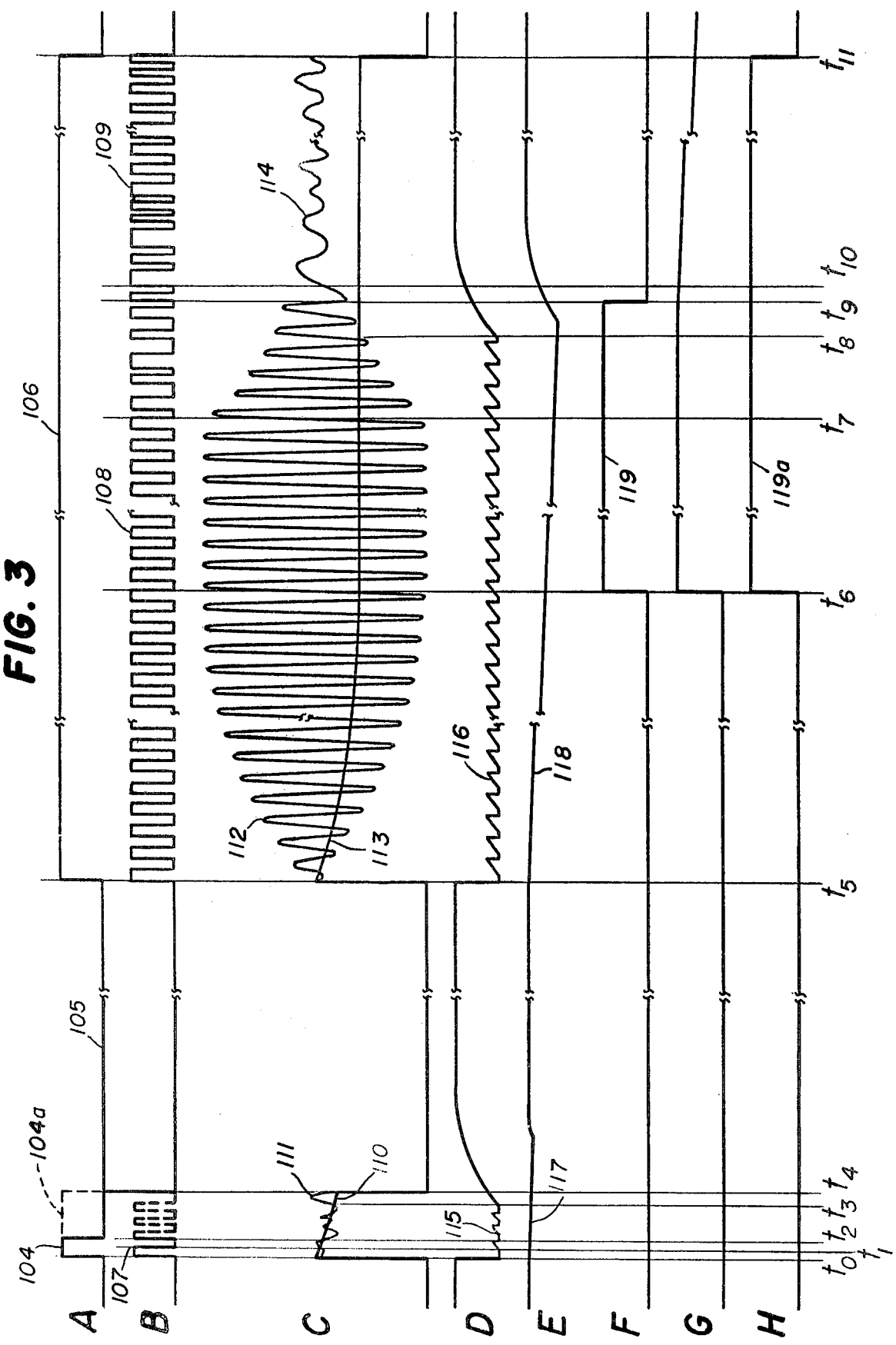
FIG. 3, including A-H, depict wave forms at various points in the schematic diagram of FIG. 2.

Turning now to FIG. 3, there is depicted wave forms at points in the receiver of FIG. 2 labeled with capital letters corresponding to the letters on the left-hand side of FIG. 3. FIG. 3A depicts the wave form at the collectors of the transistors 34 and 35 in the battery saver circuits 20. It consists of pulses 104, say 2 ms. in duration, separated by 1.75 second intervals 105. Only one pulse 104 is shown, starting at $t_0$ and ending at $t_2$. As will be described, the pulse duration may be extended, as indicated by 104a, to time $t_4$. During the next pulse, starting at time $t_5$, it is assumed that a proper code tone to which the receiver 10 is designed to respond is received to cause the supply voltage to become continuous, as at 106. The signal from the limiter 13 is represented by the wave form shown in FIG. 3B. Prior to the battery saver pulse 104, that is, prior to time $t_0$, the processor circuit 12 is inoperative and therefore no signal is produced by the limiter 13. At $t_0$, the white noise produced in the processor circuit 12 is reflected as an irregular rectangular wave for the period of the battery saver pulse 104. At $t_5$, it is assumed that a code tone to which the receiver is designed to respond to present when the receiver is again actuated by the pulsed supply voltage. The tone ends at $t_7$. Accordingly, from the period $t_5$ to $t_7$, FIG. 3B depicts a regular rectangular wave 108 having a frequency corresponding to the code tone. Starting at time $t_7$, the limiter 13 provides the ensuing voice message which is represented by an irregular, rectangular wave 109.

FIG. 3C depicts the inputs to the comparator circuit 60. Prior to time $t_0$, the supply voltage BS-B+ is zero and therefore no voltage is supplied by the decay circuit 70 to the threshold input of the comparator circuit 60. Also, no signal is applied to its signal input because the processor circuit 12, etc. are inoperative. At time $t_0$ when the battery saver pulse 104 commences, a threshold voltage is applied to the reference input of the comparator 61, which threshold 110 decays with time. Also, noise is produced by the processor circuit 12 which has components that are coupled through the filter 40 and result in a signal represented by the wave form 111 applied to the signal input of the comparator 61. The threshold 110 and the amplitude of the signal 111 from the filter a time $t_0$ are equal, causing the output of the comparator 61, as shown in FIG. 3D, to become low, to commence a comparator signal 115. The alternating nature of the signal 111 from the filter 40 carries it above and below the threshold 110. When it crosses the threshold 110 in a positive direction, the voltage on the output of the comparator 61 begins to rise, as shown at $t_1$. At time $t_2$, the wave form 111 crosses the threshold 110 causing the output to become low once again. Each time the wave form 111 rises above the threshold 110, the comparator signal begins to increase as represented by the three positive going peaks. Because the peaks of the signal 111 exceed the threshold until time $t_3$, the comparator signal 115 persists for that long and extends the duration of the supply voltage, which is indicated in FIG. 3A by the dashed line 104a, to time $t_4$ when the comparator signal 115 crosses the switching level of the gate 22 (FIG. 2).

The time constant of the resistor 62 and the capacitor 63 in the comparator circuit 60 is important in this regard. Each time the signal 111 exceeds the threshold 110, the capacitor 63 is charged. When the peaks of the signal 111 no longer cross the threshold 110, the capacitor 63 discharges through the resistor 62. The time constant must be such that the capacitor 63 does not discharge to the point that the comparator signal would reach the switching level of the gate 22 during a tone. A tone of 1,000 Hz. would have 1 ms. between negative peaks. The time constant would have to be such as to maintain the charge on the capacitor 63 for at least 1 ms. To accommodate 100 Hz. tones, the time constant would have to be ten times as great; otherwise the capacitor 63 would discharge to the switching point of the gate 22 within the 10 ms. period between negative peaks of the tone. This will cause the battery saver "on" period to exceed 10 ms. in duration. In order to minimize "on" time and, therefore maximize battery life, higher frequency tones should be used. For example, if the tones had frequencies of 500 Hz. or greater, the "on" period would have to be say 3 or 4 ms. (to accommodate 2 ms. between negative peaks plus tolerance.) The capacitor 63 and the resistor 62 operate to extend the "on" period of the multivibrator (determined by the values of the capacitor 26 and the resistor 28 primarily) whenever the time constant of the former pair of components is greater than the time constant of the latter components. Ideally, the "on" period of the multivibrator should be the smaller of the two so that the comparator signal controls the "on" time. This first time constant can thus be varied and made longer for those receivers having lower filter frequencies without any adjustment of the multivibrator.

At time $t_5$, when a code tone of the proper frequency is present, the filter 40 produces a signal 112. The decay circuit 70 produces a decaying threshold 113. Because the frequency of the signal 112 matches the center frequency of the filter 40, its amplitude is substantial and its negative-going peaks continue to exceed the threshold 113. The comparator circuit 60 produces a comparator signal 116, stating at time $t_5$ and decaying slightly every half cycle when the positive peaks of the signal 112 to not exceed the threshold 113. The comparator signal 116 persists because the peaks continue to exceed the threshold 113.

During the initial part of the signal 112 the amplitude of the filter output is building up in the usual way. For the sake of simplicity, the buildup is shown as centered about a constant DC level. In point of fact, the DC level about which the rising portion of the signal 112 is centered, increases at a rate nearly matching the rate of decay of the initial part of the threshold 113.

The comparator signal 116 is coupled to the battery saver circuit 20 and causes the supply voltages 106 to be continuous as long as it exists, as can be seen in FIG. 3A. Therefore, the processor circuit 12 is able to continue to supply signals and the filter 40 continues to supply the signal 112. At $t_7$, the filter output decays, but the comparator signal 116 persists until $t_8$ when the negative peaks no longer exceed the threshold 113, whereupon the capacitor 63 discharges completely. Thus, the comparator signal lasts from about $t_5$ at the beginning of the detection of the tone to about $t_9$. The code tone may have started prior to $t_5$, but it is at that instant when the receiver 10 becomes operative to process a tone.

The comparator signal is applied to the duration sensor 80. From $t_0$ to about $t_4$, the comparator signal 115 charges the capacitor 83 slowly through the resistor 81, to produce a charging voltage 117. Slightly after $t_4$ as the comparator signal 117 ends, the capacitor 83 is rapidly discharged through the diode 82. The amplitude of the signal on the capacitor 83 is not sufficient to have any effect on subsequent circuitry. However, the comparator signal 116 extends for a substantial length of time and therefore the capacitor 83 is completely charged, as shown by the charging voltage in FIG. 3E. As previously explained, the electronic switch 84 will switch conditions when its input decreases to $B+/2$. At time $t_6$, the voltage across the capacitor 83 reaches that value and the electronic switch 84 switches, whereupon its output becomes high as shown in FIG. 3F, to start an output signal 119. When the comparator signal 116 terminates, the capacitor 83 discharges relatively rapidly through diode 82 and when the voltage again reaches $B+/2$ at $t_9$, the electronic switch 84 is switched to its first condition and its output becomes low. Thus, the duration sensor 80 produces the output signal 119 depicted in FIG. 3F, lasting from $t_6$ to $t_9$. Such output signal is produced only if the duration of the comparator signal exceeds the duration $t_5$ to $t_6$. If the comparator signal is shorter, as in the initial part of FIG. 3D, no output signal is produced. The duration $t_5$ to $t_6$ could be 600 ms. for example.

The output signal 119 is applied to the timer 90 and rapidly charges the capacitor 92 to a high value, at $t_6$ as shown in FIG. 3G. At $t_9$ when the output signal 119 terminates, the capacitor 92 discharges slowly through the resistor 91. The electronic switch 93 has a switching voltage of for example $B+/2$. Thus, as long as the voltage exceeds $B+/2$, its output is low, whereas if the input drops below $B+/2$, its output becomes high. That polarity is effectively inverted by the transistor 94, so that the output of the timer 90 depicted in FIG. 3H is normally low and becomes high at time $t_6$ at the start of the output signal 119 which causes the electronic switch 93 to switch. Although the output signal 119 terminates at $t_9$, the slow discharge of the capacitor 92 applies to the electronic switch 93 is in excess of $B+/2$ until time $t_{11}$, when the timer signal 119a terminates. The period $t_6$ to $t_{11}$ could be ten seconds (plus the duration of the output signal 119). The timer signal 119a is applied to the audio circuit 14 and automatically keeps it operative to process the ensuing voice message. A timer signal lasting for the same period but inverted appears at the output of the electronic switch 93, which is applied to the battery saver circuit 20 to cause the supply voltage to be continuous for this entire period of time. As shown in FIG. 3A, the supply voltage 106 is continuous from $t_5$ at the start of the comparator signal, to $t_{11}$, at the end of the timer signal 119a. With the end of the timer signal 119a, the battery saver circuit 20 reverts to producing pulses to supply the receiver 10.

The tone must be present for nearly the duration $t_5$–$t_6$ in order for the timer signal 119a to be generated. The timer 90 will produce the timer signal 119a if the comparator signal 116 is present at $t_6$. If the comparator signal 116 is not present at t₆, signifying that absence has already been determined, then no timer signal will commence. In fact, the battery voltage pulse will have already ended. In the present invention, the timer signal 119a starts a predetermined time after the commencement of the tone 112. In prior art "presence" detectors, the timer signal commenced when the tone amplitude exceeded a given level for a delay period which could occur shortly after commencement of the tone or a substantial period of time later.

Figure 4:
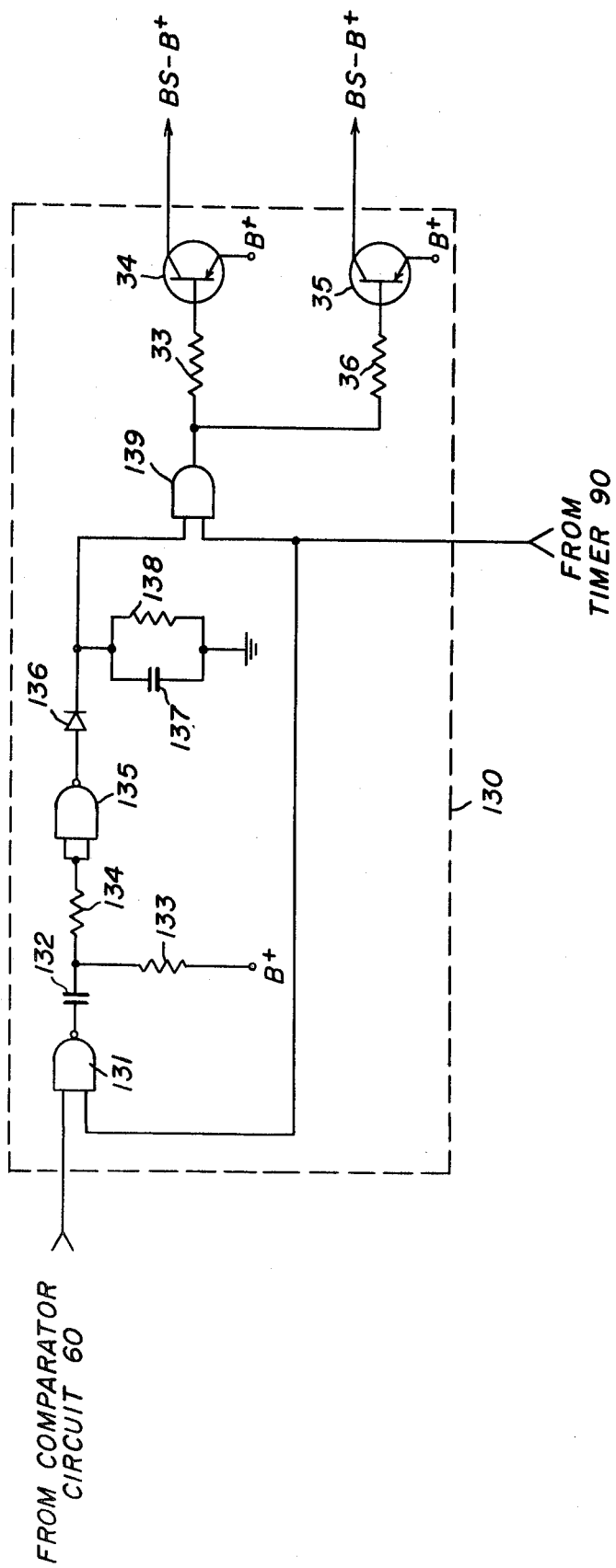
FIG. 4 is a schematic diagram of a variation of the battery-saver circuit, depicted in FIG. 2.

Turning now to FIG. 4, there is shown a modified battery saver circuit 130 having a monostable multivibrator defined by elements 131-138. The battery-saver circuit 130 includes a NAND gate 131 having one input coupled from the comparator circuit 60 and the other input derived from the timer 90. The output of the NAND gate 131 is coupled through a capacitor 132 and a resistor 133 to the B+ supply voltage. The junction of the capacitor 132 and the resistor 133 is coupled through a resistor 134 to an inverter 135, the output of which is coupled by way of a diode 136 to a timing circuit defined by a capacitor 137 and a resistor 138 coupled in parallel. The output of the diode 136 also is coupled to one input of an AND gate 139, the other input of which is derived from the timer 90. The output of the AND gate 139 is coupled, as in the first embodiment, through resistors 33 and 36 to PNP transistors 34 and 35.

The monostable multivibrator, consisting of the elements 131-138 has one stable condition and one unstable condition. In the stable condition, the receiver 10 is on. When first turned on a comparator signal commences, causing the output of the NAND gate 131 to become high, thereby creating a positive pulse which is applied to the input of the inverter 135. At this time, the output of the inverter 135 is already low; so the pulse has no effect, and the multivibrator remains in its stable condition. Assuming for the moment that no signal is being provided to the comparator circuit 60 by the filter 40, the capacitor 63 discharges through the resistor 62 in a few milliseconds to the switching point of the NAND gate 131, at which time its output becomes low furnishing a negative going pulse to the inverter 135, whereupon its output becomes high, thereby rapidly charging the capacitor 137 through the diode 136. The output of the AND gate 139 becomes high, thereby disrupting the supply voltage. The inverter 135 reverts to its normal condition, and the capacitor 137 begins to discharge through the resistor 138. When the capacitor 137 is sufficiently discharged, the associated input to the AND gate 139 again becomes low, thereby causing the supply voltage to be produced by the transistors 34 and 35. Thus, the monostable multivibrator consisting of the elements 131-138 is in its unstable condition for a time determined by the time constant of the capacitor 137 and the resistor 138 which in turn establishes the "off" time; in this embodiment that time may be 1.75 seconds. The duration of the battery-saver "on" period in the complete absence of a signal from the limiter 13 is determined by the time constant of the resistor 62 and capacitor 63. This time constant will be longer than the time constant established by the capacitor 132 and the resistor 133. As in the first example, the time constant is established to be as short as possible, say less than 2 ms.

As in the embodiment described in FIGS. 1-3, the presence of any signal from the filter 40 which may be the result of the tone to which it is tuned, will maintain the output of the comparator 61 low (ignoring the slight undulations arising because of the alternating charge and discharge of the capacitor 128). The output of the comparator 61 will remain low as long as the tone is or may be present. The monostable multivibrator consisting of the elements 131-138 will remain in its stable condition for the duration of the comparator signal so that it continues to produce the supply voltage for the processor circuit 12 (FIG. 1).

When the receiver 10 has been on for more than a time established by the values of the resistor 81 and the capacitor 83 (FIG. 2) a timer signal is produced, which maintains the multivibrator in the circuit 130 in its stable condition to supply a continuous output voltage for the entire duration thereof by maintaining the associated inputs to the NAND gate 131 and the AND gate 139 low.

Figure 5:
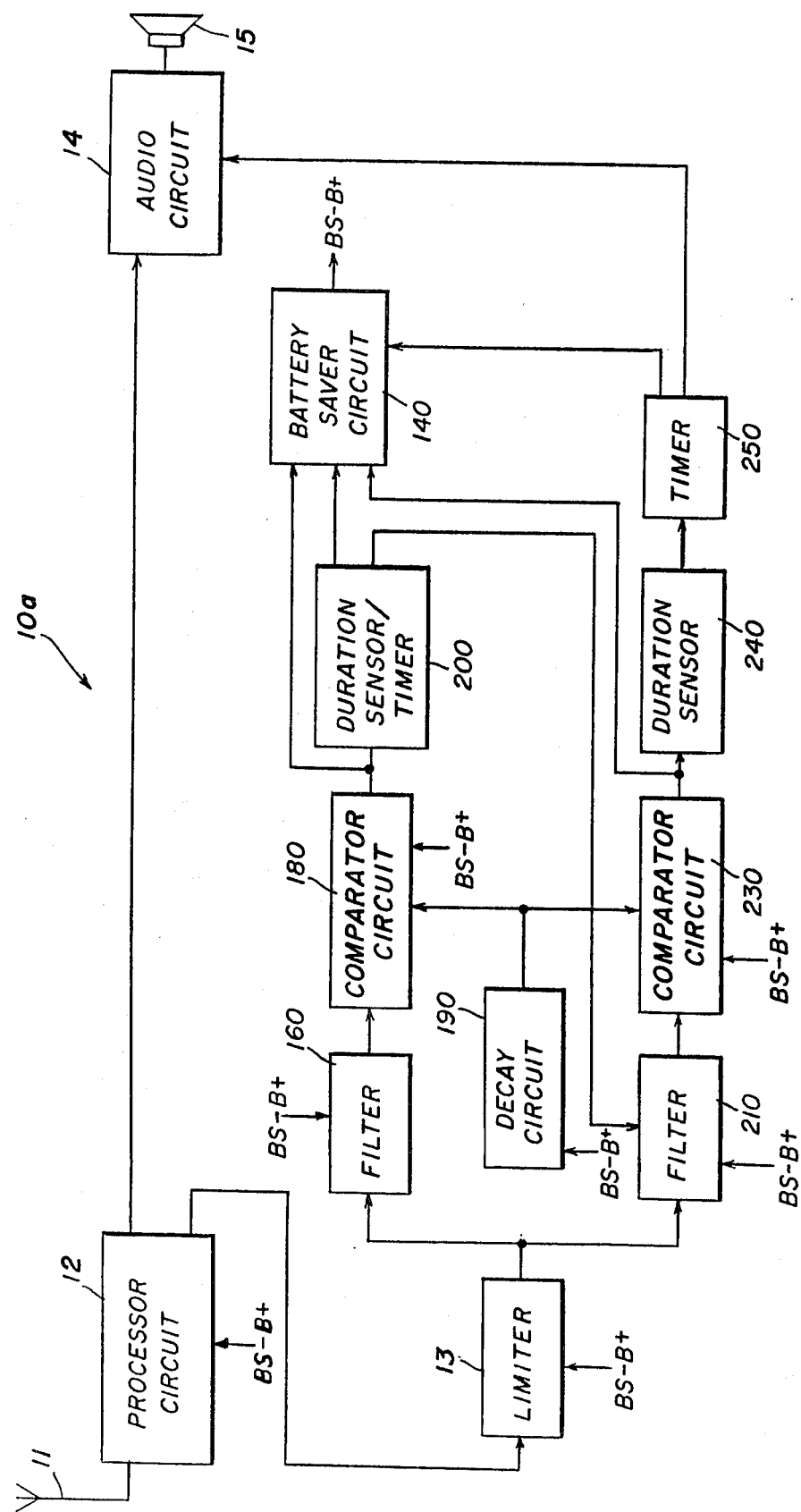
FIG. 5 is a block diagram of a two-tone, selective-call receiver having a signal absence detector incorporating the features of the present invention.

Turning now to FIG. 5, a further embodiment of the present invention will be described. Depicted in FIG. 5 is a receiver 10a adapted to respond to a code consisting of two tones in sequence. In other words, each of two tones must have a predetermined frequency, and order, to activate the receiver 10a. The receiver 10a includes many of the same elements as in the receiver 10, i.e. the antenna 11, the processor circuit 12, the limiter 13, the audio circuit 14 and the speaker 15. The receiver 10a also includes a battery saver circuit 140 which supplies a BS-B+ supply voltage to the processor circuit 12, and other circuits in the receiver 10a. The battery saver circuit 140 has basically the same construction as the corresponding circuit 20 in the receiver 10.

The code from the limiter 13 will be a sequence of two tones. The two-tone sequence is converted to a sequence of square waves, respectively at the frequencies of the tones, which are applied to filters 160 and 210. The filter 160 is in the normally operative channel, in the sense that it is operative to process the first code tone, while the filter 210 is in the second channel, which is normally inoperative, so that it cannot process a tone to which it is designed to respond until it is activated by the prior receipt and loss of the first tone. Since both of the filters 160 and 210, as disclosed, are active filters, they are supplied by the BS-B+ supply voltage, so that minimal power is used by these elements in the absence of the proper code.

The receiver 10a further includes a comparator circuit 180 having its signal input coupled to the output of the filter 160 and a reference input coupled to a decay circuit 190.

The pulsating supply voltage BS-B+ is supplied to the decay circuit 190, the decay circuit 190 being responsive to each such pulse to produce a threshold voltage that decays from a first value to a second value. The reference input of the comparator circuit 180 is coupled to the decay circuit 190. When the amplitude of the signal from the filter 160 is at least equal to the threshold voltage (as discussed in connection with FIG. 3), the comparator circuit 180 produces a comparator signal. If the signal from the filter 160 drops below the threshold, the comparator signal ends. Thus, the comparator signal has a duration corresponding to the time the signal from the filter 160 is equal to or greater than the threshold voltage.

The bias voltages in the filter 160 are established such that the signal which passes therethrough will have an amplitude at least equal to the initial value of the threshold voltage from the decay circuit 190. However, the threshold immediately begins to decay so that signals from the filter 160 may or may not have an amplitude exceeding the threshold at a later time during each pulse.

Accordingly, any signal will necessarily have an initial amplitude sufficient to be equal to the threshold and cause the inception of a comparator signal from the comparator circuit 180. In the case of noise developed in the processor circuit 12, or adjacent channel tone, a signal will be applied to the signal input of the comparator circuit 180, having an amplitude at least equal to the threshold voltage. However, such extraneous signals cause the filter output to have a relatively low amplitude so that the decaying threshold voltage will cause the comparator signal to terminate rather quickly, within a few milliseconds or so. Thus, in the case of such extraneous signals, the comparator signal produced by the comparator circuit 180 will be of relatively short duration.

If the signal received by the processor circuit 12 includes the tone to which the filter 160 is designed to respond, a signal will be applied to the signal input of the comparator circuit 180, which has an amplitude initially equal to the threshold voltage from the decay circuit 190, thereby commencing the comparator signal. The signal from the filter 160, being of high amplitude, continues to exceed the reference voltage even though it is decaying. The comparator signal continues for a period of time substantially equal to that part of the first tone that is actually detected.

If the first tone has a duration of say 2 seconds, and the time between battery saver pulses is 1.75 seconds, the comparator signal will have a long duration between 250 ms. and 2 seconds in the presence of the code tone to which the filter 160 is designed to respond, and a duration of just a few milliseconds if the receiver 10 is not receiving the proper code tone. (For example, an adjacent-channel code tone or noise.)

A duration sensor/timer 200 produces an enabling signal on termination of the comparator signal if the comparator signal duration exceeded some predetermined value such as 50 ms. The enabling signal lasts for a period of say 75 ms. The enabling signal is also coupled to the filter 210. If no second tone is present during the 75 ms. window, the enabling signal terminates, so that the receiver is prepared to evaluate the subsequent code. However, if a second code tone has a frequency to which the filter 210 is tuned and is received during the 75 ms. window, a sinusoidal signal at the frequency of the code tone will appear at the output of the filter 210. A comparator circuit 230 receives such sinusoidal signal and produces a comparator signal which continues for a period of time substantially equal to the duration of the enable pulse.

The comparator signal is applied to a duration sensor 240. If the comparator signal has a duration greater than a predetermined value, such as 50 ms., signifying a second code tone of that duration, an output signal will be produced, which is applied to a timer 250. The timer 250 produces a timer signal commencing with the output signal from the duration sensor 240 and terminating a predetermined time later, such as 10 seconds. The timer 250 is coupled to the audio circuit 14. The timer signal enables the audio circuit 14 to output the balance of the second code tone. The tone applied to the audio circuit 14 is reproduced by the loudspeaker 15 to create an altering tone informing the bearer of the receiver 10*a* of an audio message to follow. Alternatively, the altering tone can be internally generated. The audio circuit 14 is eenabled for an additional 10-second period of time so that the audio message which follows the code tone will be processed, amplified and reproduced by the loudspeaker 15.

The comparator signals from the comparator circuits 180 and 230, the enabling signal from the duration sensor/timer 200 and the timer signal from the timer 250 are also coupled to the battery saver circuit 140. In the presence of these signals, the BS-B+ supply voltage is continuous.

Figure 6:
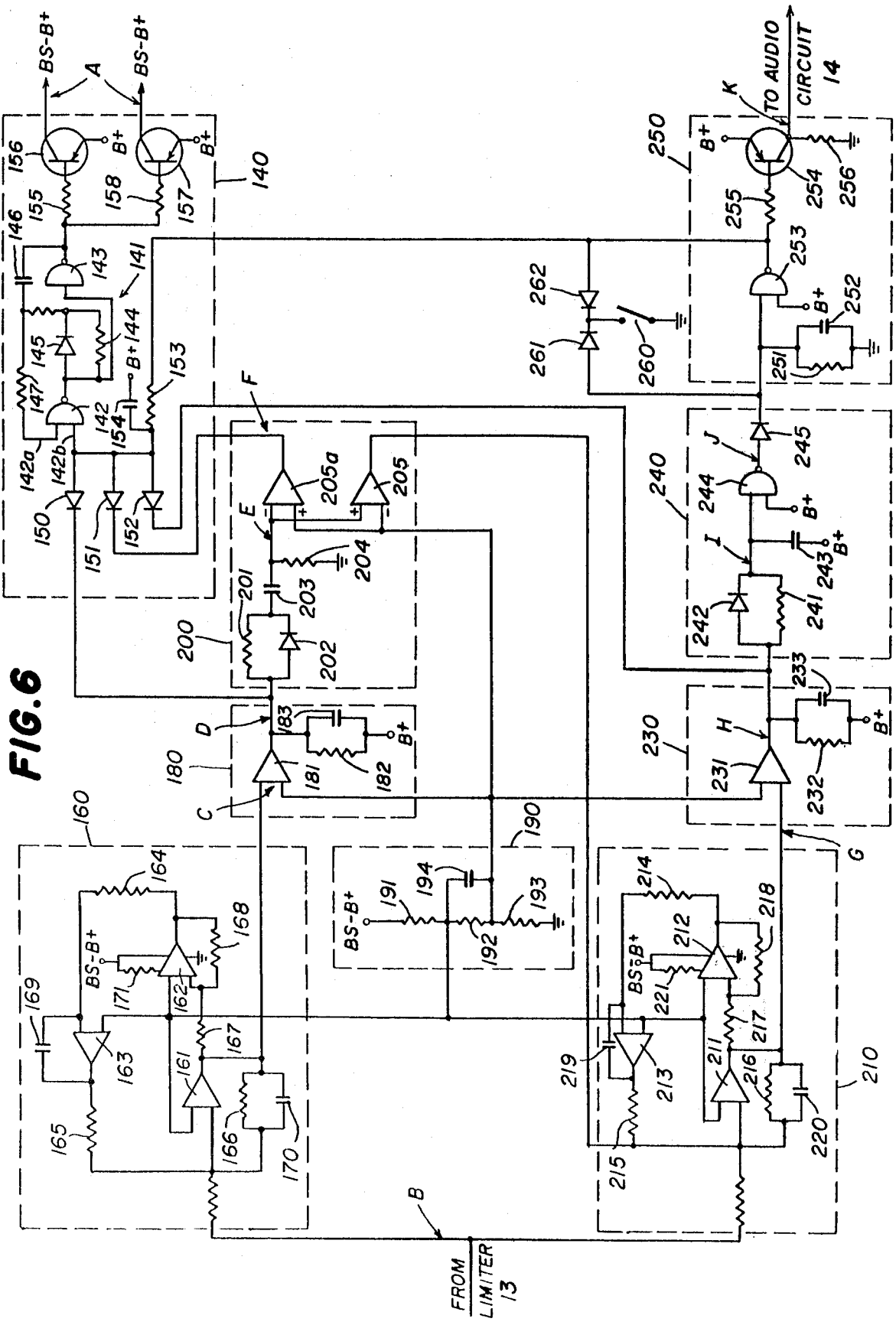
FIG. 6 is a schematic diagram of parts of the receiver of FIG. 5.

Turning now to FIG. 6, further details of the receiver 10*a* will be described. The battery saver circuit 140 is basically identical to the battery saver circuit 20 depicted in FIG. 2 and has a similar mode of operation. Whereas the battery saver circuit 20 has two inputs thereto to cause the supply voltage to be continuous, the battery saver circuit 140 has four such inputs. Three inputs are applied by way of diodes 150, 151 and 152, and a fourth input is applied by way of the resistor 153. A capacitor 154 serves to maintain a negative voltage on the input to the NAND gate 142 during switching transitions from one input to another. As in the battery saver circuit 20, the battery saver circuit 140 includes a NAND gate 142 having inputs 142*a* and 142*b*. The battery saver circuit 140 produces a pulsating supply voltage as long as the input 142*b* remains high. When the input 142*b* becomes low because of signals applied to any of the four inputs, the supply voltage furnished by the battery saver circuit 140 becomes continuous.

The processor circuit 12 (FIG. 5) develops a sequence of sinusoidal waves corresponding to the code tones which were modulated on the carrier wave. The sinusoidal waves are applied to the limiter 13 which provides a sequence of square waves respectively at the frequencies of the code tones. The filter 160 (FIG. 6) is basically identical to the filter 40 in the first embodiment and has corresponding reference numerals applied to the components thereof. For example, the filter 160 has op amps 161, 162 and 163. The filter 160 is only operative during the supply voltage pulses to evaluate the frequency of the code tones from the limiter 13.

As in the embodiment of FIGS. 1-3, bias for the op amps in the filter 160 is in the form of a pulsating voltage. For this purpose, the decay circuit 190 includes a set of three resistors 191, 192 and 193 connected in series between the pulsating B+ supply voltage and ground. A capacitor 194 is connected across the resistor 192. The junction of the resistors 191 and 192 is connected to the bias inputs of the op amps 161, 162 and 163. The values of the resistors 191, 192 and 193 are preferably such that the bias on these bias inputs is about one-half the B+ supply voltage, so that the sinusoidal wave produced by the filter 160 in response to the first train of tones from the limiter 13, will swing essentially between B+ and ground. As in the first form the voltage at the junction of the resistors 191 and 192 varies somewhat. Since the bias voltage for the filter 160 need not vary, the connection between the decay circuit 190 and the filter 160 is not shown in FIG. 5.

The comparator circuit 180 is identical to the comparator circuit 60 in the first embodiment and operates in the same way. It includes a voltage comparator 181 (supplied by BS-B+) having a signal input coupled to the output of the first filter 160 and a reference input coupled to the junction of the resistors 192 and 193. The comparator circuit 180 also includes a smoothing circuit defined by a resistor 182 and a capacitor 183 connected in parallel between the output of comparator 181 and the B+ supply voltage. In the presence of a first code tone having the frequency to which the filter 160 is designed to respond, the comparator circuit 180 will produce a relatively long comparator signal. Other signals such as noise and adjacent-channel tones will cause the comparator signal to be short in duration.

The comparator signal is coupled to the diode 150 in the battery saver circuit 140 to cause the supply voltage to become continuous for the duration thereof. The comparator signal commences with the detection of the first tone and in response to certain noise components or adjacent-channel code tones. Since the comparator signal controls the duration of the battery saver pulse, the noise or adjacent-channel code tone will have an effect on the battery saver timing. The noise may cause the comparator signal to persist for some period of time which would cause the supply voltage to be continuous for that period of time. However, as soon as the output from the filter 160 caused by the noise, drops below the decaying threshold furnished by the decay circuit 190, the battery saver circuit 140 reverts to producing a pulsating supply voltage. In the presence of the proper code tone, however, the comparator signal will last as long as that code tone is present, and the supply voltage will be continuous for that period of time enabling the processor circuit 12 (FIG. 5) to continue to process the first tone.

The comparator signal is also applied to the duration sensor/timer 200 which includes a timing circuit defined by a resistor 201 connected in parallel with a diode 202, and a capacitor 203 in series with a resistor 204 to ground. The junction of the capacitor 203 and the resistor 204 is connected to one input of electronic switches 205 and 205a, each being in the form of a comparator. The othe input of each comparator is connected to the junction of the resistors 192 and 193 in the decay circuit 190.

The output of the electronic switch 205 is normally low. When the signal on the signal input thereof reaches the switching value determined by the threshold from the decay circuit 190, the output floats. The threshold voltage for the electronic switch 205 varies somewhat from the B+/2 value as previously explained because of the capacitor 194. However, this is not significant to the operation of the receiver 10a. The voltage could just as well be fixed. The junction of the resistors 192 and 193 is simply a convenient source of the needed threshold voltage.

Upon the commencement of the comparator signal, that is, when the output of the comparator 181 becomes low, the capacitor 203 discharges slowly through the resistors 201 and 204. When the first tone terminates, the capacitor 203 charges through diode 202 and the resistor 204. If the capacitor 203 is discharged sufficiently by a comparator signal which is long enough, say 50 ms., the electronic switches 205 and 205a will produce enabling signals upon termination of the comparator signals which have equal durations dependent on the time constant established by the resistor 204 and the capacitor 203. As soon as the voltage at the signal inputs of the electronic switches 205 and 205a fall below the switching level, the enabling signals terminate. The enabling signals could have a duration of say 75 ms. The enabling signal from the switch 205a is coupled to the diode 151 to cause the supply voltage to be continuous for the duration thereof.

The enabling signal from the switch 205 is coupled to the filter 210 which is basically identical to the filter 160 in the first channel. For example, the filter 210 has op amps 211, 212 and 213. However, the filter 210 is part of a normally inoperative channel and does not respond to a tone until a tone of the proper frequency has been processed by the filter 160. For this purpose, the input terminal of the op amp 211 is connected to the duration sensor/timer 200 in the first channel. In the absence of a timer signal, the op amps 211, 212 and 213 are disabled and the filter 210 is not operative.

The reception and termination of the first code tone will cause generation of an enabling signal of say 75 ms. in duration. During this 75 ms. "window", the second channel is enabled and the battery saver circuit 140 is held on to determine if the second code tone is present. If the second tone is absent the enabling signal terminates, so that the receiver is prepared to evaluate a subsequent code. However, if the second code tone is of the frequency to which the filter 210 is tuned, and such is received during the 75 ms. window, the filter 210 will produce a sinusoidal output wave.

The second channel includes a comparator circuit 230 having its signal input coupled to the output of the filter 210 and its reference input coupled to the decay circuit 190. The comparator circuit 230 is identical to the comparator circuit 180 in the first channel and operates in the same way except that the decay of the voltage from the circuit 190 will have already taken place. It includes a comparator 231 (supplied by BS-B+) having a signal input coupled to the output of the filter 210 and a reference input coupled to the junction of the resistors 192 and 193. The comparator circuit 230 also includes a smoothing circuit defined by a resistor 232 and a capacitor 233 connected in parallel between the output of the comparator 231 and the B+ supply voltage. The threshold voltage of the comparator 231 varies initially (during reception of the first tone). However, such variation is not significant and a fixed supply voltage would suffice. The signal from the filter 210 in response to the second tone will eventually be equal to or exceed the threshold voltage from the decay circuit 190, causing the capacitor 233 to charge rapidly. The capacitor 233 will discharge slightly during every other half cycle. The comparator circuit 230 will thus produce a comparator signal having a duration substantially equal to the duration of the second tone, but not longer than the 75 ms. window.

The comparator signal is coupled to the diode 152 to cause the supply voltage to be continuous for the duration thereof.

The comparator signal is also coupled to the duration sensor 240 which has a construction identical to the duration sensor 80 in the first embodiment. It includes a timing circuit defined by a resistor 241 connected in parallel with a diode 242, and a capacitor 243 connected to the B+ supply voltage. The duration sensor 240 further includes an electronic switch 244 in the form of a NAND gate. A diode 245 connects the output of the electronic switch 244 to the timer 250.

The output of the electronic switch 244 is normally low. When the input thereto passes through a predetermined switching value, say B+/2, the output becomes high. Upon commencement of a comparator signal, that is, when the output of the comparator 231 becomes low, the capacitor 243 charges slowly through the resistor 241. The time constant represented by the values of the resistor 241 and capacitor 243 is such that the input to the electronic switch 244 will reach the switching value a predetermined time, say 50 ms., after the commencement of the comparator signal. Thus, an output signal would be created if the comparator signal has a duration of 50 ms. or longer. If the comparator signal is shorter, the capacitor 243 rapidly discharges through the diode 242, and the switching value is not reached.

The timer 250 is basically identical to the timer 90 in the first embodiment. It includes a timing network having a resistor 251 and a capacitor 252 connected in parallel to ground, which network is connected to an electronic switch 253 in the form of a NAND gate. The electronic switch 253 is designed to switch and its output become low when the signal on the signal input thereof reaches a switching level. Upon commencement of the output signal from the duration sensor 240, the capacitor 252 is substantially instantaneously charged to B+ thereby exceeding B+/2 and switching the electronic switch 253. When the output signal terminates, the capacitor 252 discharges through the resistor 251 at a very slow rate. Ultimately, the value on the signal input of the electronic switch 253 will fall below the switching voltage and the signal on the output thereof again becomes high. Values of the resistor 251 and the capacitor 252 are selected such that the output of the electronic switch 253 remains low for an extended period of time, say 10 seconds. The output of the electronic switch 253 is connected to a PNP transistor 254 by way of a resistor 255, the collector of which is connected through a resistor 256 to ground, and is connected to the audio circuit 14. Thus, in the presence of a proper second code tone, there will appear on the output of the timer 250 a timer signal which persists for an extended period of time of 10 seconds, for example, which maintains the audio circuit 14 operative for that period of time to translate the ensuing voice message.

The timer signal also appears on the output of the electronic switch 253, which is connected to the battery saver circuit 140. The low voltage on the output of the electronic switch 253 causes the battery saver circuit 140 to continue to provide supply voltage to the processor circuit 12, etc.

As in the first embodiment, there is also provided a manually operated switch 260 coupled to the junction of diodes 261 and 262. The diode 261 is connected to the input to the timer 250 while the diode 262 is connected to the resistor 255 and also to the battery saver circuit 140. If the switch 260 is actuated, the timer signal is terminated and at the same time an enabling voltage is coupled to the battery saver circuit 140 to maintain the supply voltage continuous. Also, the enabling voltage is coupled to the transistor 254 so that the audio circuit 14 is maintained enabled as long as the switch 260 is actuated.

Figure 7:
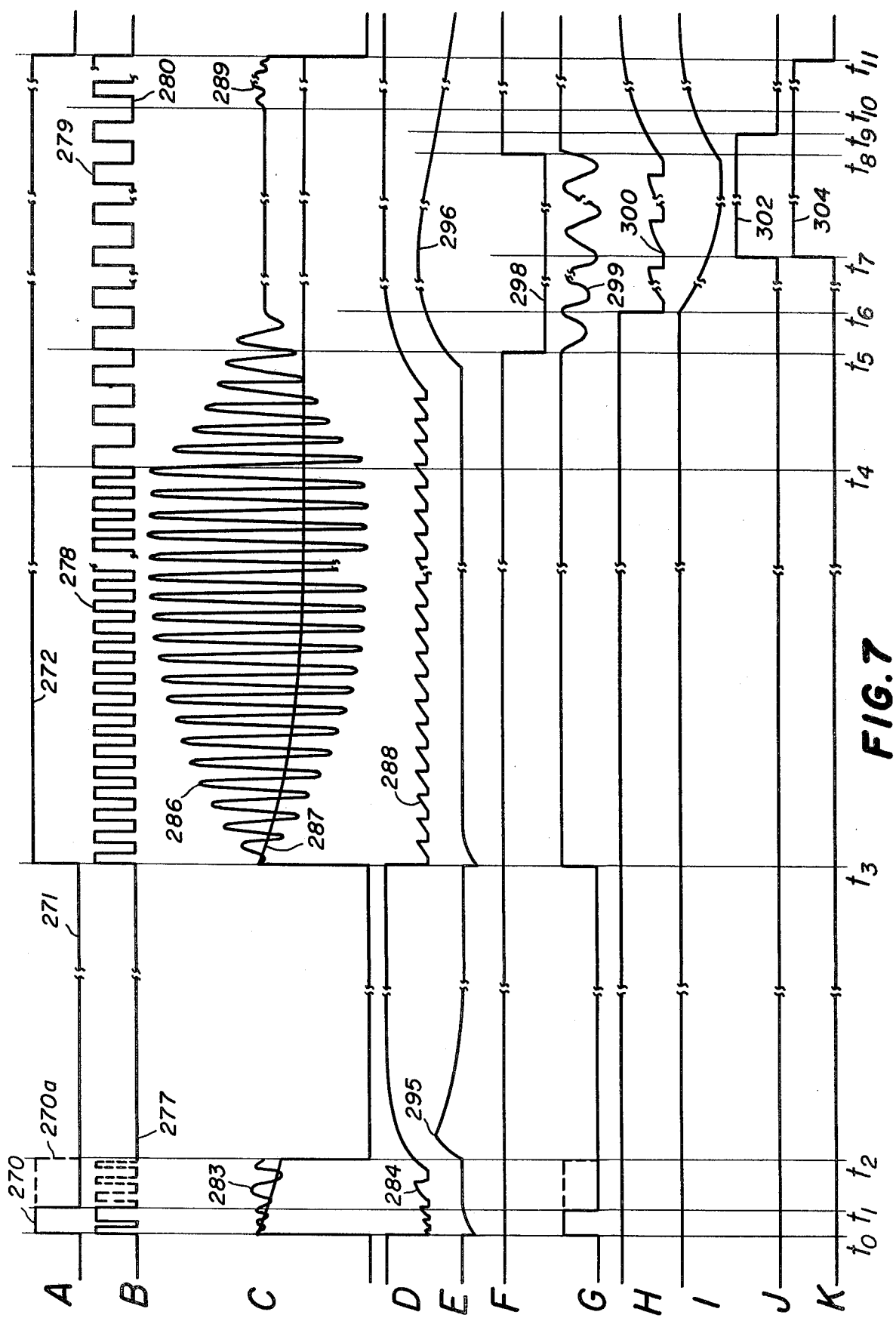
FIG. 7, including A-K, depict wave forms at various points in the schematic diagram of FIG. 6.

Turning now to the wave forms shown in FIG. 7, further details of the receiver of FIG. 6 will be described. FIG. 7A depicts the wave form at the collectors of the transistors 156 and 157 in the battery saver circuit 140. It consists of pulses 270, say 2 ms. in duration, separated by 1.75 second intervals 271. Only one pulse 270 is shown, starting at $t_0$ and ending at $t_1$. As will be described, the pulse duration may be extended as indicated by 270a to time $t_2$. During the next pulse, starting at $t_3$, it is assumed that the proper first code tone to which the receiver 10a is designed to respond is received to cause a supply voltage to be continuous as at 272.

The signal from the limiter 13 is represented by the wave form shown in FIG. 7B. Prior to the battery saver pulse 270, that is, prior to time $t_0$, the processor circuit 12 is inoperative, and, therefore, no signal is produced by the limiter 13. White noise produced in the processor circuit 12 is reflected as an irregular rectangular wave for the period of $t_0$–$t_1$.

When, however, the supply voltage is extended, as shown by the dashed line 270a in FIG. 7A, then the processor circuit 12 is enabled until time $t_2$ to provide white noise as reflected as the irregular, rectangular wave indicated in dashed line. The first code tone is present from $t_3$ to $t_4$, as represented by the regular rectangular wave during that interval. At $t_4$, the first code tone ends and the second tone begins. The wave 286 decays since the active filter 160 is no longer tuned to the incoming frequency. The commencement of the second code tone at that time is represented by the wave 279 at a lower frequency. The second code tone lasts until $t_{10}$ at which time the voice message commences as represented by the irregular wave form 280.

FIG. 7C depicts the inputs to the comparator circuit 180 in the first channel. Prior to time $t_0$, the supply voltage BS-B+ is zero and therefore no voltage is applied by the decay circuit 190 to the threshold input of the comparator circuit 180. Also, no signal is applied to its signal input, because the processor circuit 12, etc. are inoperative. At time $t_0$, when the battery saver pulse 270 commences, a threshold 282 is applied to the reference input of the comparator 181, which threshold decays with time. Also, noise produced by the processor circuit has components which are coupled through the filter 160 and result in a signal 283 applied to the signal input of the comparator.

At $t_0$ the threshold 282 and the amplitude of the signal 283 are equal, causing the output of the comparator 181, as shown in FIG. 7D, to become low, thereby commencing a comparator signal 284. The alternating nature of the signal 283 carries it above and below the threshold 282. The comparator signal 284 lasts a comparatively short time in the presence of noise because the negative peaks of the signal 283 do not continue to exceed the threshold 282. Because the signal 283 exceeds the threshold for a time, the comparator signal 284 persists until $t_2$ and extends the duration of the supply voltage, which is indicated in FIG. 7A by the dashed line 270a, to time $t_2$ when the comparator signal drops below the value to maintain the battery-saver circuit 140 operative.

At time $t_3$, when the first code tone of proper frequency commences, the amplitude of the signal 286 from the filter 160 increases. The decay circuit 190 produces a decaying threshold 287. Because the frequency of the signal 286 from the filter 160 matches the center frequency thereof its amplitude is substantial. A comparator signal 288 starts at time $t_3$ and decays slightly every other half cycle as indicated but persists because the negative peaks continue to exceed the threshold 287.

The comparator signal is coupled to the battery saver circuit 140 causing the supply voltage to be continuous as long as it exists as can be seen in FIG. 7A. Therefore, the processor circuit 12 is able to continue to supply signals to the filter 160 which continues to supply the signal 286. At $t_4$ when the first code tone terminates, its amplitude from the filter 160 decays, but the comparator signal 288 persists until the peaks no longer exceed the threshold 287, whereupon the capacitor 183 discharges completely. Thus, the comparator signal lasts from $t_3$ to about $t_5$. The code tone may have started prior to $t_3$, but it is at that instant when the receiver 10a becomes operative to process a tone.

FIG. 7E depicts the signal applied to the electronic switches 205 and 205a. Initially, such input is low. During this time capacitor 203 is discharging very slowly through the resistors 201 and 204. During termination of the comparator signal 284, the current through the capacitor produces an output pulse 295 due to the voltage drop across the resistor 204. Because the comparator signal 284 is short in duration, the peak of the pulse 295 is relatively low so an enable pulse is not generated. After the voltage peaks, it slowly drops as the capacitor 203 charges through the resistor 204 and diode 202. However, the duration of the comparator signal 288 is long so as almost completely to discharge the capacitor 203 so that on removal of the signal an output pulse 296 will be generated, which is of much higher amplitude than the pulse 295. As the voltage rises, it reaches, at time $t_5$, a value to switch the electronic switches 205 and 205a and commence production of enabling signals. FIG. 7F shows the output of the switch 205a. The initial output is floating. When not floating, it is grounded and shown low (298). The pulse 296 is defined by a voltage across resistor 204 which decays at a slower rate. At $t_8$, the voltage again reaches $B+/2$, whereupon the electronic switch 205a reverts to its initial floating condition and the enabling signal terminates. The enabling signal produced by the switch 205 is not shown.

FIG. 7G depicts the signal 299 from the filter 210 in response to the second tone. It starts at $t_5$ with the enabling signal and ends at $t_8$ when the enabling signal ends. Although shown as being of constant amplitude, the signal 299 builds up like the signal 286. The signal 299 causes the comparator circuit 230 to produce a comparator signal 300 of similar characteristics to the comparator signal 288. It terminates at $t_8$, with the termination of the enabling signal 298, because thereafter the filter 210 is not operative to process the balance of the second tone. At that time, the capacitor 233 is permitted to discharge and the comparator signal 300 decays. The comparator signal 300 is applied to the duration sensor 240. The comparator signal 300 charges the capacitor 243, starting at $t_6$ as shown in FIG. 7I. The electronic switch 244 will switch conditions when its input reaches $B+/2$. At time $t_7$, the voltage across the capacitor 243 reaches that value and the electronic switch 244 switches, whereupon its output becomes high as shown in FIG. 7J to start an output signal 302. When the comparator signal 300 terminates, the capacitor 243 discharges relatively rapidly. When the voltage again reaches $B+/2$, at $t_9$, the electronic switch 244 is switched to its first condition and its output becomes low. Thus, the duration sensor produces an output signal 302 lasting from $t_7$ to $t_9$. Such output signal is produced only when the duration of the comparator signal exceeds the duration $t_6-t_7$. If the comparator signal is shorter, no output signal is produced.

At $t_7$, the output signal is applied to the timer 250 and rapidly charges the capacitor 252 to a high value. At $t_9$, when the output signal 302 terminates, the capacitor 252 discharges slowly through the resistor 251. As long as the voltage stays above the switching voltage of say $B+/2$, the output of the switch 253 is low. That polarity is effectively inverted by the transistor 254, so that the output of the timer 250 depicted in FIG. 7K is normally low and becomes high at $t_7$ at the start of the output signal 302 which causes the electronic switch 253 to switch. Although the output signal 302 terminates at $t_9$, the slow discharge of the capacitor 252 maintains the input to the electronic switch 253 in excess of $B+/2$ until time $t_{11}$, at which time the timer signal 304 terminates. The period $t_7$ to $t_{11}$ could be 10 seconds, for example. The timer circuit output is applied to the audio circuit 14 and automatically keeps it operative to process the ensuing voice message. The electronic switch 253 output prior to inversion by the transistor 254 is applied to the battery saver circuit 140 to cause the supply voltage to be continuous for the entire period of time. As shown in FIG. 7A it is continuous from $t_3$ at the start of the first comparator signal 288, to $t_{11}$, at the end of the timer signal 304. At the end of the timer signal 304, the battery save circuit 140 reverts to producing pulses to supply the receiver 10a.

Figure 8:
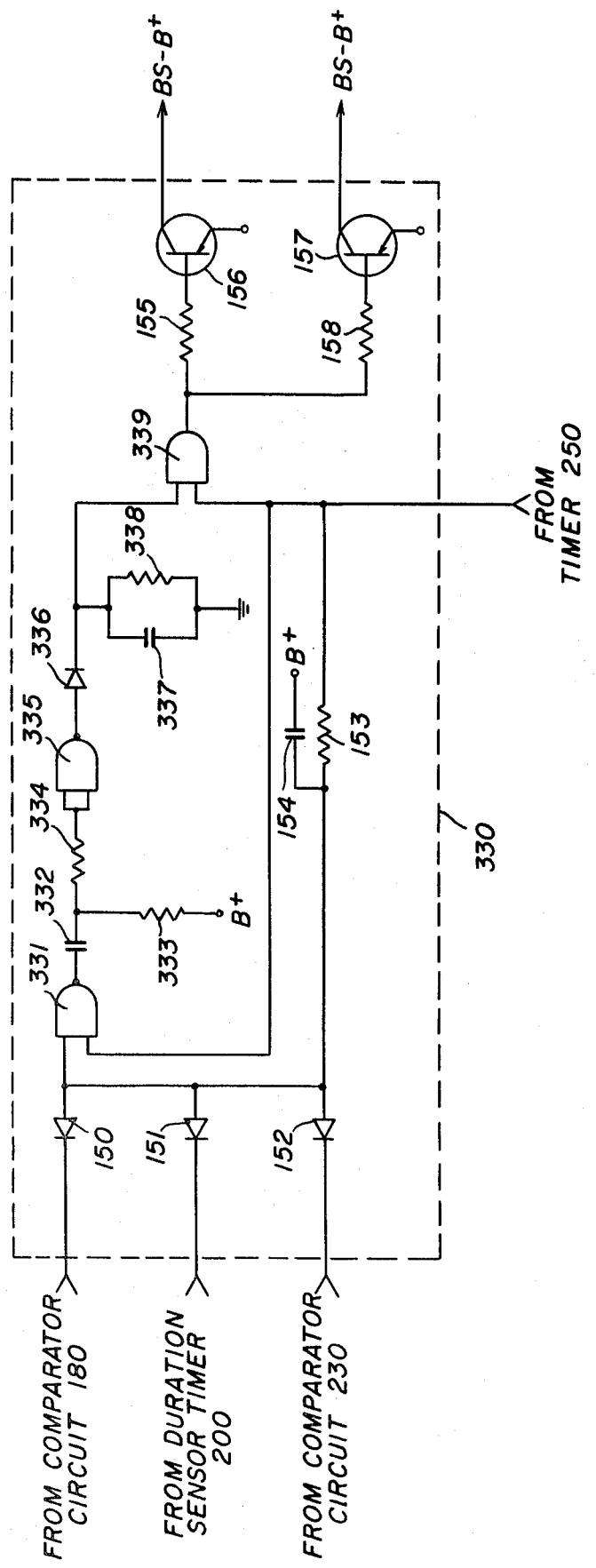
FIG. 8 is a schematic diagram of a variation of the battery-saver circuit, depicted in FIG. 6.

Turning now to FIG. 8, there is shown a modified battery saver circuit 330 which includes a monostable multivibrator defined by elements 331-338. The battery-saver circuit 330 includes a NAND gate 331 having one input coupled to the comparator circuit 180 through the diode 150, a second input coupled to the comparator circuit 230 through the diode 152. These comparator circuits are shown in detail in FIG. 6. A third input is coupled to the duration sensor/timer 200 through the diode 151 and a fourth input from the timer 250 through the resistor 153 and the capacitor 154. All functions are as described in connection with FIG. 6.

The output of the NAND gate 331 is coupled through a capacitor 332 and a resistor 333 to the B+ supply voltage. The junction of the capacitor 332 and the resistor 333 is coupled through a resistor 334 to an inverter 335, the output of which is coupled by way of a diode 336 to a timing circuit defined by a capacitor 337 and a resistor 338 coupled in parallel to ground. The output of the diode 336 is also coupled to one input of an AND gate 339, the other input of which is derived from the timer 250. The output of the AND gate 339 is coupled, as in the embodiment of FIGS. 5-7, through resistors 155 and 158 to PNP transistors 156 and 157.

The monostable multivibrator consisting of the elements 331-338 has one stable condition and one unstable condition and performs as described in reference to FIG. 4. The presence of any signal from the filter 160 which may be the result of the tone to which it is tuned, will cause the output of the comparator 181 to remain low. The output of the comparator 181 will remain low until it is determined that the first tone is absent. The multivibrator consisting of the elements 331-338 will remain in its stable condition for the duration of the comparator signal so that it continues to produce the supply voltage for the processor circuit 12.

The presence of any signal from the filter 210 during the enable pulse which may be the result of the tone to which it is tuned, will cause the output of the comparator 231 to remain low. The output of the comparator 231 will remain low as long as the second tone is or may be present but not more than only slightly longer than the enable pulse. The multivibrator consisting of the elements 331-338 will remain in its stable condition for the duration of the comparator signal so that it continues to produce the supply voltage for the processor circuit 12 (FIG. 1).

Once the pager has been turned on a signal from the timer 250 maintains the multivibrator in its stable condition for the entire duration thereof by maintaining the associated inputs to the NAND gate 331 and the AND gate 339 low.

Figure 9:
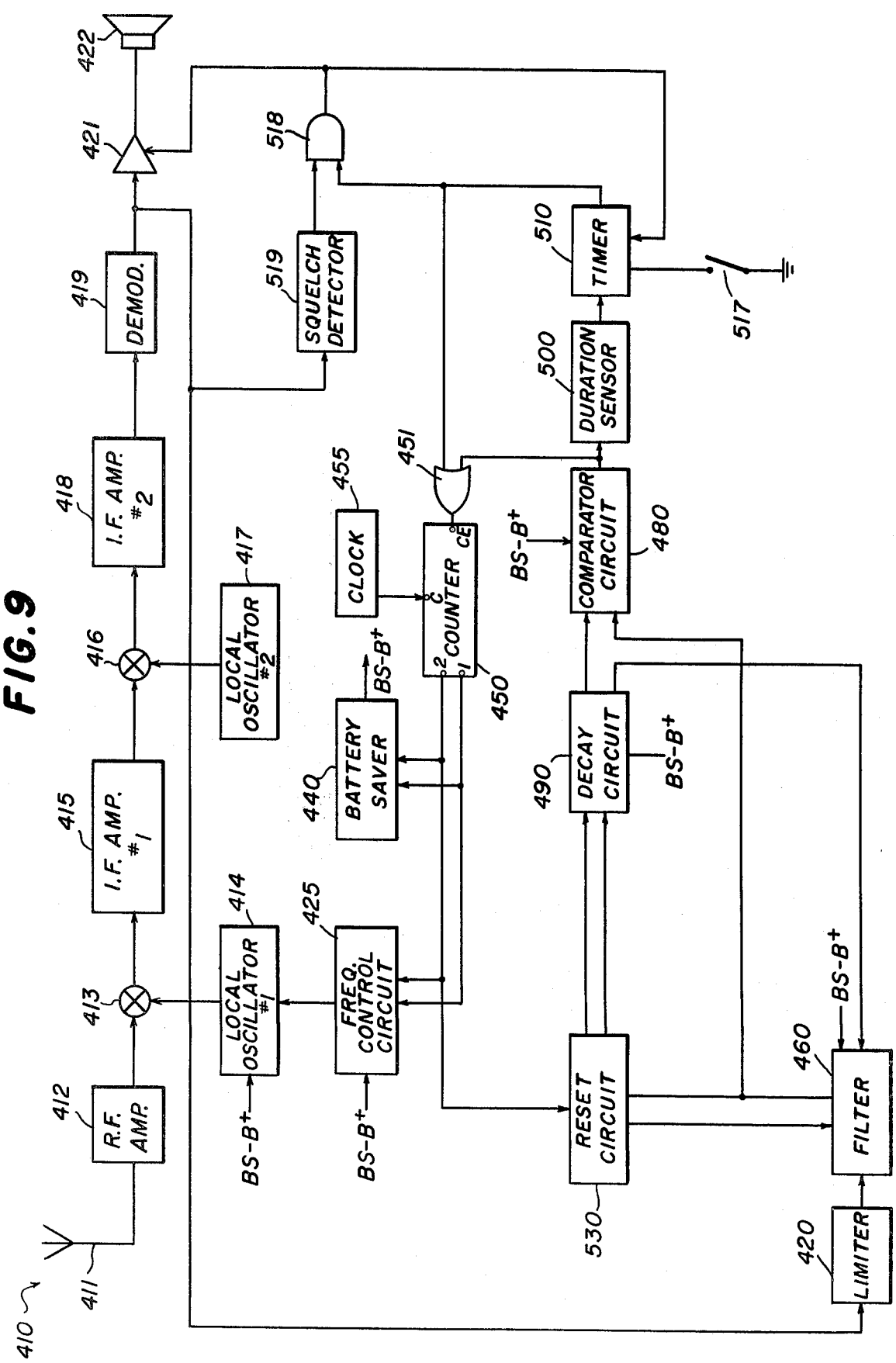
FIG. 9 is a block diagram of a single-tone, selective-call scanning receiver having a signal absence detector incorporating the features of the present invention.

Turning now to FIG. 9, a second use of the signal absence detector will be described. In this instance, it is used in a scanning receiver. FIG. 9 depicts a scanning receiver 410 which is of the superheterodyne type. RF signals are received by an antenna 411, amplified by an RF amplifier 412 and applied to a first mixer 413. Also applied to the mixer 413 is a signal produced by a first local oscillator 414. Mixer 413 operates in a known way to produce a high IF signal with a frequency equal to the difference between the frequencies of the RF signal and the local oscillator signal. (The sum-frequency signal is blocked out by subsequent stages.) The output of the mixer is applied to a first IF amplifier 415. The high IF signal is applied to a second mixer 416 which also receives a signal generated by a second local oscillator 417. The mixer 416 produces a low IF signal with a frequency equal to the difference between the frequencies of the high IF signal and the second local signal. The output of the mixer 416 is applied to a low IF amplifier 418 (which is tuned to block the sum-frequency signal).

A demodulator 419 separates the components which were modulated on the RF signal. In this particular embodiment, the modulation components consist of a code tone followed by a voice message. The code tone is applied to a limiter 420 which increases the amplitude of the tone to a fixed value. An audio circuit 421 is also coupled to the demodulator 419 and is in turn coupled to a loudspeaker 422. The audio circuit 421 is normally inoperative so that no sounds are emanated by the loudspeaker 422; in other words, the receiver 410 is normally squelched. As will be explained, the audio circuit 421 becomes operative in the presence of the proper tone, to amplify the rest of the tone and the ensuing audio signals from the demodulator 419.

The receiver 410 is of the scanning type, meaning that it is capable of receiving communications on more than one channel, in this case two channels A and B. The receiver 410 scans the two channels by changing the frequency of the local signal generated by the first local oscillator 14. To this end, there is provided a frequency control circuit 425 which has two frequency-determining elements individually connectable to the local oscillator 414. With one of the elements, the local oscillator 414 produces a local signal of a first frequency. When the other frequency-determining element is in circuit, a local signal of a second frequency is produced. The combination of the local oscillator 414 and the frequency control circuit 425 may be called a local-signal generating circuit. There is provided a battery saver 440 which provides a pulsed supply voltage shown as "BS-B+". The supply voltage is present for a short period of time, say 4 ms. and is absent for a long period, say 296 ms. During these "on" intervals, the receiver 410 is consuming power, while virtually no power is being drained from the battery between pulses. The RF amp 412 and the first and second IF amps 415 and 418, and other circuits are supplied with the BS-B+ supply voltage, although not so indicated in the drawings. During the proper code, the battery saver 440 is caused to produce a continuous supply voltage.

The frequency control circuit 425 and the battery saver 440 are supplied by a stepping circuit which consists of a counter 450, an OR gate 451 connected to the "CE" input thereof, and a clock 455 connected to its clock input "C". The counter 450 has a plurality of outputs, which become high in succession, only the "1" and "2" outputs being shown. Each output will be high for a duration equal to one cycle of the clock signal from the clock 455, unless it takes longer than one clock cycle to detect signal absence. When absence is detected, the counter 450 will step to the next pulse. If the counter has one hundred fifty outputs or stages, each output will be low for one hundred, forty-nine times the duration of one such cycle. When the "1" output returns to its normally low condition, the "2" output becomes high and stays high for a duration equal to the duration of one cycle of the clock signal. If, for example, the signal from the clock 455 has a period of 2 ms., the "1" output will be high for 2 ms. and will be low for 298 ms., assuming the counter 450 has one hundred fifty outputs. As the "1" output returns to its normally low condition, the "2" output becomes high and stays high for 2 ms. after which time it becomes low for the next 298 ms.

The battery saver 440 will produce a B+ supply voltage whenever the "1" output or the "2" output is high and will produce no supply voltage when those two outputs are low. In the foregoing example, each pulse of supply voltage will have a duration of 4 ms. and there will be 296 ms. between pulses.

The output of the OR gate 451 is normally low, thereby enabling the counter 450 to proceed through the counting process described above. When the output of the OR gate 451 becomes high in the manner to be described, counting will cease and whichever output is high at the time will remain high for as long as the CE input is high. Thus, if the CE input becomes high while the "1" output is high, then the local oscillator 414 will continue to produce a local signal at the first frequency, thereby enabling the receiver to continue to process the RF signal in the first channel then being received. Also, the supply voltage from the battery saver 440 will be continuous. When the CE output again becomes low, the counter 450 will revert to its scanning mode.

The outputs of the counter 450 are also coupled to the frequency control circuit 425. The "1" output couples the first frequency-determining element in circuit with the local oscillator 414 for 2 ms. The "2" output of the counter 450 couples the second frequency-determining element in the frequency control circuit 425 to the local oscillator 414. Accordingly, the local oscillator 414 will be producing a local signal at one frequency corresponding to channel A for a period of 2 ms. followed immediately by the second frequency corresponding to channel B for 2 ms. There follows a period of 296 ms. during which neither frequency-determining element is in circuit and no local signal is being generated.

If an RF signal in either channel is present, it will be processed during one or the other of the 2 ms. durations, and the limiter 420 will provide a square wave at the frequency of the tone, which is applied to a filter 460. The filter 460 is responsive to a train of tone pulses at a predetermined frequency to provide a sinusoidal filter signal. The filter 460 is supplied by the BS-B+ supply voltage, so that it uses negligible power during standby.

The receiver 410 further includes a comparator circuit 480 having a signal input coupled to the output of the filter 460 and a reference input coupled to a decay circuit 490. The decay circuit 490 is responsive to each of the BS-B+ pulses to produce a threshold voltage which decays from a first value to a second value. When the amplitude of the signal from the filter 460 is at least equal to the threshold voltage, the comparator circuit 480 produces a comparator signal. As soon as the amplitude of the signal from the filter 460 no longer crosses the threshold, the comparator signal ends. Thus, the comparator signal has a duration corresponding to the time the signal from the filter 460 is equal to or greater than the threshold voltage.

The bias voltages in the filter 460 are established such that the signal which passes therethrough will have an amplitude substantially equal to the initial value of the threshold from the decay circuit 490. However, the threshold immediately begins to decay so that signals from the filter 460 may or may not have an amplitude exceeding the threshold at a later time during each pulse. Accordingly, at the outset there will always be a comparator signal from the comparator circuit 480. Its duration, however, will depend primarily on the character of the signal being received. In the case of noise developed in the circuits 412-18 an initial signal will be applied to the signal input of the comparator circuit 480, having an amplitude equal to the threshold voltage. However, the noise components cause the filter output to have a relatively low amplitude so that the decaying threshold voltage will cause the comparator signal to terminate rather quickly, within a few milliseconds or so. Thus, in the case of noise, a comparator signal will be produced by the comparator circuit 480 but of relatively short duration.

A tone having a frequency adjacent to the center frequency of the filter 460 may be within the filter bandwidth so that it will produce an output which initially crosses the threshold voltage, thereby initially maintain the comparator signal. However, the amplitude of the filter output in response to the adjacent-channel tone eventually is insufficient to follow the decaying threshold voltage, and the comparator signal will thereby terminate. If the RF signal includes a tone to which the filter 460 is designed to respond, a relatively high amplitude signal will be applied to the signal input of the comparator circuit 480, which has an amplitude equal to or greater than the threshold voltage from the decay circuit 490, thereby continuing a comparator signal. Peaks of the signal from the filter 460, being of relatively high amplitude, continue to exceed the threshold voltage even though the threshold voltage is decaying. The comparator signal continues for a period of time substantially equal to the duration of that part of the tone that is actually detected.

The maximum and minimum values of the threshold voltage and the rate of decay thereof must be carefully selected. The shallower the threshold voltage curve, the more susceptible the receiver 410 would be to falsing in the presence of adjacent-channel tones and noise. Also, the slower the rate of decay of the threshold voltage curve, the greater the current the receiver will draw in response to extraneous signals. Thus, it is desirable to maximize the slope to minimize the time during which current is drawn from the battery. One limiting factor in this regard is the desired signal-to-noise response. If the slope is too great, then low level signals which are likely to be mixed with substantial noise will not be detected because their negative peaks will not continuously exceed the decaying threshold.

If the time between battery saver pulses is 296 ms., as in the above example, the duration of the comparator signal from the comparator circuit 480 would have a duration of up to 296 ms. shorter than the tone, depending upon the extent of coincidence between the start of the tone and the occurrence of a battery saver pulse. If they happened to be in coincidence, the comparator signal would have a duration substantially the same as the duration of the tone.

The comparator signal is applied to one input of the OR gate 451. The CE input of the counter 450 thus becomes high and the counter 450 ceases to count. Whichever output is high at that instant will stay high for the duration of the comparator signal plus the time to the next clock pulse. If the comparator signal has a duration less than 2 ms., it will have no effect on the counter 450. If the comparator signal is longer, then the signal from the local oscillator 414 will continue until the comparator signal terminates plus the time to the next clock pulse. This will probably be within a few milliseconds. On the other hand, if the comparator signal is long because of the character of the signal, for example, the RF signal includes a tone to which the receiver 410 is designed to respond, the output of the counter 450 corresponding to the channel then being received will remain high so that the entirety of the tone is demodulated.

The comparator signal is applied to a duration sensor 500. If the comparator signal has a duration greater than a predetermined value, an output signal will be produced and applied to a timer 510.

The timer 510 produces a timer signal commencing with the output signal from the duration sensor 500 and terminating a predetermined time later, such as ten seconds.

The output of the timer 510 is coupled to the second input of the OR gate 451 so that the CE input of the counter 450 is caused to remain high, in turn causing one of the two outputs of the counter, which is already high, to stay high. If an RF signal is present on the first channel, for example, then the "1" output will remain high for the period of the timer signal, causing the frequency-determining element in the frequency control circuit 425 to remain coupled in circuit with the local oscillator 414 for that period. Also, the "1" output being high, will cause the battery saver 440 to produce a continuous supply voltage for ten seconds.

The output of the timer 510 is also coupled to one input of an AND gate 518. The other input of the AND gate 518 is derived from a squelch detector 519 which is coupled from the demodulator 419. The squelch detector 519 produces an output whenever the carrier-wave frequency is in one of the two channels. If the receiver is unsquelched by a tone, the resultant timer signal will constitute one input to the AND gate 518. The carrier wave on which the tone and the ensuing voice message is modulated will cause the second input to be supplied to the AND gate 518. The AND gate 518 produces an output which is coupled to the audio circuit 421 to cause it to become operative to transmit the balance of the code tone to the loudspeaker 422, thereby creating an alerting tone informing the bearer of the receiver 410 of an audio message to follow. The ten-second period of time enables the audio message which follows the code tone to be processed, amplified and reproduced by the loudspeaker 422. When the audio message is completed, the carrier wave terminates causing the output of the squelch detector 519 to terminate. Without the second input to the AND gate 518, the audio circuit 421 becomes disabled and the receiver 410 again becomes squelched. If the carrier drops out but returns while the timer signal is present, the AND gate 518 produces an output to render the audio circuit 421 operative.

Once the timer signal starts, the output of the AND gate 518 is fed back to the timer 510 to continue the timer signal. Even if the message is longer than ten seconds, the audio circuit 421 will be maintained operative as long as the carrier wave is present. Loss of carrier for more than ten seconds causes the audio circuit 421 to become inoperative in response to further carrier detection until turned on again by the tone.

The timer 510 can be reset at any time by actuating a switch 517, which functions to terminate the timer signal and squelch the receiver.

The #2 output of the counter 450 is also coupled to a reset circuit 530 for resetting the filter 460 and the decay circuit 490 when the receiver 410 switches from channel A to channel B. The reset circuit 530 is responsive to the transition of the "2" output to high from its normally low condition to dissipate energy then in the filter 460 and energy in the decay circuit 490 so that both are prepared to analyze the tone modulated on an RF signal in channel B. If the filter 460 retained energy from its analysis of the tone on the RF signal in channel A, such energy may be added or subtracted from the tone modulated on the RF signal in channel B. The filter 460 may erroneously detect the absence of that tone. However, by dissipating all the energy in the filter 460 at the beginning of the scan of channel B, the filter 460 can reliably make its usual rapid detection of signal absence in channel B. The energy stored in the decay circuit 490 developed while scanning channel A can affect the ability to detect the signal while scanning channel B. Since the threshold is lower, detection of signal absence may occur in error. However, by dissipating the energy in the decay circuit 490 at the beginning of the scan of channel B, the threshold is returned to its starting condition. These principles are applicable to any number of channels. Each additional channel must have provision to be similarly reset. The reset circuit 530 will be operative to dissipate the energy in both the filter 460 and the decay circuit 490 at the beginning of the scan of each of any number of channels. Normally, there is no reason to reset after scanning the last channel (in this example, the second channel).

It is advantageous that the pulse from the battery-saver circuit 440 be as short as possible to improve battery life. The limiting factor in this embodiment is the time needed for the processor circuit, defined by the elements 411–419, to respond to an incoming signal and provide a processed signal consisting of the modulation components. That time should be between a few microseconds and several hundred microseconds.

Basically, the filter 460, the comparator circuit 480, the decay circuit 490 and the reset circuit 530 may be viewed as a signal absence detector which responds to any processed signal that has been driven to limiting by the limiter 420 to commence production of a comparator signal that extends the time the receiver 410 is tuned to the channel then being received, and extends the duration of the supply voltage from the battery-saver circuit 440. The processed signal may include noise and/or adjacent channel tones. Nevertheless, since, as far as the signal absence detector is concerned, the processed signal may include the desired tone, the receiver continues to be tuned to the channel then being received and the supply voltage is caused to be continuous to maintain the amps 412, 415, etc. operative in order to continue to process the incoming signal. If the proper tone is indeed present, the amplitude of the signal from the filter 460 will continue to equal or exceed the threshold from the decay circuit 490 and the supply voltage will remain continuous. On the other hand, if the tone is not present in a signal in that channel, the fact that it is absent will be determined when the level of the processed signal drops below the threshold, at which time the comparator signal terminates to cause the receiver to be tuned to the next channel. Because the absence detector causes the receiver to stay tuned to the channel then being received in the presence of almost any signal, the duration of the clock pulses which cause tuning to that channel may be extremely narrow.

Such reduction in the pulse width is achieved without an adverse effect on the sensitivity of the receiver 410. If the tone frequency perfectly matches the center frequency of the filter 460 and the incoming signal at the antenna 411 is strong, absence detection never takes place. The tone filter output will exceed the threshold by a wide margin. The comparator circuit 480 continues to hold the receiver tuned to the channel then being received. Similarly, if the frequency of the tone is slightly off the center frequency of the filter 460 or if the receiver is a long distance from the transmitter so that the processed signal applied to the detector is mixed with noise, i.e. the S/N ratio is poor, the receiver will still remain tuned to the same channel as long as the filter output (peaks) continue to equal or exceed the threshold. Switching to the next channel will occur if and when it is determined that the tone is absent in the carrier wave in that channel, as determined by the signal output peaks failing to cross the threshold.

Looked at in still another way, the filter 460, the comparator circuit 480, the decay circuit 490 and the duration sensor 500 may be considered to be a frequency sensor having a given bandwidth, which is an example of one type of signal absence detector that may be employed. All AC signals within that bandwidth may cause the frequency sensor to produce an output. At the start of each pulse, the bandwidth is relatively wide, so that not only will the correct code tone cause an output, but also noise and adjacent channels may cause the supply voltage to continue for at least a short time. However, the bandwidth of the frequency sensor narrows during the course of each such pulse so that only the proper code tone causes the audio circuit 421 to become operative. That, in combination with the resetting of the filter 460 and the decay circuit 490 at the beginning of the scan of channel B enables the receiver, so that at the outset all signals are perceived as possibly being the right signal. The channel will thus lock on until it can be determined that the searched-for tone is absent. As a result, the battery saver pulses can be quite narrow to minimize the power drain, yet maximize the number of channels that can be scanned during each battery saver pulse.

Figure 11:
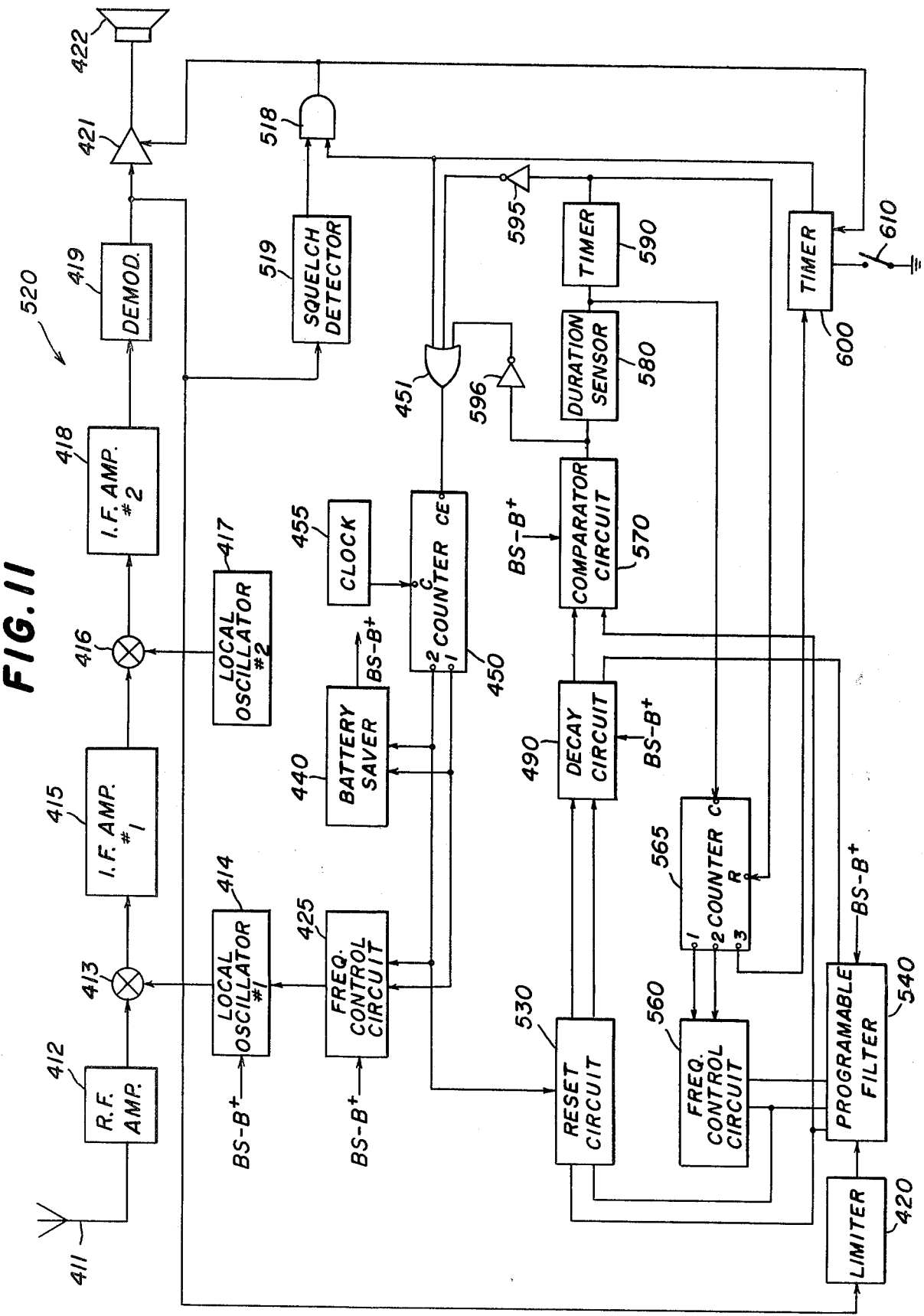
FIG. 11 is a block diagram of a sequential-tone, selective-call scanning receiver having a signal absence detector incorporating the features of the present invention.

In the embodiments of FIGS. 9 and 11, the receivers 410 and 520 are on for only a fraction of the time and during that time scanning two channels. Of course, any number of channels could be scanned using the same principles. Furthermore, the principles of the invention can be employed without utilization of the battery saver 440. In other words, the receiver would continually scan channels and when it has finished scanning all the channels in the system, it repeats scanning the channels again and again. The fact that the receiver employs a signal absence detector means that the time needed to scan each channel is much shorter than that which occurred in the past meaning that more channels can be scanned within a given period of time. This is true because it is possible to determine that the desired signal is absent and immediately move on, whereas searching for signal presence requires waiting for a fixed period each time determined by the maximum time required to detect the poorest usable signal. Moreover, although the embodiments of FIGS. 9 and 11 employ selective call features, that is, the absence detector looks for the absence of a certain code, the principles are applicable to a carrier-squelch receiver in which the receiver is unsquelched when the carrier is present (i.e. the noise from the demodulator 419 is less than a predetermined level.) An embodiment in which a signal absence detector is used in a carrier-squelch receiver is depicted in FIGS. 15 and 16.

Figure 10:
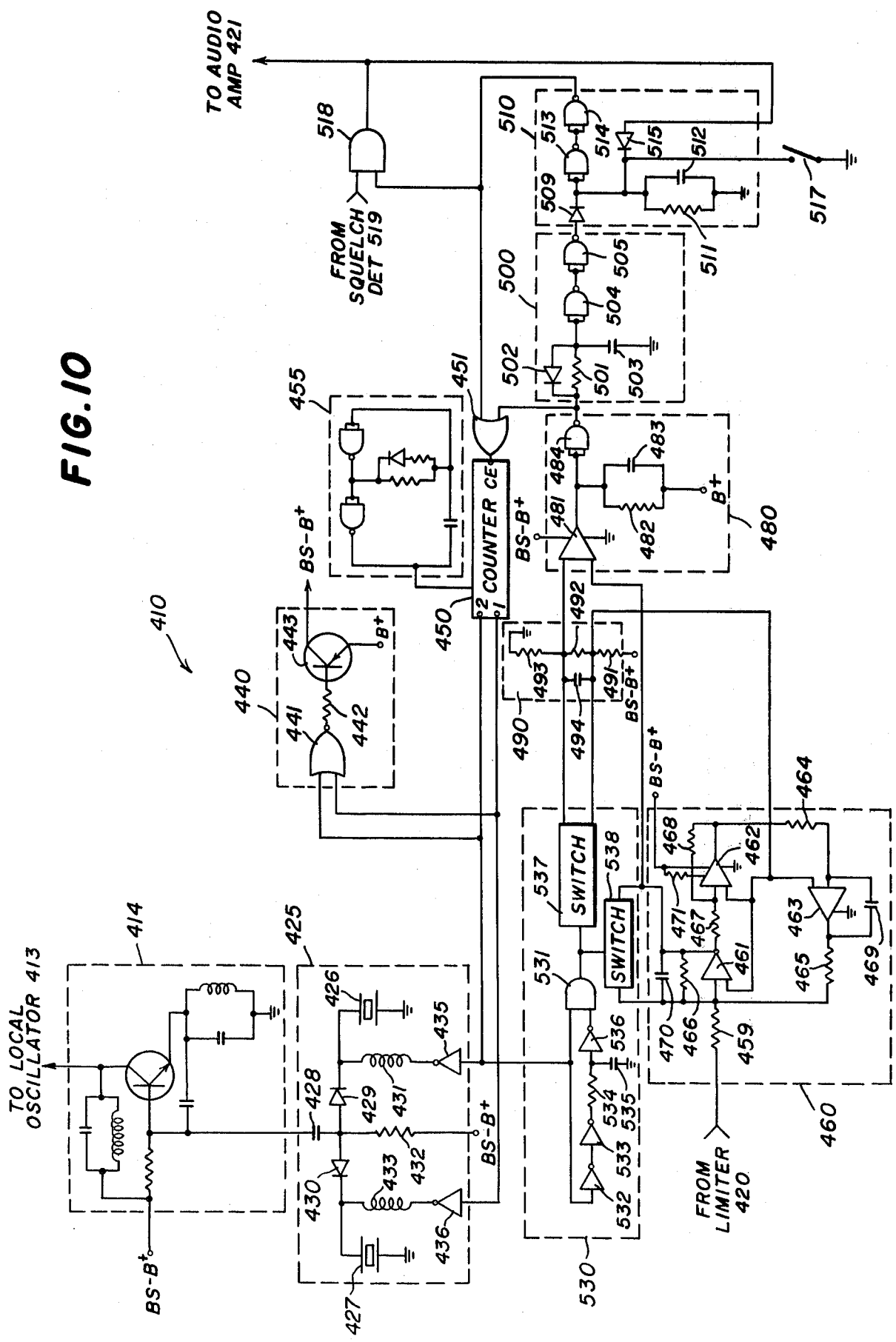
FIG. 10 is a schematic diagram of parts of the receiver of FIG. 9.

Turning now to FIG. 10, further details of the receiver 410 will be described. The frequency control circuit 425 includes a pair of frequency determining elements in the form of crystals 426 and 427. When the crystal 427 is connected in circuit with the local oscillator 414, the local signal has a frequency corresponding to the frequency of channel A, and when the other crystal 426 is connected in circuit, the frequency of the local signal corresponds to channel B. A coupling capacitor 428 couples the oscillator 414 to a resistor 432 connected to BS-B+ and the junction of a pair of isolating diodes 429 and 430 having their anodes connected together and their cathodes connected respectively to the crystals 426 and 427. The junction of the crystal 426 and the diode 429 is connected through an inductor 431 to the output of the inverter 435. Similarly, the junction of the crystal 427 and the diode 430 is connected through an inductor 433 to the output of an inverter 436. The input of the inverter 436 connects the "1" output of the counter 450 while an inverter 435 connects to the "2" output of the counter 450. When the "1" output becomes high, the output of the inverter 436 becomes low thereby enabling current to flow from the BS-B+ supply voltage through the resistor 432, the diode 430 and the inductor 433, thereby coupling the crystal 427 through the diode 430 and the capacitor 428 to cause the oscillator 414 to oscillate at that crystal frequency. At this time, the output of the other inverter 435 is high so that the diode 429 is reverse biased and the crystal 426 is disconnected. When the "2" output of the counter 450 becomes high, the reverse takes place and the oscillator 414 oscillates at the frequency of the crystal 426. When neither of the outputs of the counter 450 is high, both diodes 429 and 430 are reverse biased and the oscillator 414 produces no local signal.

The battery saver 440 includes a NOR gate 441 having its output coupled through a resistor 442 to a PNP transistor 443, the emitter of which is connected to the B+ supply voltage and the collector of which supplies the BS-B+ pulsating supply voltage. When either output of the counter 450 is high, the input to the transistor 443 is low, causing same to conduct and provide the supply voltage on the collector. When both outputs are low, the supply voltage does not appear on the collector of the transistor 443. In the foregoing example, the "1" output being high for 2 ms., followed by the "2" output being high for 2 ms., followed by a 296 ms. interval during which neither is high, the BS-B+ supply voltage will be present for 4 ms. out of every 300 ms.

The counter 450 may consist of any number of cascaded Johnson 4017 decade counters, for example. If fifteen such counters were employed, then the counter 450 would have one hundred fifty outputs as described and two of such outputs would be connected as shown.

As previously explained, the limiter 420 provides a square wave or train of tone pulses at the frequency of the code tone. The filter 460 responds to a train of tone pulses at a predetermined frequency. The filter 460 is of the active, band-pass type and includes an input resistor 459 of high value, three operational amplifiers ("op amps") 461, 462 and 463, resistors 464–68, and capacitors 469 and 470. By controlling the values of the resistors 464–68 and the capacitors 469 and 470, the center frequency and the Q of the active, band-pass filter 460 can be controlled. The filter 460 has a high Q and will permit passage of the processed signal from the limiter 420 when the signal contains frequency components within the filter bandwidth. The filters in the various receivers in the system may be tuned to different frequencies. In an actual embodiment of this invention the resistor 465 and the capacitors 469 and 470 are used as the elements to establish the center frequency of the filter 460, although other components could be used for that purpose.

The op amps 461, 462 and 463 are preferably on a single IC chip and each has a ground terminal for connection to ground, a supply terminal for connection to the supply voltage and a programming terminal for connection through a resistor 471 to the supply voltage. For simplicity, only the op amp 462 is shown with three terminals, but it is understood that all three have a set of three terminals which are respectively interconnected. The pulsating supply voltage BS-B+ causes the filter 460 to be operative only during the supply voltage pulses, to evaluate the frequency of the code tone from the limiter 420. Accordingly, the filter 460 is only drawing current from the receiver battery during a very small part of the time the processor is receiving.

Bias for the op amps 461, 462 and 463 is also in the form of a pulsating supply voltage. For this purpose, the decay circuit 490 includes a set of three resistors 491, 492 and 493 connected in series between the pulsating supply voltage and ground. A capacitor 494 is connected across the resistor 492. The junction of the resistors 491 and 492 is connected to the bias inputs of the op amps 461, 462 and 463. The values of the resistors 491, 492 and 493 are preferably such that the bias on these bias inputs is about one-half the B+ supply voltage, so that the sinusoidal wave produced by the filter 460 in response to the train of tone pulses from the limiter 420 will swing essentially between the B+ supply voltage and ground. Actually, the voltage at the junction of the resistors 491 and 492 varies somewhat, as will be explained.

The comparator circuit 480 includes a voltage comparator 481 having a signal input coupled to the output of the filter 460 and a reference input coupled to the junction of the resistors 492 and 493. The comparator 481 is supplied by the pulsating supply voltage. The comparator circuit 480 also includes a circuit defined by a resistor 482 and a capacitor 483 connected in parallel between the output of the comparator 481 and the B+ supply voltage, which circuit serves to smooth the signal produced by the comparator 481. When the amplitude of the sinusoidal wave from the filter 460 exceeds the threshold voltage applied to the reference input of the comparator 481, its output essentially becomes low and the capacitor 483 charges immediately. The signal on the signal input is an AC signal, so that the comparator 481 will alternately be turned on and off. The capacitor 483 will alternately charge rapidly, and discharge slowly through the resistor 482. A gate 484 functions as a switch to provide the comparator signal.

The threshold voltage varies. At the inception of a pulse, there is no voltage drop across the resistor 492 by virtue of the capacitor 494. Accordingly, the voltage at the junction of the resistors 492 and 493 is the B+ supply voltage multiplied by the fraction represented by the value of the resistor 493 divided by the sum of the resistors 491 and 493. The capacitor 494 charges during the pulse so that the voltage at the junction of the resistors 492 and 493 decays at a rate determined by the components in the decay circuit 490, ultimately reaching a value equal to the B+ supply voltage multiplied by the fraction represented by the value of the resistor 493 divided by the sum of the values of the resistors 491, 492 and 493. In an operative form of this invention, the resistor 491 had a value of 100K, the resistor 492 had a value of 18K and the resistor 493 had a value of 82K; whereby at the start of each battery saver pulse, the voltage at the junction of the resistors 492 and 493 was 0.45B+ (82/100+82). When the capacitor 494 is completely charged, the voltage at that point would be 0.41B+ (82/100+18+82). Because the voltages at the junction of the resistors 492 and 493 and at the junction of the resistors 491 and 492 are initially the same, the signal from the filter 460 would have the same amplitude as the threshold supplied to the reference input of the comparator 481, thereby causing a comparator signal to start. In the presence of the code tone having a frequency to which the filter is designed to respond, the amplitude of the signal out of the filter 460 will continue to exceed this threshold voltage even though it is falling. Actually, during each pulse, the signal at the signal input of the comparator 481 is fluctuating about a level that increases exponentially, because the filter bias voltage at the junction of the resistors 491 and 492 is increasing, to say B+/2 (the values of the resistors 492 and 493 times B+, divided by the sum of the values of the resistors 491, 492 and 493).

However, any signal from the limiter 420 will provide an input to the comparator 481 which initially will be equal to the threshold thereat so that a comparator signal commences. If the input is noise, however, the level of those signal components will become less than the threshold voltage which is decaying. When the amplitude of the signals from the filter 460 varies so that its peaks no longer cross the threshold voltage, the comparator signal terminates. Similarly, an adjacent-channel code tone may cause an output from the filter 460, but the comparator signal will be short-lived since the amplitude of signals from the filter 460 would very quickly fall below the threshold voltage.

The comparator signal is applied to one input of the OR gate 451. As previously explained, the comparator signal will cause whichever output of the counter 450 that is high at that instant of time to remain high for the balance of the comparator signal. That high output in turn causes the supply voltage to be continuous and maintains the receiver tuned to the channel on which the RF signal is being received.

It is to be noted that the bias voltages for the op amps in the filter circuit 460 are supplied by the decay circuit 490 so they increase during each battery saver pulse. As explained earlier this in effect only adds to the apparent variation of threshold. In other words, a fixed voltage of B+/2 would be satisfactory with a corresponding adjustment of the decay circuit output but to save parts, the varying B+/2 voltage from the decay circuit 490 is used.

The comparator signal is also applied to the duration sensor 500 which includes a timing circuit defined by a resistor 501 connected in parallel with a diode 502, and a capacitor 503 connected to ground. The duration sensor 500 further includes cascaded inverters 504 and 505.

The output of the inverter 505 is normally low. When the input to the inverter 504 reaches a predetermined switching value, say B+/2, the output of 504 becomes low and the output of 505 becomes high. Upon the commencement of a comparator signal, that is, when the output of the gate 484 becomes high, the capacitor 503 charges slowly through the resistor 501. The time constant represented by the values of the resistor 501 and capacitor 503 is such that the input to the inverter 504 will reach the switching value a predetermined time after the commencement of the comparator signal. Thus, an output signal would be created if the comparator signal has a duration at least equal to that time. If the comparator signal terminates before that time, that is, the output of the switch 484 becomes low, the input to the inverter 504 becomes low very quickly because the capacitor 503 discharges through the diode 502.

The timer 510 includes a diode 509 connected to a timing network having a resistor 511 and a capacitor 512 connected in parallel between ground and the input of an electronic switch in the form of cascaded inverters 513 and 514. The output of the inverter 514 becomes high when the signal on the input to the inverter 513 reaches a switching level of say, B+/2. Upon commencement of the output signal from the duration sensor 500, the capacitor 512 is substantially instantaneously charged to B+, thereby exceeding B+/2 and switching the inverter 514. When the output signal terminates, the capacitor 512 discharges through the resistor 511 at a very slow rate. Ultimately, the value on the signal input of the inverter 513 will fall below the switching voltage and the signal on the output of the inverter 514 again becomes low. The values of the resistor 511 and the capacitor 512 are selected such that the output of the inverter 514 remains high for an extended period of time, say ten seconds.

The timer signal on the output of the timer 510 is coupled to one input of the AND gate 518, the other input of which is derived from the squelch detector 519. As long as the timer signal is present and the carrier is present, there will be an output from the AND gate 518 to maintain the audio circuit 421 operative. However, if during the presence of the timer signal the carrier wave terminates, the receiver will become squelched and the capacitor 512 will start discharging through resistor 511. If the carrier wave returns while the timer signal is present or before the capacitor 512 is discharged past the switching threshold of the inverter 513, the receiver will again become unsquelched and the capacitor 512 will again be fully charged. If the communication lasts beyond ten seconds, the audio circuit 421 will remain operative because the output of the AND gate 518 is fed back by way of the diode 515 to the capacitor 512 to maintain the charge thereon. The capacitor 512 can be discharged at any time by actuating the switch 517 so as immediately to squelch the receiver 520.

The timer signal is also applied to the second input of the OR gate 451, which maintains high the output of the counter 450 corresponding to the channel being received and at the same time maintains the supply voltage continuous, both for the duration of the timer signal.

The reset circuit 530 resets the filter 460 and the decay circuit 490 as the receiver changes from channel A to channel B. The "2" output of the counter 450 is connected directly to one input of an AND gate 531 and is connected through a pair of inverters 532 and 533, a delay circuit consisting of a resistor 534 and a capacitor 535, and an inverter 536 to the second input of the AND gate 531. These elements respond to the transition of the "2" output of the counter 450 from low to high to produce a spike which briefly closes a pair of electronic switches 537 and 538. The electronic switch 537 is coupled across the capacitor 494 in the decay circuit 490, and the switch 538 is coupled across the capacitor 470 in the filter 460. Closure of the switches 537 and 538 discharges the capacitors 470 and 494. Then, the decay circuit 490 can start a new decaying threshold when the second channel is being scanned. Likewise discharge of the capacitor 470 places the filter 460 in position to analyze any tone modulated on an RF carrier in channel B.

Turning now to FIG. 11, a further embodiment of the present invention will be described, being a receiver 520 adapted to respond to a code consisting of two tones of predetermined frequency and order. The receiver 520 has many of the same elements as does the receiver 410, which elements are labelled with the same reference numerals. Description and operation of these elements may be had by referring to the explanation of FIG. 9. In this embodiment, the limiter 420 will provide a sequence of two square wave signals respectively at the frequencies of the two tones. A programmable filter 540 is initially tuned to respond to the first tone in the sequence and then is retuned so as to be responsive to the second tone. To this end, the receiver 520 has a frequency control circuit 560 containing two frequency-determining elements individually connectable to the programmable filter 540. With one of the elements in circuit, the filter 540 is tuned to the first tone and when the other frequency-determining element is in circuit, the filter 540 is tuned to the second tone. The frequency control circuit 560 is operated by a counter 565. The "1" output is normally high. Successive clock signals on the "C" input will step the counter 565 so that its "2" and "3" outputs will successively become high. The rest of the outputs are not used. With the "1" output high, the first frequency-determining element in the frequency control circuit 560 is connected in the circuit with the programmable filter 540, and with the "2" output high, the second frequency-determining element is so connected.

The receiver 520 further includes a comparator circuit 570 having its signal input coupled to the output of the filter 540 and a reference input coupled to the decay circuit 490. When the amplitude of the signal from the filter 540 is at least equal to the threshold voltage, the comparator circuit 570 produces a comparator signal. If the signal amplitude from the filter 540 no longer crosses the threshold, the comparator signal ends. Thus, the comparator signal has a duration corresponding to the time the signal from the filter 540 has an amplitude equal to or greater than the threshold voltage.

The bias voltages in the filter 540 are established such that the signal which passes therethrough will have an amplitude equal to the initial value of the threshold voltage from the decay circuit 490. However, the threshold immediately begins to decay so that signals from the filter 540 may or may not have an amplitude exceeding the threshold at a later time during each pulse.

Accordingly, any signal will necessarily have an initial amplitude sufficient to be equal to the threshold and cause the inception of a comparator signal from the comparator circuit 570. In the case of an adjacent-channel tone or noise developed in the circuits 412-18, a signal will be applied to the signal input of the comparator circuit 570, having an amplitude equal to the threshold voltage. However, such extraneous signals cause the filter output to have a relatively low amplitude so that the decaying threshold voltage will cause the comparator signal to terminate rather quickly, within a few milliseconds or so indicating absence of the searched-for signal. Thus, in the case of such extraneous signals, the comparator signal produced by the comparator circuit 570 will be of relatively short duration.

If the RF signal includes the first tone to which the filter 540 is designed to respond, a signal will be applied to the signal input of the comparator circuit 570, which has an amplitude initially equal to the threshold voltage from the decay circuit 490, thereby commencing the comparator signal. The signal from the filter 540, being of high amplitude, continues to exceed the reference voltage even though it is decaying. The comparator signal continues for a period of time substantially slightly more than the duration of the first tone actually received.

If the first tone has a duration of say 500 ms. and the time between battery saver pulses is 296 ms., the comparator signal will have a long duration between 204 ms. and 500 ms. in the presence of the first code tone to which the filter 540 is designed to respond, and a duration of just a few milliseconds if the receiver 520 is receiving an adjacent-channel code tone or receiving noise.

The comparator circuit 570 is coupled to the inverter 596. When the comparator signal is present, the output of the inverter 596 is high. Such high output is coupled through the OR gate 451 to the "CE" input of the counter 450, whereupon the counter ceases to count and whichever output thereof is high at that instant will remain high. If the comparator signal is too short to activate the duration sensor 580, the output of the OR gate 451 will become low when the comparator signal ends, and the counter 450 will switch to its next output upon the next positive going pulse from the clock 455.

A duration sensor 580 coupled to the output of the comparator circuit 570 produces an output signal if the comparator signal duration exceeds some predetermined value such as 50 ms. The output signal of the duration sensor 580 terminates upon termination of the comparator signal. Such output signal is coupled to the "C" input of the counter 565. The "2" output of the counter 565 becomes high upon termination of the output signal, thereby connecting the second frequency-determining element in the frequency control circuit 560 in circuit with the programmable filter 540, tuning it to be responsive to the second tone. If the second tone is not present during a second tone enable window generated by timer 590, the counter 565 is reset so that the receiver 520 is prepared to evaluate a subsequent code. However, if the second tone is present, a sinusoidal signal at the frequency of that tone will appear at the output of the filter 540. The comparator circuit 570 receives such sinusoidal signal and produces a comparator signal which continues for a period of time substantially equal to the duration of the second tone.

The duration sensor 580 is coupled to a timer 590, the output of which is normally high. The timer 590 produces a timer signal in response to the output signal of duration sensor 580 which is coupled to the "R" input of the counter 565, thereby enabling it to respond to signals applied to its clock input. The timer signal persists for a short period of time after termination of the output signal of duration sensor 580. This time period is the second tone enable window. Also, the timer signal is inverted by an inverter 595 and applied through the OR gate 451 to the "CE" input of the counter 450. In the presence of such timer signal, the counter 450 ceases to count and whichever output thereof is high at that instant will remain high for the duration of the timer signal. Also, the supply voltage remains continuous.

The comparator signal is again applied to the duration sensor 580 upon reception of a second tone. If the comparator signal has a duration greater than the predetermined value of, for example, 50 ms., signifying a second code tone of that duration, an output signal will be produced at termination, which causes the counter 565 to step once again. As a result, the "3" output becomes high. The "3" output is coupled to a timer 600 which produces a timer signal commencing with the termination of the output signal from the duration sensor 580 and terminating a predetermined time later, such as ten seconds.

The output of the timer 600 is coupled to the third input of the OR gate 451 so that the "CE" input of the counter 450 is caused to remain high, in turn causing the output thereof, which is then high, to stay high for ten seconds. Also, the battery saver 440 produces a continuous supply voltage for ten seconds.

The output of the timer 600 is also coupled to one input of the AND gate 518. The other input of the AND gate 518 is derived from the squelch detector 519. If the receiver is unsquelched by a code, the resultant timer signal will constitute one input to the AND gate 518. The carrier wave on which the code and the ensuing voice message is modulated will cause the second input to be supplied to the AND gate 518. The AND gate 518 produces an output which is coupled to the audio circuit 421 to cause it to become operative to transmit the balance of the second tone to the loudspeaker 422, thereby creating an alerting tone informing the bearer of the receiver 520 of an audio message to follow. The ten-second timer permits the squelch detector 519 to control the receiver until there is continuous loss of carrier for more than ten seconds. It then enables the audio message which follows the code tone to be processed, amplified and reproduced by the loudspeaker 422. When the audio message is completed, the carrier wave terminates causing the output of the squelch detector 519 to terminate. Without the second input to the AND gate 518, the audio circuit 421 becomes disabled and the receiver 410 again becomes squelched. If the carrier drops out but returns while the timer signal is present, the AND gate 518 produces an output to render the audio circuit 421 operative.

Once the timer signal starts, the output of the AND gate 518 is fed back to the timer 600 to continue the timer signal. Even if the message is longer than ten seconds, the audio circuit 421 will be maintained operative as long as the carrier wave is present. Ten seconds after the carrier wave ends, the timer signal ends and the audio circuit and the receiver 520 will once again not respond to the carrier wave.

The timer 600 can be reset at any time by actuating a switch 610, which functions to terminate the timer signal and maintain the receiver squelched.

The "2" output of the counter 450 is also coupled to the reset circuit 530 for resetting the filter 540 and the decay circuit 490 when the receiver 410 switches from channel A to channel B. The reset circuit 530 is responsive to the transition of the "2" output from low to high to dissipate energy then in the filter 540 and energy in the decay circuit 490 so that both are prepared to analyze the tones modulated on an RF signal in channel B.

In the foregoing example, the receiver 520 is responsive to a sequence of two tones, although the principles are applicable to receivers responsive to a code having any number of tones in sequence. Further, any number of channels may be scanned for the tone code.

Figure 12:
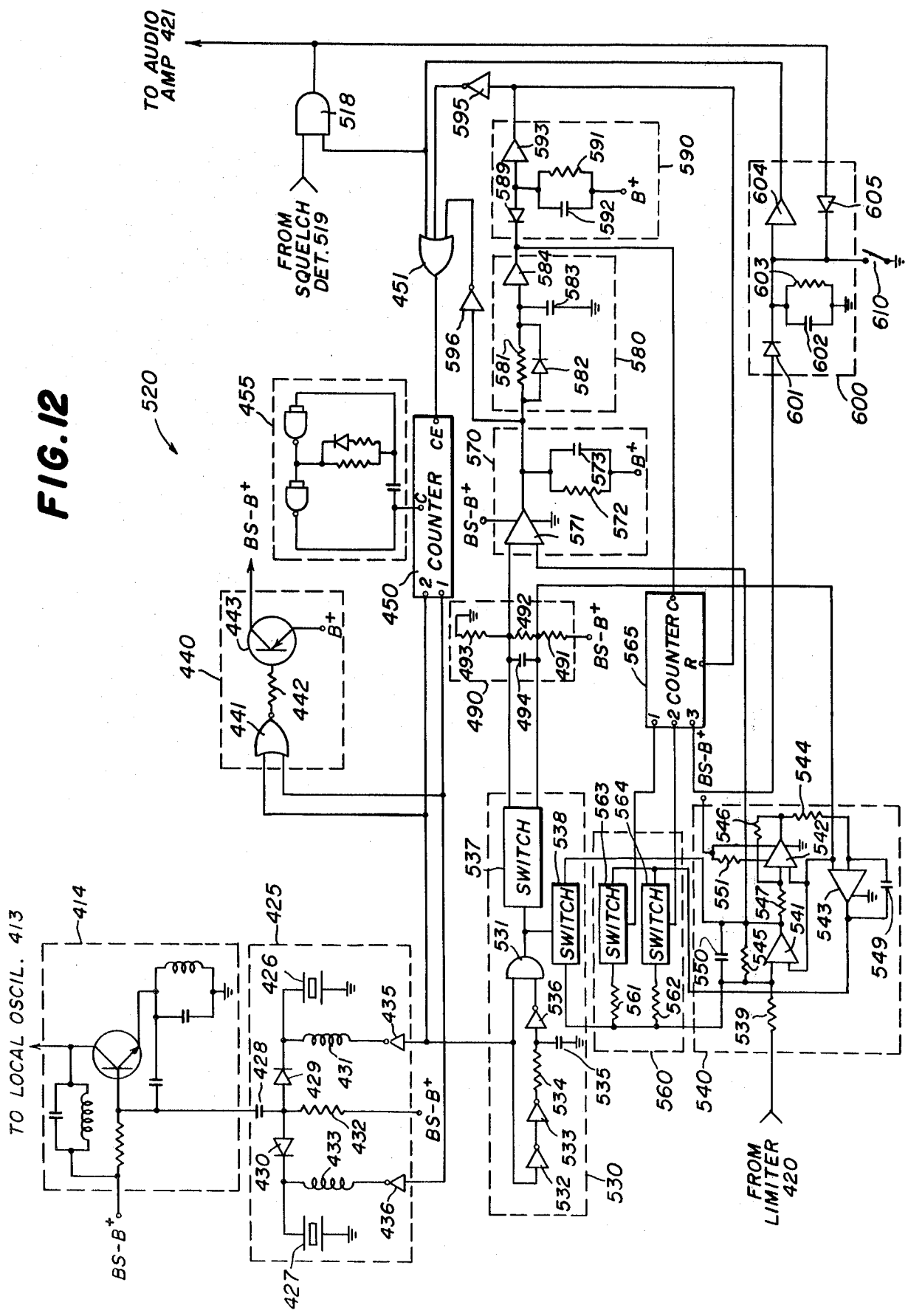
FIG. 12 is a schematic diagram of parts of the receiver of FIG. 11.

Details of certain of the elements of the receiver 520 are shown in greater detail in FIG. 12. Many of the elements are labelled the same as FIG. 10 and operate as described in FIG. 10. The filter 540 includes an input resistor 539, three op amps 541, 542 and 543, resistors 544–547 and capacitors 549 and 550. As will be explained, the amount of resistance from the output of the op amp 543 to the input of the op amp 541 establishes the center of frequency of the filter 540. Except for the use of an external resistor to provide such resistance, the filter 540 is precisely the same in construction and operation as the filter 460. Bias for the op amps 541, 542 and 543 is in the form of a pulsating supply voltage from the decay circuit 490. As in the first embodiment, the values of the resistors 491, 492 and 493 in such decay circuit are preferably such that the sinusoidal wave produced by the filter 540 in response to a train of pulses, will swing essentially between the B+ supply voltage and ground.

The frequency-control circuit 560 includes resistors 561 and 562 respectively coupled in series with electronic switches 563 and 564. The control terminal of the switch 563 is coupled to the "1" output of the counter 565, while the control input of the switch 564 is coupled to the "2" output of the counter 565. Normally the "1" output is high so that the switch 563 is closed thereby connecting the resistor 561 in circuit with the filter 540 and causing it to have a center frequency corresponding to the first tone to which the receiver 520 is designed to respond. When the "2" output of the counter 565 becomes high, the switch 563 opens and the switch 564 closes thereby causing the resistor 562 to be placed in circuit with the filter 540 and its resonant frequency to correspond to the second tone to which the receiver 520 is designed to respond.

The comparator circuit 570 includes a voltage comparator 571 having a signal input coupled to the output of the filter 540 and a reference input coupled to the junction of the resistors 492 and 493. The comparator circuit 570 also includes a smoothing circuit defined by a resistor 572 and a capacitor 573 connected in parallel between the output of the comparator 571 and the B+ supply voltage. The comparator circuit 570 is basically the same as the comparator circuit 480 in the receiver 410, being operative to produce a comparator signal for a duration corresponding to the length of the tones that are detected.

The comparator signal as previously explained is applied to the inverter 596 to prevent the counter 450 from clocking and is also applied to the duration sensor 580 which includes a timing circuit defined by a resistor 581 connected in parallel with a diode 582 and a capacitor 583 connected to ground. The duration sensor 580 further includes a buffer amp 584. Because the output of the comparator circuit 570 is normally high, the capacitor 583 is normally charged. Upon the commencement of the comparator signal, that is, when the output of the comparator 571 becomes low, the capacitor 583 discharges slowly through the resistor 581. The time constant represented by the values of the resistor 581 and the capacitor 583 is such that the input to the amp 584 will reach the switching value thereof a predetermined time after commencement of the comparator signal. Thus, an output signal will be created if the comparator signal has a duration at least equal to that time. The termination of this output signal steps the counter to the "2" output. The same process occurs in the presence of the second tone which will cause the "3" output of the counter 565 to become high. Thus, loss of the first tone causes it to render the "2" output high, and loss of the second tone to step the counter 565 once again to cause its "3" output to become high.

The timer 590 includes a diode 589 connected to a timing network having a resistor 591 and a capacitor 592 connected in parallel between the B+ supply voltage and the input of a buffer amp 593. Upon commencement of the duration sensor signal from the duration sensor 580, the capacitor 592 substantially instantaneously is charged through the diode 589 such that the input to the buffer amp 593 is at ground thereby causing the output of the timer 590 to become low to commence a timer signal. When the duration sensor signal terminates, the capacitor 592 discharges through the resistor 591. When the voltage on the input to the buffer amp 593 exceeds its switching voltage, the output thereof becomes high thereby terminating the timer signal. The values of the resistor 591 and capacitor 592 are selected such that the timer signal persists for a short period of time such as 100 ms. This is the time period of the second tone enable window. The timer signal is applied to the "R" input of the counter 565 enabling it to respond to signals applied to its clock input. The timer signal is inverted by the inverter 595 and is applied to the "CE" input of the counter 450 through the OR gate 451 to prevent it from counting.

The "3" output of the counter 565 is coupled to the timer 600 which includes a diode 601 coupled to a timing circuit consisting of a capacitor 602 coupled in parallel with a resistor 603. When the "3" output becomes high in response to the termination of the second tone, the capacitor 602 is charged rapidly through the diode 601. When the "3" output of the counter 565 reverts to its normally low condition some time after the second tone ends, the capacitor 602 discharges slowly through the resistor 603. Ultimately, the value on the signal input of the buffer amp 604 falls below the switching voltage thereof, and the output again becomes low. The values of the capacitor 602 and the resistor 603 are selected such that the output of the buffer amp 604 remains high for an extended period of time, say ten seconds. The timer signal is coupled to one input of the AND gate 518, the other input of which is derived from the squelch detector 519. As long as the timer signal is present and the carrier is present, there will be an output from the AND gate 518 to maintain the audio circuit 421 operative. The output of the AND gate 518 is coupled back to the timer circuit by way of a diode 605 which maintains the capacitor 602 charged. The capacitor 602 can be discharged at any time by actuating the switch 610 so as immediately to squelch the receiver 520.

Figure 13:
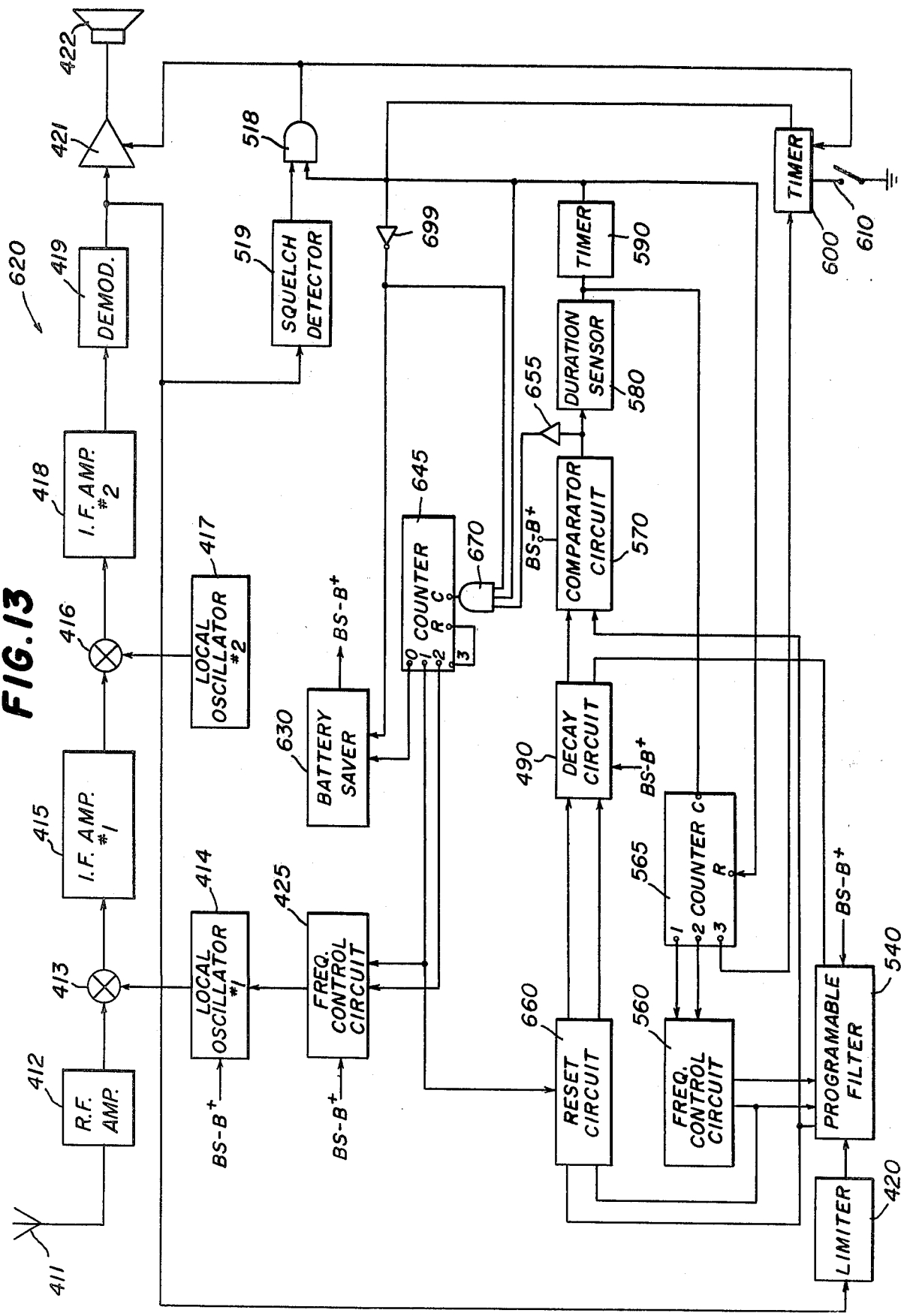
FIG. 13 is a block diagram of another embodiment of a subsequential tone, selective-call scanning receiver having a signal absence detector incorporating the features of the present invention.

Turning now to FIG. 13, there is shown a scanning receiver 620 incorporating another embodiment of the present invention. The receiver 620 has many of the same elements as the receiver 520, which elements are labelled with the same reference numerals. In this embodiment, too, the receiver 620 is of the scanning type capable of receiving communications on channels A and B. The receiver 620 scans the two channels by changing the frequency of the local signal generated by the first local oscillator 414. To this end, there is provided a frequency control circuit 425 which has two frequency-determining elements individually connectable to the local oscillator 414. With one of the elements, the local oscillator 414 produces a local signal of a frequency corresponding to channel A. When the other frequency-determining element is in circuit, there is produced a local signal of a frequency corresponding to channel B.

The receiver 620 further comprises a battery saver 630 which provides a pulsed supply voltage BS-B+. The supply voltage is present for a short period of time, say a few ms., and is absent for a longer period, say 300 ms. When the proper code is received, or when it is possible that the proper code is being received, the battery saver 630 produces a continuous supply voltage.

Figure 14:
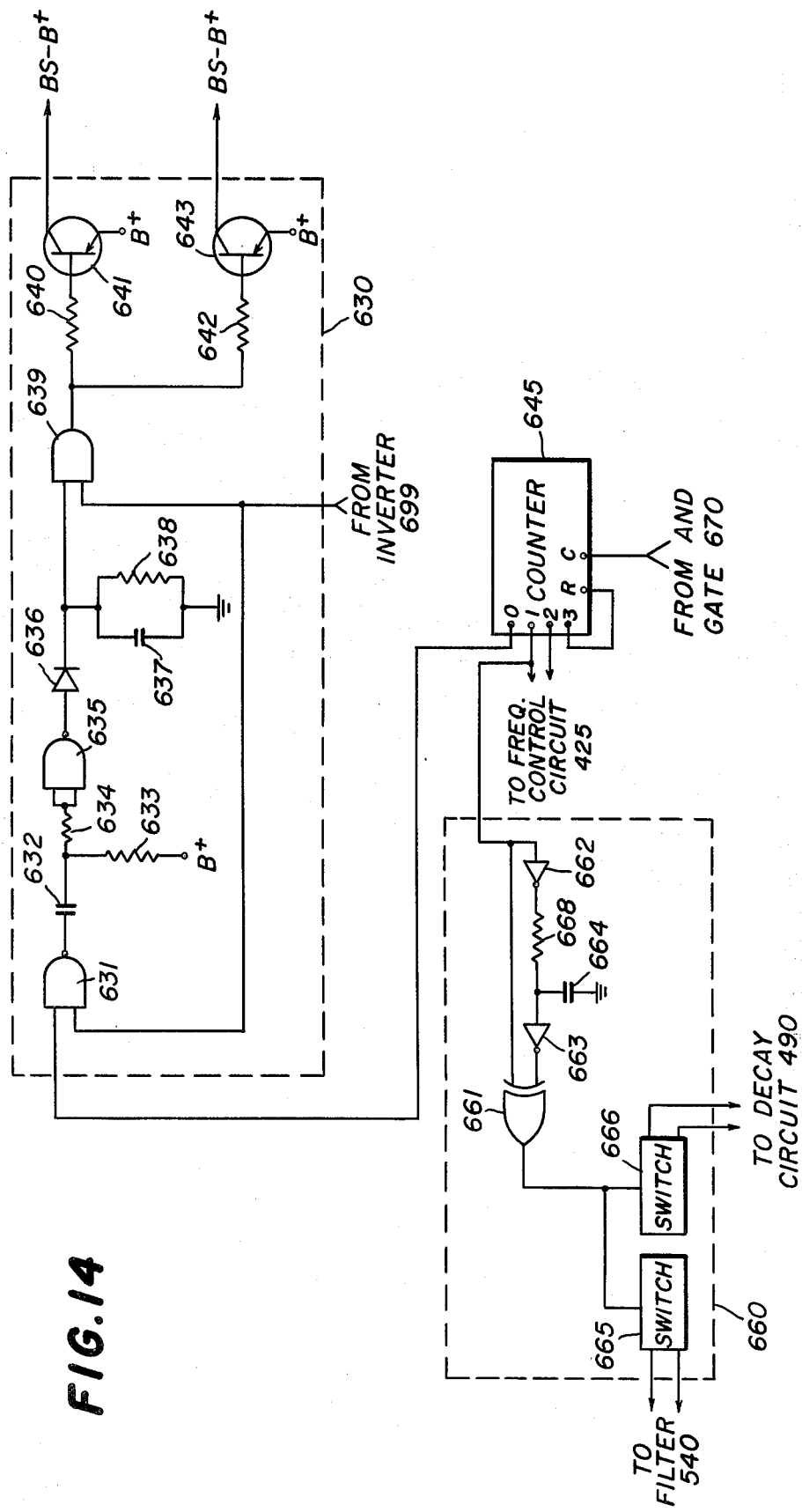
FIG. 14 is a schematic diagram of parts of the receiver of FIG. 13.

The frequency control circuit 425 and the battery saver 630 are supplied by a stepping circuit which is a counter 645, the "3" output of which is connected to the reset ("R") input (FIG. 14). As a result, the "0", "1" and "2" outputs become high in succession as positive transitions are applied to the clock ("C") input.

After the two channels have been scanned, the "0" output of the counter 645 becomes high, which transition is sensed by the battery saver 630 to cause the supply voltage to be interrupted for the 300 ms. period. At the end of that time, the battery saver 630 produces a supply voltage which renders operative the processor circuit (the elements 412-419). In the manner to be described, a positive transition occurs on the "C" input of the counter 645 causing the "1" output thereof to become high, thereby placing the first frequency-determining element in the frequency control circuit 425 in circuit with the local oscillator 414 for whatever duration the "1" output is high. The next transition at the "C" input causes the "2" output to become high, thereby placing the second frequency determining element in the control circuit 425 in circuit with the local oscillator 414. The receiver 620 remains tuned to channel B until the next transition at the "C" input.

In this embodiment, the receiver 620 is tuned to channel A as long as there is or may be a communication to which the receiver is designed to respond on that channel. When it is determined that there is no such communication, the receiver 620 is immediately automatically tuned to channel B and remains there as long as there is, or may be on that channel, a communication to which the receiver is designed to respond.

The supply voltage becomes continuous, as will be explained in further detail, as long as there is or may be a communication on either channel A or channel B to which the receiver 620 is designed to respond. After channel B has been scanned, there follows the 300 ms. period of time as established in the battery saver 360, during which neither frequency-determining element is in the circuit and no local signal is being generated.

An RF signal present in either channel will be processed, and the limiter 420 will provide a square wave consisting of two portions respectively at the frequencies of the two tones. The programmable filter 540 is initially tuned to respond to the first tone in the sequence and then is retuned so as to be responsive to the second tone. As in the previous embodiment, the frequency control circuit 560 contains two frequency-determining elements which are sequentially connected in circuit with the programmable filter 540 by action of the counter 565.

The receiver 620 further comprises a comparator circuit 570 having its signal input coupled to the output of the filter 540 and a reference input coupled to the decay circuit 490. When the amplitude of the signal from the filter 540 is at least equal to the threshold voltage, the comparator circuit 650 produces a comparator signal. If the signal from the filter 540 drops below the threshold, the comparator signal ends. Thus, the comparator signal has a duration corresponding to the time the signal from the filter 540 has an amplitude equal to or greater than the threshold.

As in the embodiments of FIGS. 11 and 12, any signals will necessarily have an initial amplitude sufficient to be equal to the threshold and cause the inception of a comparator signal from the comparator circuit 570. Noise or an adjacent channel tone will result in a signal applied to the input of the comparator circuit 570, having an amplitude initially equal to the threshold voltage. As previously explained, absence of the searched for signal will be determined with the result that the comparator signal will be of relatively short duration.

Upon inception of the battery saver "on" pulse, the signal from the comparator circuit 570 commences but rapidly ends because at that instant of time the "0" output of the counter 645 is high, and therefore the receiver 620 is tuned to neither channel A nor channel B. Termination of the comparator signal ends causing the buffer amp 655 to become high, thereby clocking the counter 645 to the "1" output, and, through reset circuit 660, starts the comparator signal again.

If the RF signal includes the first tone to which the filter 540 is designed to respond, a signal will be applied to the signal input of the comparator circuit 570, which has an amplitude initially equal to the threshold voltage from the decay circuit 490, thereby commencing the comparator signal. The comparator signal continues for a period of time substantially equal to that part of the first tone that is actually received.

If the first tone has a duration of say 500 ms. and the time between battery saver pulses is 300 ms., the comparator signal will have a long duration between 200 ms. and 500 ms. in the presence of the first code tone and a duration of just a few milliseconds in the presence of an extraneous signal.

The duration sensor 580 produces an output signal if a comparator signal which exceeds the delay period of duration sensor 580 exceeds some predetermined value such as 50 ms. The timer 590 produces a timer signal in response to the duration-sensor-output signal, which timer signal is coupled to the "R" input of the counter 565, thereby enabling it to respond to signals applied to its clock input. The timer signal persists for a short period of time after termination of the comparator signal. The duration-sensor-output signal is also coupled to the "C" input of the counter 565, causing the "2" output of the counter 565 to become high upon termination of the output signal, thereby connecting the second frequency-determining element in the frequency control circuit 560 in circuit with the programmable filter 540, tuning it to be responsive to the second tone. If the second tone is not present during the time the filter 540 is tuned to the second tone, the counter 565 is reset so that the receiver 620 is prepared to evaluate a subsequent code. However, if the second tone is present, a sinusoidal signal at the frequency of that tone will appear at the output of the filter 540. The comparator circuit 570 receives such sinusoidal signal and produces a comparator signal which continues for a period of time substantially equal to the duration of the second tone.

If the comparator signal has a duration greater than the predetermined value of, for example, 50 ms., signifying a second code tone of that duration, an output signal from duration sensor 580 will again be produced, the termination of which causes the counter 565 to step once more. As a result, the "3" output becomes high causing the timer 600 to produce a timer signal commencing with the termination of the output signal from the duration sensor 580 and terminating a predetermined time later, such as ten seconds.

If the receiver is unsquelched by a code, the resultant timer signal from the timer 600 will constitute one input to the AND gate 518. The carrier wave on which the code and the ensuing voice message is modulated will cause the second input to be supplied to the AND gate 518 from the squelch detector 519. The AND gate 518 produces an output which is coupled to the audio circuit 421 to cause it to become operative. The operation is the same as explained with respect to FIGS. 11 and 12.

An output of the counter 645 is also coupled to a reset circuit 660 for resetting the filter 540 and the decay circuit 490, when the receiver 620 switches from channel A to channel B. The reset circuit 660 is responsive to the transition of the "1" output from high to low (plus a slight delay) to dissipate energy then in the filter 540 and in the decay circuit 490, so that they are prepared to analyze the tones modulated on an RF signal in channel B.

As in the case with the embodiment of FIG. 9, such dissipation prepares the filter 540 and the decay circuit 490 for analyzing the first tone in channel B. If the filter 540 retained energy from its analysis of the prior modulation on the RF signal of channel A, such energy may be added or subtracted from the tone modulated on the RF signal of channel B. As a result, the filter 540 may detect the searched-for signal absence when it is really present. Dissipating all the energy in the filter 540 stored during the scan of channel A, and returning the decay circuit to its starting condition, assures instantaneous start of the comparator signal for reliable high speed absence detection.

The output of the comparator circuit 570 is coupled through a buffer 655 to one input of an AND gate 670. A second input to the AND gate 670 is derived from the timer 590 and a third input is derived from the timer 600 through an inverter 699. The comparator signal commences at the outset and continues as long as the first tone is or may be present. Thus one of the inputs to the AND gate 670 becomes low, as does the clock input to the counter 645. Whatever output thereof is high at that time remains high and the receiver 620 remains tuned to the channel to which it is then tuned. When it is determined that the signal applied to the receiver 620 does not contain the first tone to which it is designed to respond, the comparator signal terminates which causes one input of the AND gate 670 to become high. The timers 590 and 600 outputs are already high. Accordingly, the output of the AND gate 670 becomes high and the clock input to the counter 645 becomes high, thereby causing the "2" output to become high. The comparator circuit 570 then produces another comparator signal continuing as long as it is determined that the first tone is or may be present, proceeding along the same steps to maintain the receiver tuned to channel B. As soon as it is determined that the signal in the second channel does not contain the first tone, the comparator signal terminates and the clock input of the counter 645 becomes high, causing the "3" output to become high, which is connected to the R input and causes the "0" output thereof to become high, thereby commencing a time during which the receiver 620 is tuned to neither channel but rather is inoperative. When the next battery saver pulse commences, the receiver 620 will scan the two channels in the same way.

After the proper sequence of tones has been received on one of the two channels, the timer 600 will produce a timer signal that will be reflected as a "low" applied to the AND gate 670. Upon termination of the timer signal, the associated output again becomes high which causes the counter to step to channel B if the receiver 620 was then tuned to channel A, or to the inoperative condition if the receiver was then tuned to channel B.

FIG. 14 depicts some of the circuit components in the blocks of FIG. 13. The battery saver 630 includes a monostable multivibrator defined by elements 631-639. The battery saver 630 includes a NAND gate 631 having one input coupled from the "0" output of the counter 645 and the other input derived from the inverter 699. The output of the NAND gate 631 is coupled through a capacitor 632 and a resistor 633 to the B+ supply voltage. The junction of the capacitor 632 and of the resistor 633 is coupled through a resistor 634 to an inverter 635, the output of which is coupled by way of a diode 636 to a timing circuit defined by a capacitor 637 and a resistor 638 coupled in parallel to ground. The output of the diode 636 is also coupled to one input of an AND gate 639, the other input of which is derived from the inverter 699. The output of the AND gate 639 is coupled through a resistor 640 to a PNP transistor 641 and through a resistor 642 to a PNP transistor 643, which transistors provide the BS-B+ supply voltage.

The monostable multivibrator, consisting of the elements 631-639 has one stable condition and one unstable condition. In the stable condition, the output of the AND gate 639 is low so that the transistors 641 and 643 are conducting and the supply voltage is being generated.

After the receiver 620 has scanned channels A and B the "0" output of the counter 645 becomes high, causing the output of a NAND gate 631 to become low, in turn causing the capacitor 632 to charge through the resistor 633. The output of the gate 635 becomes momentarily high, thereby rapidly charging the capacitor 637 through the didoe 636. As the capacitor 632 is charged the switching threshold of 635 is passed so its output again becomes low. The output of the AND gate 639 becomes high, thereby disrupting the supply voltage. The capacitor 637 discharges through the resistor 638, and then the capacitor 637 has sufficiently discharged, the associated input to the AND gate 639 then becomes low, causing the output of the AND gate 639 to also become low, thereby causing the supply voltage to be produced by the transistors 641 and 643. Thus, the multivibrator consisting of the elements 631-639 is in its unstable condition for a time determined by the time constant of the capacitor 637 and the resistor 638 which in turn establishes the time between pulses in this embodiment, that time may be 300 ms. At the end of that time, the monostable multivibrator automatically returns to its stable condition and the battery saver 360 produces a supply voltage. That supply voltage will continue indefinitely until the "0" output from the counter 645 again becomes high.

The reset circuit 660 includes an exclusive OR gate 661 having one input coupled directly to the "1" output of the counter 645 and having a second input coupled to the same "1" output through inverter 662, resistor 668, and inverter 663. A capacitor 664 is connected between the junction of the resistor 668, inverter 663 and ground. The delay furnished by the capacitor 664 and resistor 668 causes the output of the exclusive OR gate 661 to become immediately high after the "1" output of the counter 645 becomes high and then reverts to its low condition slightly thereafter. The exclusive OR gate 661 is coupled to electronic switches 665 and 666 which are respectively coupled to the filter 540 and the decay circuit 490. The pulse developed by the gate 661 closes the electronic switch 665 to discharge energy then in the filter 540. Similarly, the pulse from the gate 661 closes a switch 666 to discharge energy then in the decay circuit 490. Taken together these insure the start of a comparator signal from the comparator circuit 570.

In the embodiment of FIGS. 13 and 14, the receiver 620 is sequentially tuned to channels A and B although obvious modification can be made to scan any number of channels. The receiver is tuned to each channel for a variable time; it will stay tuned to each channel until it determines that the incoming signal is not modulated by a code to which it is designed to respond. In this embodiment, the receiver 620 also includes a battery saver 630 so that there is substantial duration between successive scans during which the receiver is not drawing current. However, the principles described may be employed in a receiver that is continuously on, that does not have battery saving. The principles enable scan of a greater number of channels because the receiver is tuned to each channel only long enough to enable it to determine whether the code is absent.

Furthermore, in the embodiment of FIGS. 13 and 14, the receiver 620 is selective call in nature and responds to a sequence of two tones, although any coding scheme may be employed. Also, the principles are applicable even to a carrier-squelch receiver which is not code responsive, but instead is responsive to the absence of the carrier. The receiver is tuned to each channel in succession for whatever time is necessary to determine whether the carrier wave on that channel is absent. An embodiment along these lines is depicted in FIGS. 15 and 16.

In FIG. 15, there is shown a scanning receiver 720 which has many of the same elements as the receiver 520 and which are therefore labelled with the same reference numerals. In this embodiment, too, the receiver 720 is of a scanning type capable of receiving communications on channels A and B. Here carrier "absence" detection is determined by noise "presence" detection. On detection of noise presence, a start signal is created which causes the receiver to step to the next channel (and silence the receiver) at which time the filter is initiated. The receiver 720 scans the two channels by changing the frequencies of the local signal generated by the first local oscillator 414, using the frequency-determining elements in the frequency control circuit 425.

The frequency control circuit 425 is supplied by a stepping circuit which is a counter 725, the "3" output of which is connected to the reset input so that the "1"

and "2" outputs will alternately be high. Each time a positive transition appears at the clock input, the output that was low becomes high and vice versa. The output of the demodulator 419 is coupled to a band-pass filter 731 which permits passage of only components having a frequency of about 17 KHz. That frequency is above the audio frequency spectrum so that components in the audio frequency range would not pass the filter 731. Noise, however, does have components at 17 KHz which would pass through. These noise components are amplified by an amplifier 732 and detected in the noise detector 733 to provide a DC signal. It is then applied to a low-pass filter 740 to remove high-frequency noise spikes. The greater the carrier signal level, the higher the voltage produced at the output of the filter 740. With a strong carrier the output will be substantially B+. In the presence of noise, on the other hand, (carrier signal very weak or missing) the output of the filter 740 momentarily falls below threshold. The output of the low-pass filter is also coupled through an inverter 746 to a duration sensor 750. The duration sensor 750 will produce an output if the signal applied thereto is present for at least a predetermined duration. If carrier is present in the channel to which the receiver 720 is then tuned and is present for that predetermined duration, then the duration sensor 750 will produce a signal which is applied to the audio circuit 421. That signal will unsquelch the receiver and permit modulation extracted by the demodulator 419 to be amplified by the audio circuit 421 and applied to the loudspeaker 422. The output of the inverter 746 is also coupled to a delay circuit 760 and to another inverter 770. A timer circuit 780 has one input coupled to the delay circuit 760 and another input coupled to the inverter 770. The output of the timer 780 is connected to the clock input of the counter 725 and also to a reset circuit 790.

Presence or possible presence of a carrier on the channel to which the receiver 720 is then tuned causes a DC signal to be furnished by the filter 740. Such DC signal is twice inverted by the inverters 746 and 770. The delay circuit 760 provides a delayed output if absence is not first detected. If absence is detected, switching to the next channel takes place immediately. The timer circuit 780 responds to the signal from the inverter 770 to maintain the clock input of the counter 725 low, so that it is not stepped and the receiver 720 remains tuned to the channel to which it is then receiving the signal. As soon as the carrier wave terminates and carrier absence is detected, the DC signal from the low-pass filter ends, and the output of the timer 760, after a delay, becomes high to step the counter 725 to have its other output become high and tune the receiver 720 to the other channel. At the same time the counter is being stepped, the reset circuit responds to the high output from the timer circuit 780 to initialize the low-pass filter 740 and in the duration sensor 750 so that both are in condition to analyze the subsequent reception.

Further details of certain of the blocks are depicted in FIG. 16. The low-pass filter 740 includes resistors 741, 742 and capacitors 743, 744 and 745 connected as shown. The filter precludes high-frequency noise spikes and the like from being further processed. The DC signal, in the presence of carrier, is inverted by the inverter 746. The duration sensor 750 includes a resistor 751 connected in series with a capacitor 752 to ground, the junction of the resistors 751 and the capacitor 752 being coupled to an inverter 753. In the presence of noise, the input to the inverter 746 momentarily falls below the switching threshold so that its output is at B+ and the capacitor 752 remains charged. When carrier is received the output of the low-pass filter 740 remains above the switching threshold of the inverter 746, the output of the inverter 746 is at ground, causing the capacitor 752 to discharge through the resistor 751. If the carrier is present for long enough, the capacitor 752 will discharge to a point to cause the inverter 753 to switch, whereupon its output becomes high to render the audio circuit 421 operative to process modulation on the carrier wave then being received. The time constant of the resistor 751 and the capacitor 752 may, for example, be 100 ms. whereby the carrier must be present for about 100 ms. before the audio circuit 421 will become operative. Noise will cause the DC signal to be present for an insufficient time to operate the inverter 753.

The delay circuit 760 includes a resistor 761 in series with a capacitor 762 connected to ground. The resistor 761 is connected in parallel with a series combination of a resistor 763 and a diode 764. An inverter 765 is coupled to the junction of the resistor 761 and the capacitor 762.

The timer circuit 780 includes a NOR gate 781 having one input coupled to the inverter 765 and another input coupled to the inverter 770. The output of the NOR gate is coupled by an inverter 782 to a diode 783. The anode of the diode 783 is coupled to the junction of a resistor 784 also coupled to B+ and a capacitor 785 also coupled to ground. That junction is also coupled to an inverter 786.

In the presence of carrier, the output of the inverter 746 is low, thereby discharging the capacitor 762 through the diode 764 and the resistor 763 and resistor 761 to the switching level of the inverter 765, causing its output to become high. Also, the output of the inverter 770 immediately becomes high, whereby the output of the NOR gate 781 is low and the output of the inverter 782 is high, as is the input to the inverter 786. The output of the inverter 786 is low so that the counter 725 is not stepped and the receiver 720 remains tuned to the channel on which the communication is taking place.

When the communication ends, the presence of noise causes the output of the filter 740 to go below the switching threshold of inverter 746 causing the output of the inverter 746 to become high and the output of the inverter 770 to become low. However, during the presence of the carrier, the other input to the NOR gate 781 had been high, so that initially, termination of the carrier and the resultant inception of the noise has no effect on the NOR gate 781. However, the high at the output of the inverter 746 which occurs upon termination of the carrier, charges the capacitor 762 through the resistor 761. When the switching threshold of the inverter 765 is reached, the output thereof becomes low. With lows on both inputs of the NOR gate 781, its output becomes high, the output of the inverter 782 becomes low, rapidly to discharge the capacitor 785. The input to the inverter 786 becomes low and the output thereof becomes high, which positive transition is applied to the clock input of the counter 725, causing it to switch to the next frequency determining element in circuit and thereby tune the receiver 720 to the next channel. The presence of carrier on that channel will operate in the manner described above to render the audio circuit 421 operative and to prevent the counter 725 from being stepped, so that the receiver 720 remains tuned to the channel.

A weak carrier will cause a DC signal to appear at the output of the filter 740, signifying the possibility that carrier may be present. It has no effect on the counter 725, so that the receiver 720 remains tuned to the channel on which it is then tuned to enable continued analysis of the carrier, if it has been present longer than the start delay of circuit 760. As soon as it is determined that the carrier is not present, that is, the DC signal from the filter 740 drops below a certain level, then after a short drop out delay furnished by the delay circuit 760, the receiver 720 will switch to the next channel. The receiver, therefore, is on each channel a variable length of time based upon the time necessary to determine the absence of carrier.

The output of the timer circuit 780 is coupled to the reset circuit 790, which includes a capacitor 791 coupled in series with a resistor 792 in turn coupled to ground. The junction of the capacitor 791 and the resistor 792 is coupled through an inverter 793 to the bases of two PNP transistors 794 and 795. The emitters of both transistors are coupled to the B+ supply voltage. The collector of the transistor 795 is coupled to the capacitor 745 and the collector of the transistor 794 is coupled to the capacitor 752.

When the receiver determines that the carrier to which it is then tuned is absent, and the output of the inverter 786 becomes high, such transition is coupled through the capacitor 791, inverted by the inverter 793 to render the transistors 794 and 795 conductive, whereby the capacitors 745 and 752 are rapidly charged to their starting points to prepare them to analyze ensuing reception. As a result, a voltage is momentarily established on the input of inverter 746, causing its output to go low. If the new frequency is a strong signal, little or no noise will be applied to the noise detector 733. The input to inverter 746 will be held high, thus keeping the output of inverter 746 low. But if carrier is not present, noise will be applied to the bandpass filter 731 input, causing the output of the noise detector 733 to become low, thereby rapidly discharging capacitor 745 to a point below the threshold of inverter 746. Accordingly, its output becomes high, thereby detecting carrier absence.

If the carrier is still absent on that channel, the input to the filter 740 is low, causing the capacitor 745 to discharge quickly to the switching threshold of the inverter 746, whereupon its output will become high. Since the output of the inverter 746 was not low long enough to set the delay circuit 760, the output of inverter 770 becomes low and the output of timer 780 will become high immediately, to clock the counter 725 and initialize the reset circuit 790.

The elements 731–740 (FIG. 15) may be viewed as a squelch detector coupled to the demodulator 419 and responsive to the processed signal therefrom which is the result of a carrier wave on the channel then being scanned to provide what may be termed an "unsquelch" signal. In this case that unsquelch signal at the input of 740 would remain above the switching threshold of inverter 746. The absence detector does not respond to the unsquelch signal. Therefore the output from the timer 780 does not step the counter 725 and in that sense, the output is a start signal because the receiver 720 remains tuned to the channel in which it is then receiving signals until a start signal is generated. However, as soon as it is determined that the carrier is absent—in other words, the signals being analyzed were just noise—the unsquelch signal terminates in the sense that the voltage from the low-pass filter 740 goes below the switching threshold of inverter 746. As a result, the start signal is generated, which clocks the counter 725 causing the receiver 720 to step to the next channel and initializing the reset circuit.

In the embodiments of FIGS. 15 and 16, the receiver 720 includes an absence detector defined by the inverters 746 and 770, and the squelch detector. Such absence detector allows the receiver 720 tuned to a channel on which a communication is or may be taking place until it determines in fact that there is no communication taking place; i.e. the signal is absent, at which time the next channel is scanned. The signal for which the search is made is the carrier which in turn is indicated by the absence of noise. Likewise, the presence of noise of at least a given magnitude, signifies absence of the carrier. Thus, in the sense of this embodiment, absence of the desired signal means presence of the undesired noise. When the absence detector indirectly responds to the absence of carrier it directly responds to the presence of noise.

We claim:

1. In a receiver of a modulated incoming signal having a normally inoperative processor circuit that may be rendered operative to process an incoming signal and produce a processed signal including the modulation portion of the incoming signal, the combination comprising an operator circuit for periodically providing an operator signal to render the processor circuit operative to process the incoming signal, an absence detector having an input coupled to the processor circuit and having an output coupled to said operator circuit, said absence detector being responsive to any processed signal which is not of a predetermined character substantially immediately to terminate the operating signal, duration sensor means coupled to said absence detector for producing an output signal when absence of the processed signal of predetermined character is not detected in a first predetermined duration, and timer means coupled to said duration sensor means and being responsive to the start of the output signal to produce a timer signal persisting for a second predetermined duration, said operator circuit being coupled to said timer means and being responsive to the timer signal to extend the duration of the operator signal to the end of the second predetermined duration.

2. A signal detector for a selective call signal receiver having means for supplying AC signals, said detector comprising filter means having a fixed Q and being coupled to the supply means to allow passage of an AC signal, a source of a series of pulses spaced apart by an interval at least several times the duration of each such pulse, variable-voltage means coupled to said source and being responsive to each such pulse to produce a threshold voltage having a first value at the commencement of each pulse and varying during each pulse from the first value toward a second value, and comparator circuit means having first and second inputs respectively coupled to said filter means and said variable-voltage means, said comparator means being operative to produce a comparator signal for a duration related to the time the amplitude of an AC signal from said filter means is at least equal to the threshold voltage.

3. The signal detector of claim 2, and further comprising duration sensor means coupled to said comparator means for producing an output signal when the duration of the comparator signal exceeds a predetermined value.

4. The signal detector of claim 3, wherein said comparator means includes means for smoothing the comparator signal before application thereof to said duration sensor means.

5. The signal detector of claim 3, wherein said duration sensor means includes a charging circuit coupled to said comparator means for producing a charging voltage of varying magnitude, and an electronic switch circuit coupled to said charging circuit for producing the output signal when the magnitude of the charging voltage reaches a predetermined level.

6. The signal detector of claim 5, wherein said charging circuit includes a capacitor that is charged at a relatively slow rate in the presence of the comparator signal and is discharged at a relatively fast rate upon termination of the comparator signal.

7. The signal detector of claim 2, wherein said source is coupled to said comparator means and is responsive to the comparator signal to extend a pulse substantially to the end of the comparator signal.

8. The signal detector of claim 3, and further comprising timer means coupled to said duration sensor means and being responsive to the output signal to produce a timer signal persisting for a predetermined duration.

9. The signal detector of claim 8, wherein said source is coupled to said comparator means and is responsive to the comparator signal to extend a pulse substantially to the end of the comparator signal, and said source is coupled to said timer means and is responsive to the timer signal to extend a pulse substantially to the end of the timer signal.

10. A tone detector for a selective call signal receiver having means for supplying tones, said detector comprising normally operative filter means having a fixed Q and being coupled to the supply means to allow passage of a tone, a source of series of pulses, decay means coupled to said source and being responsive to each such pulse to produce a threshold voltage which decays from a first value toward a second value, comparator means having first and second inputs respectively coupled to said normally operative filter means and to said decay means, said comparator means being operative to produce a comparator signal for a duration related to the time the amplitude of a tone from said normally operative filter means is at least equal to the threshold voltage, duration sensor/timer means coupled to said comparator means and being responsive to the comparator signal having a duration exceeding a predetermined value to provide an enabling signal persisting for a given duration, and normally inoperative filter means having a fixed Q and being coupled to said supply means and to said timing means, said normally inoperative filter means being rendered operative by the enabling signal for the duration thereof to allow passage of a tone.

11. The signal detector of claim 10, wherein said source is coupled to said comparator means and is responsive to the comparator signal to extend a pulse substantially to the end of the comparator signal.

12. The signal detector of claim 11, wherein said source is coupled to said comparator means and is responsive to the comparator signal to extend a pulse substantially to the end of the comparator signal, and said source is coupled to said duration sensor/timer means and is responsive to the enabling signal to extend a pulse substantially to the end of the enabling signal.

13. A tone detector for a selective call signal receiver having means for supplying tones, said detector comprising normally operative filter means having a fixed Q and being coupled to the supply means to allow passage of a tone, a source of series of pulses, decay means coupled to said source and being responsive to each such pulse to produce a threshold voltage which decays from a first value toward a second value, first comparator means having first and second inputs respectively coupled to said normally operative filter means and to said decay means, said first comparator means being operative to produce a first comparator signal for a duration related to the time the amplitude of a tone from said normally operative filter means is at least equal to the threshold voltage, first duration sensor/timer means coupled to said first comparator means and being responsive to the first comparator signal having a duration exceeding a predetermined value to provide an enabling signal persisting for a given duration, normally inoperative filter means having a fixed Q and being coupled to said supply means and to said timer means, said normally inoperative filter means being rendered operative by the enabling signal for the duration thereof to allow passage of a second tone, second comparator means coupled to said normally inoperative filter means and being operative to produce a second comparator signal for a duration related to the time the amplitude of a second tone from said normally inoperative filter means exceeds a certain threshold voltage, and second duration sensor/timer means coupled to said second comparator means and being responsive to the second comparator signal exceeding a given value to provide a timer signal persisting for a certain duration.

14. The signal detector of claim 13, wherein said source is coupled to said first comparator means and is responsive to the first comparator signal to extend a pulse substantially to the end of the first comparator signal, said source is coupled to said first duration sensor/timer means and is responsive to the enabling signal to extend a pulse substantially to the end of the enabling signal, said source is coupled to said second comparator means and is responsive to the second comparator signal to extend a pulse substantially to the end of the second comparator signal, and said source is coupled to said second duration sensor/timer means and is responsive to the timer signal to extend a pulse substantially to the end of the timer signal.

15. In a selective call signal receiver including a processor circuit adapted to receive a carrier wave modulated by at least one code tone and to demodulate the code tone from the carrier wave, the combination comprising a resonant circuit coupled to the processor circuit for receiving the code tone, said resonant circuit including first reactance means, and second reactance means coupled together, said resonant circuit being resonant at a predetermined frequency, said second reactance means including amplifier means, and battery saver means for producing a pulsed supply voltage for at least the processor circuit and said resonant circuit so as cyclically to apply to and remove from the processor circuit and said resonant circuit the battery saver pulses, said battery saver means being connected to said amplifier means such that the voltage drop across said resonant circuit is substantially constant at substantially the same value both between battery saver pulses and during battery saver pulses, whereby said resonant circuit is precluded from ringing despite the cyclical application to and removal from said resonant circuit of the battery saver pulses.

16. In the filter of claim 15, wherein the voltage drop across said resonant circuit is kept at zero.

17. In the filter of claim 15, wherein said first reactance means is capacitor means and said second reactance means include further capacitor means.

18. In the filter of claim 15, and further comprising an operational amplifier having a signal input and a signal output, said first reactance means being coupled between said signal input and said signal output.

19. In the filter of claim 18, wherein said operational amp includes a bias input coupled to a source of pulsed bias voltage.

20. In the filter of claim 19, wherein said operational amp has a high supply terminal coupled to receive the pulsed supply voltage and a low supply terminal coupled to ground, and a high impedance coupled between the processor circuit and said signal input.

21. In a receiver of a modulated incoming signal having a normally inoperative processor circuit that may be rendered operative to process an incoming signal and produce a processed signal including the modulation portion of the incoming signal, the combination comprising a battery-saver circuit for periodically providing a supply voltage to render the processor circuit operative to process the incoming signal, an absence detector having an input coupled to the processor circuit and having an output coupled to said battery-saver circuit, said absence detector being responsive to any processed signal which is not of a predetermined character to substantially immediately terminate the supply voltage, duration sensor means coupled to said absence detector for producing an output signal when the processed signal has the predetermined character for a first predetermined duration, and timer means coupled to said duration sensor means and being responsive to the start of the output signal to produce a timer signal persisting for a second predetermined duration, said battery-saver circuit being coupled to said timer means and being responsive to the timer signal to extend the duration of the supply voltage to the end of the second predetermined duration.

22. In a selective-call communication receiver of an incoming signal modulated by a predetermined code and having a processor circuit that may be rendered operative to process an incoming signal and prduce a processed signal including the code, the combination comprising a battery-saver circuit for periodically providing a supply voltage to render the processor circuit operative to process the incoming signal, and an absence detector having an input coupled to the processor circuit and having an output coupled to said battery-saver circuit, said absence detector including means for detecting whether or not said processed signal includes the predetermined code and for terminating the supply voltage as soon as detection is made that said processed signal does not include said predetermined code.

23. In the receiver of claim 22, wherein said absence detector includes a frequency sensor having a variable bandwidth and having an output and a pulse input and having a signal input coupled to the processor circuit, said frequency sensor being operative to produce an output signal on said output in response to a processed signal having a frequency within a variable bandwidth, and a source of pulses coupled to said pulse input, said frequency sensor having means for causing the bandwidth to be relatively wide at the start of each pulse and to decrease during at least a portion thereof.

24. In the receiver of claim 22, wherein said operator circuit includes an astable multivibrator which is alternatively placed in two unstable conditions, said multivibrator producing the operator signal in one of the conditions thereof.

25. In the receiver of claim 22, wherein the predetermined code is followed by a voice message.

26. In the receiver of claim 22, wherein said absence detector includes filter means having a fixed Q and being coupled to the processor circuit to allow passage of the predetermined code, variable-voltage means coupled to said battery-saver circuit and being responsive to the supply voltage to produce a threshold voltage which varies from a first value to a second value, and comparator means having two inputs respectively coupled to said filter means and said variable-voltage means, said comparator means being operative to produce a comparator signal which persists for a duration related to the time the amplitude of the code from said filter means is at least equal to the threshold voltage, said battery-saver circuit including an astable multivibrator which is alternately placed in two conditions, said multivibrator being operative to produce the supply voltage in one of its conditions and alternately placed in the other condition for a predetermined duration, said multivibrator being coupled to said comparator means and remaining in the one condition for the duration of the comparator signal.

27. In the receiver of claim 22, wherein said absence detector includes filter means having a fixed Q and being coupled to the processor circuit to allow passage of the predetermined code, variable-voltage means coupled to said battery-saver circuit and being responsive to the supply voltage to produce a threshold voltage which varies from a first value to a second value, and comparator means having three inputs respectively coupled to said filter means and said variable-voltage means and said battery-saver circuit, said comparator means being responsive to the commencement of the supply voltage to commence producing a comparator signal which persists for a duration related to the time the amplitude of the code from said filter means is at least equal to the threshold voltage, said battery-saver circuit including a monostable multivibrator which is periodically placed in a stable condition to produce the supply voltage and is periodically placed in an unstable condition for a predetermined duration, said multivibrator being coupled to said comparator means and remaining in its stable condition for the duration of the comparator signal.

28. In a selective-call communication receiver of an incoming signal modulated by a predetermined tone and having a processor circuit that may be rendered operative to process an incoming signal and produce a signal including the tone, the combination comprising a battery-saver circuit for periodically providing a supply voltage to render the processor circuit operative to process the incoming signal, and an absence detector having an input coupled to the processor circuit and having an output coupled to said battery-saver circuit, said absence detector including means for detecting whether or not said processed signal includes the predetermined tone and for terminating the supply voltage as soon as detection is made that said processed signal does not include said predetermined tone.

29. In the receiver of claim 28, wherein said absence detector includes filter means having a fixed Q and being coupled to the processor circuit to allow passage of the processed signal, a source of series of pulses, variable-voltage means coupled to said source and being responsive to each such pulse to produce a threshold voltage which varies from a first value to a second value, and comparator means having first and second inputs respectively coupled to said filter means and said variable-voltage means, said comparator means being operative to produce a comparator signal for a duration related to the time the amplitude of the process signal passing through said filter means is at least equal to the threshold voltage.

30. In a selective-call communication receiver of an incoming signal modulated by a predetermined sequence of tones and having a processor circuit that may be rendered operative to process an incoming signal and produce a processed signal including the predetermined sequence of tones, the combination comprising a battery-saver circuit for periodically providing a supply voltage to render the processor circuit operative to process the incoming signal, and an absence detector having an input coupled to the processor circuit and having an output coupled to said battery-saver circuit, said absence detector including means for detecting whether or not said processed signal includes the predetermined sequence of tones and for terminating the supply voltage as soon as detection is made that said processed signal does not include any of the tones in said predetermined sequence.

31. In a scanning receiver for receiving a modulated incoming signal in one of a plurality of channels and having a processor circuit which includes signal generating means operative to produce a local signal having one of a corresponding plurality of frequencies, mixer means for mixing the modulated incoming signal with the local signal, and demodulator means coupled to the mixer means for supplying a processed signal including the modulation portion of the incoming signal, the combination comprising an absence detector including means for detecting whether or not said processed signal has a predetermined character and for producing a start signal as soon as detection is made that said processed signal does not have said predetermined character, and stepping means having an input and at least two outputs and being operative to produce output signals on said outputs respectively having variable durations dependent on the occurrence of a start signal applied to the input of said stepping means, said signal generating means being coupled to the outputs of said stepping means, said stepping means being responsive to each start signal substantially immediately to change the frequency of the local signal to correspond to the next channel to be scanned.

32. In a scanning receiver for receiving a modulated incoming signal in one of a plurality of channels and having a processor circuit which includes signal generating means operative to produce a local signal having one of a corresponding plurality of frequencies, mixer means for mixing the modulated incoming signal with the local signal, and demodulator means coupled to the mixer means for supplying a processed signal including the modulation portion of the incoming signal, the combination comprising an absence detector including means responsive to the processed signal not having a predetermined character to produce a start signal, stepping means responsive to each start signal substantially immediately to change the frequency of the local signal to correspond to the next channel to be scanned, duration sensor means coupled to said absence detector for producing an output signal when the processed signal has the predetermined character for a first predetermined duration, and timer means coupled to said duration sensor means and being responsive to the start of the output signal to produce a timer signal persisting for a second predetermined duration, said stepping means being coupled to said timer means and being responsive to the timer signal to prevent stepping to the end of the second predetermined duration.

33. In a scanning receiver for receiving an incoming signal in one of a plurality of channels, which incoming signal is modulated by a predetermined code, the receiver having a processor circuit which includes signal generating means operative to produce a local signal having one of a corresponding plurality of frequencies, mixer means for mixing the modulated incoming signal with the local signal, and demodulator means coupled to the mixer means for supplying a processed signal including the modulation portion of the incoming signal, the combination comprising an absence detector including means for detecting whether or not said processed signal includes a predetermined code and for producing a start signal as soon as detection is made that said processed signal does not include said predetermined code, and stepping means having an input and at least two outputs and being operative to produce output signals on said outputs respectively having variable durations dependent on the occurrence of a start signal applied to the input of said stepping means, said signal generating means being coupled to the outputs of said stepping means, said stepping means being responsive to each start signal substantially immediately to change the frequency of the local signal to correspond to the next channel to be scanned.

34. In the scanning receiver of claim 33, wherein the predetermined code is a single tone.

35. In the scanning receiver of claim 34, the combination further comprising battery-saver circuit for supplying to the processor circuit a supply voltage during operation of said stepping means for rendering the processor circuit operative to process the incoming signal, said battery-saver circuit being responsive to a start signal corresponding to the last channel to be scanned to discontinue for a fixed duration supplying the supply voltage to the processor circuit.

36. In the scanning receiver of claim 35, wherein said battery-saver circuit includes an astable multivibrator which is alternately placed in two conditions, said multivibrator being operative to produce a supply voltage in one of its conditions and is alternately placed in the other condition for a predetermined duration, said multivibrator being coupled to said absence detector and remaining in the one condition until a start signal is produced corresponding to the last channel to be scanned.

37. In a scanning receiver for receiving an incoming signal in one of a plurality of channels, which incoming signal is modulated by a predetermined sequence of tones, the receiver having a processor circuit which includes signal generating means operative to produce a local signal having one of a corresponding plurality of frequencies, mixer means for mixing the modulated incoming signal with the local signals, and demodulator means coupled to the mixer means for supplying a processed signal including the modulation portion of the incoming signal, the combination comprising an absence detector including means for detecting whether or not said processed signal includes the predetermined sequence of tones and for producing a start signal as soon as detection is made that said processed signal does not include any one of the tones in said predetermined sequence, and stepping means having an input and at least two outputs and being operative to produce output signals on said outputs respectively having variable durations dependent on the occurrence of a start signal applied to the input of said stepping means, said signal generating means being coupled to the outputs of said stepping means, said stepping means being responsive to each start signal substantially immediately to change the frequency of the local signal to correspond to the next channel to be scanned.

38. In the scanning receiver of claim 37, the combination further comprising a battery-saver circuit for supplying to the processor circuit a supply voltage during operation of said stepping means for rendering the processor circuit operative to process the incoming signal, said battery-saver circuit being responsive to a start signal corresponding to the last channel to be scanned to discontinue for a fixed duration supplying the supply voltage to the processor circuit.

39. In the receiver of claim 38, wherein said absence detector includes filter means having a fixed Q on each frequency and being coupled to the processor circuit to allow passage of the predetermined sequence of tones in the proper sequence, variable-voltage means coupled to said battery-saver circuit and being responsive to the supply voltage to produce a threshold voltage which varies during each tone from a first value to a second value, and comparator means having three inputs respectively coupled to said filter means and said variable-voltage means and said battery-saver circuit, said comparator means being responsive to the commencement of the supply voltage to commence producing a comparator signal which persists for a duration related to the time the amplitude of each tone from said filter means is at least equal to the threshold voltage, said battery-saver circuit including a monostable multivibrator which is periodically placed in one condition to produce the supply voltage and is periodically placed in a second condition for a predetermined duration, said multivibrator being coupled to said comparator means and remaining in its stable condition for the duration of the comparator signal.

40. In the receiver of claim 38, wherein said absence detector includes filter means having a fixed Q on each frequency and being coupled to the processor circuit to allow passage of the predetermined sequence of tones in the proper sequence, variable-voltage means coupled to said battery-saver circuit and being responsive to the supply voltage to produce a threshold voltage which varies during each tone from a first value to a second value, and comparator means having two inputs respectively coupled to said filter means and said variable-voltage means, said comparator means being operative to produce a comparator signal which persists for a duration related to the time the amplitude of each tone from said filter means is at least equal to the threshold voltage, said battery-saver circuit including an astable multivibrator which is alternately placed in stable conditions, said multivibrator being operative to produce the supply voltage in one of its conditions and is alternately placed in the other condition for a predetermined duration, said multivibrator being coupled to said comparator means and remaining in the one condition for the duration of the comparator signal.

41. In a scanning receiver for receiving a modulated incoming signal in one of a plurality of channels and having a normally inoperative processor circuit which includes signal generating means operative to produce a local signal having one of a corresponding plurality of frequencies, mixer means for mixing the modulated incoming signal with the local signal, and demodulator means coupled to the mixer means for supplying a processed signal including the modulation portion of the incoming signal, the combination comprising an absence detector including means for detecting whether or not said processed signal has a predetermined character and for producing a start signal as soon as detection is made that said processed signal does not having said predetermined character, stepping means having an input and at least two outputs and being operative to produce output signals on said outputs respectively having variable durations dependent on the occurrence of a start signal applied to the input of said stepping means, said signal generating means being coupled to the outputs of said stepping means, said stepping means being responsive to each start signal substantially immediately to change the frequency of the local signal to correspond to the next channel to be scanned, and a battery-saver circuit for supplying to the processor circuit a supply voltage during operation of said stepping means for rendering the processor circuit operative to process the incoming signal, said battery-saver circuit being coupled to the outputs of said stepping means and being responsive to a start signal corresponding to the last channel to be scanned to discontinue for a fixed duration supplying the supply voltage to the processor circuit.

42. In a scanning receiver for receiving an incoming signal in one of a plurality of channels, which incoming signal is modulated by a predetermined code, the receiver having a normally inoperative processor circuit which includes signal generating means operative to produce a local signal having one of a corresponding plurality of frequencies, mixer means for mixing the modulated incoming signal with the local signal, and demodulator means coupled to the mixer means for supplying a processed signal including the modulation portion of the incoming signal, the combination comprising an absence detector including means for detecting whether or not said processed signal includes a predetermined code and for producing a start signal as soon as detection is made that said processed signal does not include said predetermined code, stepping means having an input and at least two outputs and being operative to produce output signals on said outputs respectively having variable durations dependent on the occurrence of a start signal applied to the input of said stepping means, said signal generating means being coupled to the outputs of said stepping means, said stepping means being responsive to each start signal substantially immediately to change the frequency of the local signal to correspond to the next channel to be scanned, and a battery-saver circuit for supplying to the processor circuit a supply voltage during operation of said stepping means for rendering the processor circuit operative to process the incoming signal, said battery-saver circuit being coupled to the outputs of said stepping means and being responsive to the start signal corresponding to the last of the frequency-determining means to discontinue for a fixed duration supplying the supply voltage to the processor circuit.

43. In the scanning receiver of claim 42, wherein said absence detector includes filter means having a fixed Q on any frequency searched for and being coupled to the processor circuit to allow passage of the predetermined code, variable-voltage means coupled to said battery-saver circuit and being responsive to the supply voltage to produce a threshold voltage which varies from a first value to a second value, and comparator means having two inputs respectively coupled to said filter means and said variable-voltage means, said comparator means being operative to produce a comparator signal which persists for a duration related to the time the amplitude of the code from said filter means is at least equal to the threshold voltage, said battery-saver circuit including an astable multivibrator which is alternately placed in two conditions, said multivibrator being operative to produce the supply voltage in one of its conditions and alternately placed in the other condition for a predetermined duration, said multivibrator being coupled to said comparator means and remaining in the one condition for the duration of the comparator signal.

44. In the scanning receiver of claim 42, wherein said absence detector includes filter means having a fixed Q on any searched for frequency and being coupled to the processor circuit to allow passage of the predetermined code, variable-voltage means coupled to said battery-saver circuit and being responsive to the supply voltage to produce a threshold voltage which varies from a first value to a second value, and comparator means having three inputs respectively coupled to said filter means and said variable-voltage means and said battery-saver circuit; said comparator means being responsive to the commencement of the supply voltage to commence producing a comparator signal which persists for a duration related to the time the amplitude of the code from said filter means is at least equal to the threshold voltage, said battery-saver circuit including a monostable multivibrator which is periodically placed in a stable condition to produce the supply voltage and is periodically placed in an unstable condition for a predetermined duration, said multivibrator being coupled to said comparator means and remaining in its stable condition for the duration of the comparator signal.

45. In a selective-call scanning receiver for receiving an incoming signal in one of a plurality of channels, which incoming signal is modulated by a predetermined sequence of tones, the combination comprising signal generating means operative to produce a local signal having one of a corresponding plurality of frequencies, stepping means for cyclically changing the frequency of the local signal, mixer means coupled to said signal generating means for mixing the modulated incoming signal with the local signal, demodulator means coupled to said mixer means for supplying the modulation components of the incoming signal, frequency responsive means coupled to said demodulator means and being sequentially responsive to each tone to allow passage thereof, and circuit means coupled to said frequency-responsive means for producing a start signal as soon as detection is made by said frequency-responsive means that the incoming signal does not include any one of the tones in the predetermined sequence of tones, and stepping means having an input and at least two outputs and being operative to produce output signals on said outputs respectively having variable durations dependent on the occurrence of a start signal applied to the input of said stepping means, said signal generating means being coupled to the outputs of said stepping means, said stepping means being coupled to said circuit means and being responsive to each start signal to change the frequency of the local signal.

46. In the selective call scanning receiver of claim 45, wherein the local signal has two frequencies corresponding to two channels.

47. In the selective call scanning receiver of claim 45, wherein said stepping means includes a counter.

48. In the selective call scanning receiver of claim 45, wherein said frequency-responsive means includes a single filter and a plurality of frequency-determining means individually connectable to said filter to cause said filter to have one of a corresponding plurality of center tone frequencies, and further stepping means for connecting said frequency-determining elements in circuit with said filter means as the tones are received in sequence.

49. In a selective-call scanning receiver for receiving an incoming signal in one of a plurality of channels, which incoming signal is modulated by modulation components including a predetermined tone, the combination comprising a signal generating means operative to produce a local signal having one of a corresponding plurality of frequencies, stepping means for cyclically changing the frequency of the local signal, mixer means coupled to said signal generating means for mixing the modulated incoming signal with the local signal, demodulator means coupled to said mixer means for supplying the modulation components of the incoming signal, frequency-responsive means coupled to said demodulator means for producing a filter signal having a maximum amplitude when the incoming signal includes the predetermined tone, a source of a series of pulses, variable-voltage means coupled to said source and being responsive to each such pulse to produce a threshold voltage which varies from a first value to a second value, the comparator means having first and second inputs respectively coupled to said frequency-responsive means and said variable-voltage means, said comparator means being operative to produce a comparator signal for a duration related to the time the amplitude of the filter signal is at least equal to the threshold voltage, said stepping means being coupled to said comparator means and being responsive to termination of the comparator signal to change the frequency of the local signal.

50. In the selective-call scanning receiver of claim 49, and further comprising reset means coupled from said stepping means and to said variable-voltage means and being responsive to the changing of the frequency of the local signal to reset said variable-voltage means.

51. In the selective-call scanning receiver of claim 50, wherein said reset means is also coupled from said stepping means to said frequency-responsive means and is responsive to the connection of said frequency-determining means to reset said frequency-responsive means.

52. In a selective-call scanning receiver for receiving an incoming signal in one of a plurality of channels, which incoming signal is modulated by a predetermined sequence of tones, the combination comprising signal generating means operative to produce a local signal having one of a corresponding plurality of frequencies, stepping means for cyclically changing the frequency of the local signal, mixer means coupled to said signal generating means for mixing the modulated incoming signal with the local signal, demodulator means coupled to said mixer means for supplying the modulation components of the incoming signal, frequency responsive means coupled to said demodulator means and being sequentially responsive to each tone for producing a sequence of filter signals each having a maximum amplitude when the incoming signal includes the tone to which said frequency-responsive means is then tuned, a source of a series of pulses, variable-voltage means coupled to said source and being responsive to each such pulse to produce a threshold voltage which varies from a first value to a second value, and comparator means having first and second inputs respectively coupled to said frequency-responsive means and said variable-voltage means, said comparator means being operative to produce comparator signals each for a duration related to the time the amplitude of the corresponding filter signal is at least equal to the threshold voltage, said stepping means being coupled to said comparator means and being responsive to termination of the comparator signal to change the frequency of the local signal.

53. In the selective-call scanning receiver of claim 52, and further comprising reset means coupled from said stepping means and to said variable-voltage means and being responsive to the changing of the frequency of the local signal to reset said variable-voltage means.

54. In the selective-call scanning receiver of claim 52, wherein the local signal has two frequencies.

55. In the selective-call scanning receiver of claim 52, and further comprising battery saver means for producing a pulsed supply voltage for at least a portion of said receiver, said stepping means being coupled to said battery saver means and being operative in the presence of a comparator signal to cause the supply voltage to become continuous.

56. In a selective-call scanning receiver for receiving an incoming signal in one of a plurality of channels, which incoming signal is modulated by a predetermined sequence of tones, the combination comprising signal generating means operative to produce a local signal having one of a corresponding plurality of frequencies, stepping means for cyclically changing the frequency of the local signal, mixer means coupled to said signal generating means for mixing the modulated incoming signal with the local signal, demodulator means coupled to said mixer means for supplying the modulation components of the incoming signal, frequency-responsive means coupled to said demodulator means and being sequentially responsive to each tone for producing a sequence of filter signals each having a maximum amplitude when the incoming signal includes the tone to which said frequency-responsive means is then tuned, a source of a series of pulses, variable-voltage means coupled to said source and being responsive to each such pulse to produce a threshold voltage which varies from a first value to a second value, comparator means having first and second inputs respectively coupled to said frequency-responsive means and said variable-voltage means, said comparator means being operative to produce comparator signals each for a duration related to the time the amplitude of the corresponding filter signal is at least equal to the threshold voltage, said stepping means being coupled to said comparator means and being responsive to termination of the comparator signal to change the frequency of the local signal, and timer means coupled to said comparator means and being responsive to the output signal to produce a timer signal persisting for a predetermined duration, said stepping means being further coupled to said timer means and being responsive to the timer signal to preclude changing the frequency of the local signal for the duration of timer signal.

57. In the selective-call scanning receiver of claim 56, wherein said frequency-responsive means includes a single filter and a plurality of frequency-determining means individually connectable to said filter to cause said filter to have one of a corresponding plurality of center tone frequencies, further stepping means for connecting said frequency-determining elements in circuit with said filter means as the tones are received in sequence, and duration sensor means coupled to said comparator means for producing an output signal upon termination of the tone if the duration of the comparator signal exceeds a predetermined value to cause said further stepping means to connect the next frequency-determining element in circuit.

58. In a selective-call scanning receiver for receiving an incoming signal in one of a plurality of channels, which incoming signal is modulated by a predetermined sequence of tones, the combination comprising battery saver means for producing a pulsed supply voltage for at least a portion of the receiver, signal generating means operative to produce a local signal having one of a corresponding plurality of frequencies, stepping means for cyclically changing the frequency of the local signal and for operating said battery saver means, mixer means coupled to said signal generating means for mixing the modulated incoming signal with the local signal, demodulator means coupled to said mixer means for supplying the modulation components of the incoming signal, frequency-responsive means coupled to said demodulator means and being sequentially responsive to each tone to allow passage thereof, and circuit means coupled to said frequency-responsive means and being responsive to absence of each tone therefrom for producing a start signal, said stepping means being coupled to said circuit means and being responsive to each start signal to change the frequency of the local signal and to cause the supply voltage to become continuous.

59. In the selective-call scanning receiver of claim 58, wherein said stepping means is constructed and arranged to cause the local signal to have each of said plurality of frequencies for a duration equal to the inverse of said plurality times the duration of a pulse of supply voltage, whereby during each pulse of supply voltage the local signal will have each of the plurality of frequencies.

* * * * *